US009515277B2

(12) United States Patent
Okabe et al.

(10) Patent No.: US 9,515,277 B2
(45) Date of Patent: Dec. 6, 2016

(54) ORGANIC ELECTROLUMINESCENT ELEMENT, ORGANIC EL DISPLAY DEVICE AND ORGANIC EL ILLUMINATION

(75) Inventors: Kazuki Okabe, Yokohama (JP); Atsushi Takahashi, Yokohama (JP); Tomohiro Abe, Yokohama (JP); Yasuyuki Tsurutani, Yokohama (JP); Hideki Sato, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 712 days.

(21) Appl. No.: 12/935,416

(22) PCT Filed: Aug. 12, 2009

(86) PCT No.: PCT/JP2009/064273
§ 371 (c)(1),
(2), (4) Date: Nov. 11, 2010

(87) PCT Pub. No.: WO2010/018851
PCT Pub. Date: Feb. 18, 2010

(65) Prior Publication Data
US 2011/0114926 A1 May 19, 2011

(30) Foreign Application Priority Data
Aug. 13, 2008 (JP) .................................. 2008-208358

(51) Int. Cl.
| H01L 51/50 | (2006.01) |
| C08G 61/12 | (2006.01) |
| C08G 73/02 | (2006.01) |
| C08L 65/00 | (2006.01) |
| C08L 79/02 | (2006.01) |
| C09K 11/06 | (2006.01) |
| H05B 33/14 | (2006.01) |
| H01L 51/00 | (2006.01) |

(52) U.S. Cl.
CPC ........... *H01L 51/5012* (2013.01); *C08G 61/12* (2013.01); *C08G 73/026* (2013.01); *C08L 65/00* (2013.01); *C08L 79/02* (2013.01); *C09K 11/06* (2013.01); *H01L 51/5048* (2013.01); *H05B 33/14* (2013.01); *C08G 2261/135* (2013.01); *C08G 2261/141* (2013.01); *C08G 2261/1424* (2013.01); *C08G 2261/3162* (2013.01); *C09K 2211/1433* (2013.01); *H01L 51/006* (2013.01); *H01L 51/008* (2013.01); *H01L 51/0035* (2013.01); *H01L 51/0043* (2013.01); *H01L 51/0058* (2013.01); *H01L 51/0067* (2013.01); *H01L 51/0081* (2013.01)

(58) Field of Classification Search
USPC ........... 428/690, 917; 257/40; 313/504, 505, 313/506
See application file for complete search history.

(56) References Cited

U.S. PATENT DOCUMENTS

| 5,518,824 A * | 5/1996 | Funhoff et al. ................ 428/690 |
| 2002/0121860 A1 | 9/2002 | Seo et al. |
| 2003/0008174 A1 * | 1/2003 | Suzuki et al. ................ 428/690 |
| 2005/0186106 A1 | 8/2005 | Li et al. |
| 2006/0043885 A1 | 3/2006 | Poplavskyy et al. |
| 2007/0096082 A1 | 5/2007 | Gaynor et al. |
| 2008/0071049 A1 | 3/2008 | Radu et al. |
| 2008/0074039 A1 | 3/2008 | Seki et al. |
| 2009/0066223 A1 | 3/2009 | Yabe et al. |
| 2009/0236979 A1 | 9/2009 | Han-Adebekun et al. |
| 2010/0090590 A1 | 4/2010 | Ogata et al. |

FOREIGN PATENT DOCUMENTS

| JP | 2002-208481 | 7/2002 |
| JP | 2002-324680 | 11/2002 |
| JP | 2005-26003 | 1/2005 |
| JP | 2005 243300 | 9/2005 |
| JP | 2007-42314 | 2/2007 |
| JP | 2007-095595 | 4/2007 |
| JP | 2007-110093 | 4/2007 |
| JP | 2007-302886 | 11/2007 |
| JP | 2007-335852 | 12/2007 |
| JP | 2008-78373 | 4/2008 |
| JP | 2008 78374 | 4/2008 |
| JP | 2008-84654 | 4/2008 |
| JP | 2008-098619 | 4/2008 |
| JP | 2008-163306 | 7/2008 |
| JP | 2008-227483 | 9/2008 |
| JP | 2008-235327 | 10/2008 |

(Continued)

OTHER PUBLICATIONS

International Search Report issued Sep. 8, 2009 in PCT/JP09/64273 filed Aug. 12, 2009.
Office Action issued Jan. 18, 2012, in Chinese patent application No. 200980129245.1, (with English-language Translation).
U.S. Appl. No. 13/231,505, filed Sep. 13, 2011, Okabe.
Chinese Office Action issued Aug. 7, 2012, in Patent Application No. 200980129245.1 (with English-language translation).
U.S. Appl. No. 13/493,040, filed Jun. 11, 2012, Abe, et al.
Office Action issued Oct. 30, 2012, in corresponding Japanese Patent Application No. JP-A-2009-187289 (with English-language Translation).

(Continued)

*Primary Examiner* — Gregory Clark
(74) *Attorney, Agent, or Firm* — Oblon, McClelland, Maier & Neustadt, L.L.P.

(57) ABSTRACT

To provide an organic electroluminescent element having a low driving voltage, high current efficiency and high voltage efficiency.
An organic electroluminescent element comprising an anode, a cathode and an organic layer disposed between the anode and the cathode, wherein the organic layer comprises a mixed layer containing a light-emitting low molecular compound and/or a charge-transporting low molecular compound in a film containing an insolubilized polymer obtained by insolubilizing an insolubilizing polymer, and, adjacent to the mixed layer, a layer containing a light-emitting low molecular compound and a charge-transporting low molecular compound and not containing an insolubilized polymer.

23 Claims, 3 Drawing Sheets

(56) References Cited

FOREIGN PATENT DOCUMENTS

| JP | 2009-231843 | 10/2009 |
| JP | 2010-45222 | 2/2010 |
| WO | WO 2006/095539 A1 | 9/2006 |
| WO | 2008 010487 | 1/2008 |

OTHER PUBLICATIONS

Chinese Office Action (Decision of Rejection) issued Jan. 14, 2013, in corresponding Chinese Patent Application No. 200980129245.1 (wiith English-language Translation).
U.S. Appl. No. 14/551,768, filed Nov. 24, 2014, Tsurutani, et al.
Office Communication issued Mar. 12, 2014, in corresponding European Patent application 09 806 742.4.
Office Action issued Apr. 21, 2014, in Taiwan Patent Application No. 098127215, filed Aug. 13, 2009 (with English Translation).
Office Action issued May 14, 2014, in corresponding Japanese Patent Application No. 2013-226898 (with attached English translation).
Office Action issued Aug. 2, 2013, in corresponding EPC Patent Application No. 09 80 6742.
U.S. Appl. No. 13/491,828, filed Jul. 15, 2013, Abe, et al.
Office Action issued Sep. 25, 2015, in corresponding Korean Patent Application No. 10-2011-7001291.
U.S. Appl. No. 14/334,142, filed Jul. 17, 2014, Tsurutani, et al.
Office Action issued Sep. 25, 2015, in corresponding Korean Patent Application No. 10-2011-7001291 (English Translation Only).
Reexamination Decision issued Sep. 29, 2014, in corresponding Chinese Patent Application 200980129245.1 (with English-language Translation).
Korean Office Action issued Jul. 30, 2016, in corresponding Korean Patent Application No. 2011-7001291, (with English-language Translation).

\* cited by examiner

ORGANIC ELECTROLUMINESCENT ELEMENT, ORGANIC EL DISPLAY DEVICE AND ORGANIC EL ILLUMINATION

TECHNICAL FIELD

The present invention relates to an organic electroluminescent element, an organic EL display device and an organic EL illumination.

BACKGROUND ART

In recent years, developments of electroluminescent elements using organic thin films (i.e. organic electroluminescent elements) have been carried out.

Among them, in order to improve the performance of an organic electroluminescent element, development of an organic electroluminescent element having a structure wherein organic thin films are laminated in a multilayer construction (hereinafter referred to as a "multilayer laminate structure") has been actively carried out.

In an organic electroluminescent element having a multilayer laminate structure, at least two layers different in composition are present. At their interface, there is a difference in the ionization potential or electron affinity, which becomes a hindrance at the time of interlayer injection of an electric charge (holes or electrons). This has been a cause of an increase of a driving voltage in an organic electroluminescent element.

Meanwhile, as a method for forming an organic thin film in an organic electroluminescent element, a vacuum vapor deposition method and a wet film-forming method may be mentioned.

In development of an organic electroluminescent element employing a vacuum vapor deposition method, e.g., in Patent Document 1, it is disclosed that by using a co-evaporation method as the vacuum vapor deposition method, a multilayer laminate structure is formed to reduce the above-mentioned hindrance in injection of an electric charge.

On the other hand, the wet film-forming method has merits such that no vacuuming process is required, film formation in a large area is easy, and it is easy to incorporate a plurality of materials having various functions as mixed to a single layer (composition). For example, Patent Document 2 or 3 discloses an invention of an organic electroluminescent element wherein a hole injection layer and a light-emitting layer are formed by a wet film-forming method, but it had problems such that as compared with an element formed by a vacuum deposition method, the current efficiency or power efficiency is low, the driving voltage is high, and the luminescent efficiency is low.

PRIOR ART DOCUMENTS

Patent Documents

Patent Document 1: JP-A-2002-324680
Patent Document 2: JP-A-2007-110093
Patent Document 3: JP-A-2007-335852

DISCLOSURE OF THE INVENTION

Object to be Accomplished by the Invention

It is an object of the present invention to provide an organic electroluminescent element having a low driving voltage, high current efficiency and high power efficiency.

Means to Accomplish the Object

The present inventors have conducted an extensive study and as a result, have found it possible to accomplish the above object by an organic electroluminescent element wherein the organic layer has a mixed layer containing a light-emitting low molecular compound and/or a charge-transporting low molecular compound in a film obtained by insolubilizing a polymer having insolubilizing groups, and they have arrived at the present invention.

That is, the present invention provides an organic electroluminescent element comprising an anode, a cathode and an organic layer disposed between the anode and the cathode, wherein the organic layer comprises, at least, a mixed layer containing a light-emitting low molecular compound and/or a charge-transporting low molecular compound in a film obtained by insolubilizing a polymer having insolubilizing groups, and, adjacent to the mixed layer, a layer containing a light-emitting low molecular compound and a charge-transporting low molecular compound and not containing an insoluble polymer after insolubilization, and a process for its production, as well as an organic EL (electroluminescence) display device and an organic EL illumination.

Advantageous Effects of the Invention

The organic electroluminescent element of the present invention has a mixed layer containing a light-emitting low molecular compound and/or a charge-transporting low molecular compound in a film obtained by insolubilizing an insolubilizing polymer, whereby it has a low driving voltage, high power efficiency and high current efficiency.

Accordingly, the organic electroluminescent element of the present invention is expected to be applied to flat panel displays (for e.g. OA computers or wall-hung television sets), light sources utilizing the surface-emitting characteristics (e.g. light sources for copy machines, backlight power sources for liquid crystal displays or various meters), display panels or sign lamps, and thus, its technical value is high.

BEST MODE FOR CARRYING OUT THE INVENTION

Figure 1:
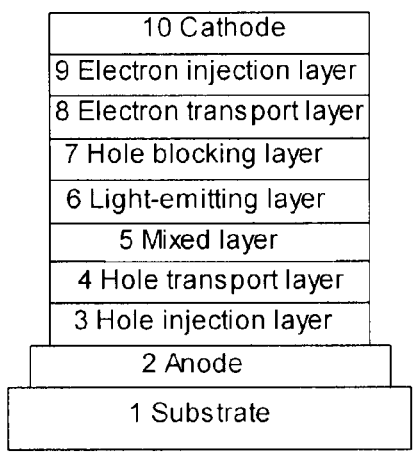
FIG. 1 is a cross-sectional view schematically illustrating one example of the structure of the organic electroluminescent element of the present invention.

Now, the organic electroluminescent element of the present invention and the process for its production as well as the organic EL display device and the organic EL illumination will be described in detail with reference to preferred embodiments, but it should be understood that the following embodiments are merely exemplary (typical examples) of the embodiments of the present invention and the present invention is by no means thereby restricted.

[Basic Construction]

The organic electroluminescent element of the present invention is an organic electroluminescent element comprising an anode, a cathode and an organic layer disposed between the anode and the cathode, wherein the organic layer comprises a mixed layer containing a light-emitting low molecular compound and/or a charge-transporting low molecular compound in a film (which may be hereinafter referred to as "an insolubilized film") obtained by insolubilizing an insolubilizing polymer, and, adjacent to the mixed layer, a layer containing a light-emitting low molecular compound and a charge-transporting low molecular compound and not containing an insolubilized polymer (which may be hereinafter referred to as "organic electroluminescent element A of the present invention").

Further, the organic electroluminescent element of the present invention is an organic electroluminescent element comprising an anode, a cathode and an organic layer disposed between the anode and the cathode, wherein the organic layer comprises a mixed layer containing at least a polymer, and a light-emitting low molecular compound and/or a charge-transporting low molecular compound, and, adjacent to the mixed layer, a layer containing a light-emitting low molecular compound and/or a charge-transporting low molecular compound and not containing a polymer, and after dipped at from 20 to 25° C. for 60 seconds in each of water, ethyl benzoate and a hydrocarbon solvent, the layer containing the polymer has a remaining film thickness of at least 95% as compared to the film thickness before the dipping (which may be hereinafter referred to as "organic electroluminescent element B of the present invention").

That is, "the organic electroluminescent element of the present invention" means both of "organic electroluminescent element A of the present invention" and "organic electroluminescent element B of the present invention".

MEANING OF TERMS

Insolubilizing polymer: A polymer having insolubilizing groups.

Insolubilized polymer: A polymer after insolubilizing an insolubilizing polymer.

Insolubilized film: A film obtained by insolubilizing a polymer having insolubilizing groups.

Mixed layer: In an insolubilized film, a region containing a light-emitting low molecular compound and/or a charge-transporting low molecular compound.

Insolubilized layer: In an insolubilized film, a region not containing a light-emitting low molecular compound and/or a charge-transporting low molecular compound.

Light-emitting layer: A layer which is adjacent to the mixed layer and which contains a light-emitting low molecular compound and/or a charge-transporting low molecular compound and does not contain a polymer having insolubilizing groups after insolubilization.

In the above description, when the insolubilizing group is a cross-linking group, a dissociating group or an eliminable protecting group, the insolubilizing polymer, the insolubilized polymer, the insolubilized film or the insolubilized layer is to be rephrased as follows.

That is, when the insolubilizing group is a cross-linking group, "insolubilizing polymer" is rephrased as "cross-linking polymer", "insolubilized polymer" as "cross-linked polymer", "insolubilized film" as "cross-linked film", and "insolubilized layer" as "cross-linked layer".

When the insolubilizing group is a dissociating group, "insolubilizing polymer" is rephrased as "dissociating polymer", "insolubilized polymer" as "dissociated polymer", "insolubilized film" as "dissociated film", and "insolubilized layer" as "dissociated layer".

When the insolubilizing group is an eliminable protecting group, "insolubilizing polymer" is rephrased as "eliminating polymer", "insolubilized polymer" as "eliminated polymer", "insolubilized film" as "eliminated film", and "insolubilized layer" as "eliminated layer".

The same applies with respect to the above mixed layer and light-emitting layer.

[Polymer Having Insolubilizing Groups (Insolubilizing Polymer)]

In the present invention, a polymer having insolubilizing groups (which may be hereinafter referred to as an "insolubilizing polymer") is a polymer having at least one insolubilizing group. Here, a polymer may be of a structure having repeating units, and it may have two or more different types of repeating units.

In the present invention, the insolubilizing polymer is a polymer having repeating units of one or more types and has at least a partial structure (charge-transporting moiety) suitable for charge transportation.

(Insolubilizing Group)

In the present invention, the insolubilizing group is a group which is reacted by heat and/or irradiation with active energy rays and a group having an effect to lower the solubility of the polymer in an organic solvent or water after the reaction as compared to before the reaction.

In the present invention, the insolubilizing group is preferably a cross-linking group, a dissociating group or an eliminable protecting group.

Further, among them, a cross-linking group and a dissociating group are more preferred in that the structure after the insolubilization (hereinafter "insolubilized polymer") is particularly stable.

[Cross-Linking Polymer]

The insolubilizing polymer in the present invention preferably has a cross-linking group as the insolubilizing group, in that it is thereby possible to create a large difference in the solubility of the polymer in an organic solvent as between before and after the reaction (cross-linking reaction) which takes place by heat and/or irradiation with active energy rays.

That is, the insolubilizing polymer of the present invention is preferably a polymer having cross-linking groups (which may be hereinafter referred to as a "cross-linking polymer").

In the present invention, the cross-linking polymer is a polymer having at least one cross-linking group.

Here, a polymer may be of a structure having repeating units, and it may have two or more different types of repeating units. The cross-linking polymer in the present invention is a polymer having repeating units of one or more types and has at least a partial structure (charge-transporting moiety) suitable for charge transportation.

The cross-linking polymer in the present invention is usually soluble in an amount of at least 0.1 wt % in toluene at room temperature, and the solubility of the cross-linking polymer in toluene is preferably at least 0.5 wt %, more preferably at least 1 wt %.

(Cross-Linking Group)

In the present invention, the cross-linking group is a group which is reacted with the same or different group of another molecule located in the vicinity to form a new chemical bond. For example, it may be a group which is reacted with the same or different group in another molecule located in the vicinity to form a new chemical bond, by heat and/or irradiation with active energy rays or upon receiving an energy from another molecule of e.g. a sensitizer.

The cross-linking group is not particularly limited, but is preferably a group containing an unsaturated double bond, a cyclic ether structure, a benzocyclobutene ring or the like.

Among them, a cross-linking group is preferably a group selected from the following Group A of cross-linking groups, since insolubilization is thereby easy.

Group A of cross-linking groups:

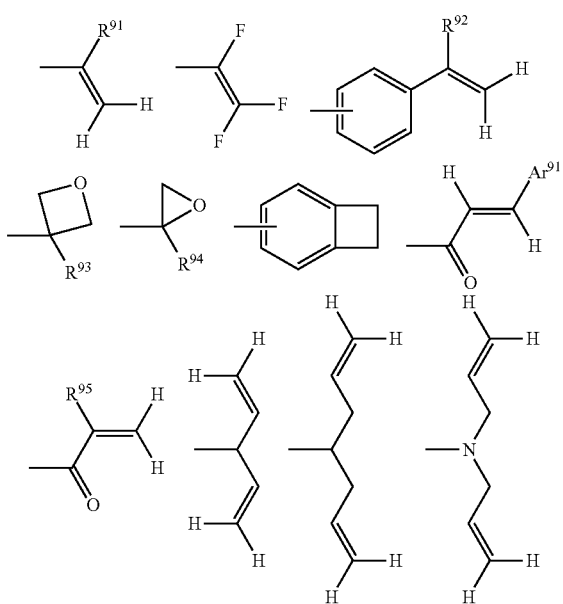

(wherein, each of $R^{91}$ to $R^{95}$ which are independent of one another, is a hydrogen atom or an alkyl group, and $Ar^{91}$ is an aromatic hydrocarbon group which may have a substituent, or an aromatic heterocyclic group which may have a substituent.)

Especially, the cross-linking group is preferably a group selected from the following Group A' of cross-linking groups, since the electrochemical durability is thereby excellent.

Group A' of cross-linking groups:

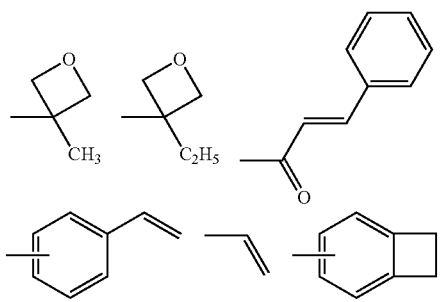

Further, in the above Group A' of cross-linking groups, a group derived from a benzocyclobutene ring is particularly preferred in that the structure after cross-linking is particularly stable.

The position of the cross-linking group in the cross-linking polymer may be in a repeating unit of the cross-linking polymer or at the terminal of the cross-linking polymer.

Further, as a side chain, the cross-linking group may be bonded to a partial structure suitable for the after-mentioned charge transportation, or may be bonded to other than the partial structure suitable for the charge transportation. Further, preferred is a cross-linking polymer wherein at least a part among partial structures suitable for the charge transportation has a cross-linking group at its side chain.

Further, as a side chain, the cross-linking group may be bonded to the main chain directly or via a bivalent group consisting of from 1 to 30 groups selected from —O— groups, —C(=O)— groups and —CH$_2$— groups (which may have a substituent) which are linked in an optional order.

More specifically, a polymer having a group represented by the following formula (X) is preferred.

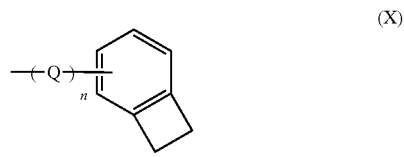

(In the formula (X), the bivalent group Q is a group selected from the group consisting of —CR$^1$R$^2$—, —O—, —CO—, —NR$^3$— and —S—, and n is an integer of from 2 to 30; each of R$^1$ to R$^3$ which are independent of one another, is a hydrogen atom or an alkyl group which may have a substituent; and n Q may be the same or different; and further, the benzocyclobutene ring in the formula (X) may have a substituent other than the bivalent group Q.)

(1. With Respect to Q)

In the formula (X), the bivalent group Q is a group selected from the group consisting of —CR$^1$R$^2$—, —O—, —CO—, —NR$^3$— and —S— in that at the time of heating, the benzocyclobutene ring is made freely movable, and after the cross-linking reaction, the cross-linked main chains are made to be sufficiently separated. Particularly, it preferably contains —CR$^1$R$^2$—, whereby the electrical durability will be excellent. It is further preferred that Q is a group consisting of —CR$^1$R$^2$—, whereby the electrical durability will be excellent.

Here, n Q may be the same or different from one another.

(2. With Respect to R$^1$ to R$^3$)

Each of R$^1$ to R$^3$ in the formula (X) is a hydrogen atom or an alkyl group which may have a substituent, and the alkyl group may be linear, branched or cyclic.

Further, when each of R$^1$ to R$^3$ is an alkyl group which may have a substituent, the number of carbon atoms including its substituent, is usually at least 1 and usually at most 20, preferably at most 10. Specific examples include a methyl group, an ethyl group, a n-propyl group, a 2-propyl group, a n-butyl group, an isobutyl group, a tert-butyl group, a cyclohexyl group, etc., and among them, preferred is a methyl group or an ethyl group.

R$^1$ to R$^3$ are preferably hydrogen atoms in that the charge-transporting ability will be further improved, and, at the time of carrying out the cross-linking reaction, the film becomes less susceptible to cracking, or the polymer main chains are less likely to be agglomerated.

Further, in a case where R$^1$ to R$^3$ are alkyl groups which may have a substituent, the substituent of such alkyl groups may, for example, be an alkyl group, an alkoxy group or a group derived from a benzocyclobutene ring.

(3. With Respect to n)

n represents an integer, and is usually at least 2, preferably at least 4 and usually at most 30, preferably at most 20.

If it is less than the lower limit value, at the time of carrying out the cross-linking reaction, the film tends to be susceptible to cracking, and the polymer main chains are likely to be agglomerated. On the other hand, if it exceeds the upper limit value, the charge-transporting ability is likely to deteriorate, or the heat resistance tends to be low.

The molecular weight of the group represented by the formula (X) including its substituent, is usually at least 130 and usually at most 500, preferably at most 300. Within such a range, at the time of carrying out the cross-linking reaction, the film tends to be less susceptible to cracking, and the polymer main chains tend to be hardly agglomerated, and further, the charge-transporting ability will not be adversely affected, such being desirable.

(With Respect to the Number of Cross-Linking Groups in the Cross-Linking Polymer)

The number of cross-linking groups in the cross-linking polymer of the present invention is represented by the number per molecular weight of 10,000.

Here, as the molecular weight, a value calculated from the charged monomer ratio excluding terminal groups, is employed. That is, the number of cross-linking groups of the cross-linking polymer can be obtained from the monomer ratio and structural formulae of charged monomers at the time of preparing the cross-linking polymer.

For example, the case of cross-linking polymer (H1) used in Example 1 given hereinafter will be described.

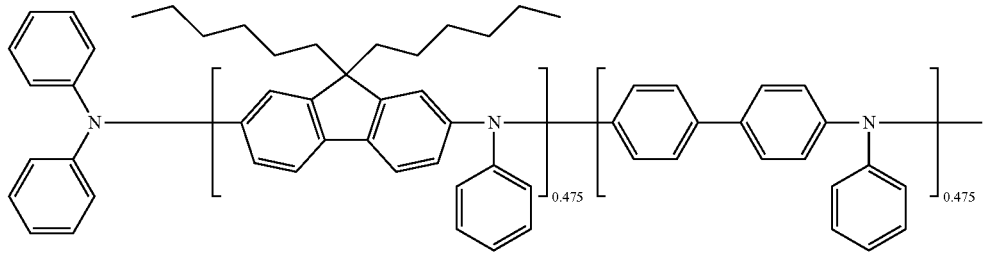

(H1)

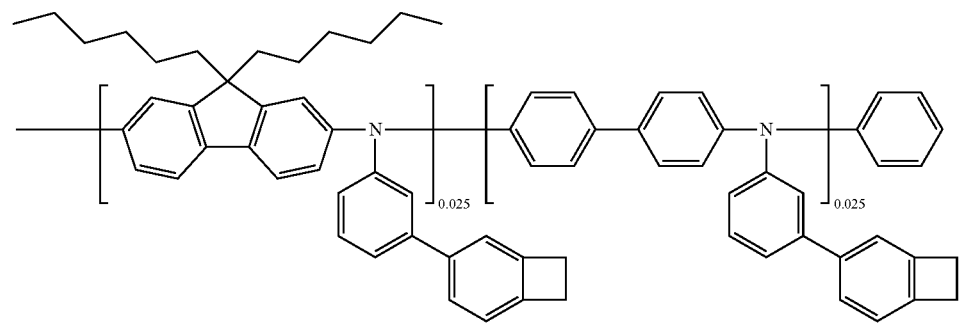

In cross-linking polymer (H1), the molecular weight calculated from the charged monomer ratio excluding the terminal groups is 338.57, and the number of cross-linking groups is 0.05 group per molecule, on average. By a simple proportional calculation based on this data, the number of cross-linking groups per molecular weight of 10,000, is calculated to be 1.5 groups.

In the present invention, the number of cross-linking groups in the cross-linking polymer is usually at most 10 groups, preferably at most 8 groups, further preferably at most 6 groups, particularly preferably at most 3.5 groups, and usually at least 0.5 group, preferably at least 1 group, further preferably at least 1.5 groups, per molecular weight of 10,000.

If it exceeds the upper limit value, it is likely that a flat film cannot be obtained due to cracking, the mixed layer tends to be hardly formed as the cross-linking density tends to be too large, or unreacted cross-linking groups tend to increase in the cross-linked film, whereby the useful life of the obtainable element will be adversely affected.

On the other hand, if it is less than the lower limit value, insolubilization of the cross-linked film tends to be inadequate, and a multilayer laminate structure may not be formed by a wet film-forming method.

(With Respect to Molecular Weight)

The weight average molecular weight of the cross-linking polymer in the present invention is usually at least 500, preferably at least 2,000, more preferably at least 4,000, and usually at most 2,000,000, preferably at most 500,000, more preferably at most 200,000.

If the weight average molecular weight of the cross-linking polymer in the present invention is lower than the lower limit value, the film forming property of the composition containing such a polymer is likely to deteriorate, and the glass transition temperature, melting point and vaporization temperature of the cross-linking polymer tend to be low, whereby the heat resistance is likely to be substantially impaired.

On the other hand, if the weight average molecular weight exceeds the upper limit value, impurities tend to have high molecular weights, whereby purification of the cross-linking polymer is likely to be difficult.

Further, the dispersion degree Mw/Mn (Mw: weight average molecular weight, Mn: number average molecular weight) of the polymer is usually at most 3.0, preferably at most 2.5, more preferably at most 2.0, and preferably at least 1.0, further preferably at least 1.1, particularly preferably at least 1.2. If the dispersion degree of the polymer exceeds this upper limit, there may be such a trouble that the purification tends to be difficult, the solubility in a solvent tends to deteriorate or the charge-transporting property tends to deteriorate.

The weight average molecular weight (and the number average molecular weight) in the present invention is determined by a SEC (size exclusion chromatography) measurement. By the SEC measurement, a higher molecular weight component takes a shorter elution time, and a lower molecular weight component takes a longer elution time, but by using a correction curve calculated from the elution time of polystyrene (standard sample) having a known molecular weight, the elution time of a sample is converted to a molecular weight to calculate the weight average molecular weight (and the number average molecular weight).

(With Respect to Charge Transporting Moiety)

The cross-linking polymer in the present invention preferably has a partial structure suitable for charge transportation as at least a part among its repeating units.

The partial structure suitable for charge transportation may, for example, be an aromatic cyclic structure having at least three rings, such as a triarylamine structure, a fluorene ring, an anthracene ring, a pyrene ring, a carbazole ring, a dibenzofuran ring, a dibenzothiophene ring, a phenoxazine ring or a phenanthroline ring, an aromatic heterocyclic structure such as a pyridine ring, a pyrazine ring, a triazine ring, a quinoline ring, a thiophene ring, a silole ring, an imidazole ring, a pyrazole ring, an oxadiazole ring or a benzothiadiazole ring, or at least monovalent group derived from e.g. a metal complex structure.

Particularly, it is preferred to contain a triarylamine structure and/or at least monovalent group derived from a fluorene ring from such a viewpoint that HOMO (highest occupied molecular orbital) and/or LUMO (lowest unoccupied molecular orbital) in the cross-linking polymer of the present invention will be properly delocalized to improve the electrochemical stability and the charge-transporting property.

In the cross-linking polymer of the present invention, the main chain is preferably conjugated wholly or partially, whereby the charge transporting property will be improved.

(With Respect to the Formula (2))

With a view to improving the electrochemical stability and the charge-transporting property, the cross-linking polymer in the present invention is preferably a polymer having repeating units represented by the following formula (2) as a partial structure suitable for charge transportation.

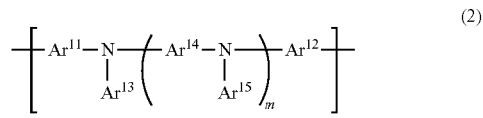

(2)

(wherein m is an integer of from 0 to 3; each of $Ar^{11}$ and $Ar^{12}$ which are independent of each other, is a direct bond, an aromatic hydrocarbon group which may have a substituent, or an aromatic heterocyclic group which may have a substituent; and each of $Ar^{13}$ to $Ar^{15}$ which are independent of one another, is an aromatic hydrocarbon group which may have a substituent, or an aromatic heterocyclic group which may have a substituent; provided that $Ar^{11}$ and $Ar^{12}$ are not simultaneously direct bonds.)

(With Respect to $Ar^{11}$ to $Ar^{15}$)

In the formula (2), each of $Ar^{11}$ and $Ar^{12}$ which are independent of each other, is a direct bond, an aromatic hydrocarbon group which may have a substituent, or an aromatic heterocyclic group which may have a substituent, and each of $Ar^{13}$ to $Ar^{15}$ which are independent of one another, is an aromatic hydrocarbon group which may have a substituent, or an aromatic heterocyclic group which may have a substituent.

The aromatic hydrocarbon group which may have a substituent may, for example, be a group derived from a 6-membered single ring or from 2 to 5 condensed ring, such as a benzene ring, a naphthalene ring, an anthracene ring, a phenanthrene ring, a perylene ring, a tetracene ring, a pyrene ring, a benzpyrene ring, a chrysene ring, a triphenylene ring, an acenaphthene ring, a fluoranthene ring or a fluorene ring.

The aromatic heterocyclic group which may have a substituent may, for example, be a group derived from a 5- or 6-membered single ring or from a 2 to 4 condensed ring, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a flopyrrole ring, a flofuran ring, a thienofuran ring, a benzisoxazole ring, a benzoisothiazole ring, a benzimidazole ring, a pyridine ring, a pyrazine ring, a pyridazine ring, a pyrimidine ring, a triazine ring, a quinoline ring, an isoquinoline ring, a sinoline ring, a quinoxaline ring, a phenanthridine ring, a benzimidazole ring, a perimidine ring, a quinazoline ring, a quinazolinone ring or an azulene ring.

From the viewpoint of the solubility in a solvent and the heat resistance, each of $Ar^{11}$ to $Ar^{15}$ which are independent of one another, is preferably a group derived from a ring selected from the group consisting of a benzene ring, a naphthalene ring, an anthracene ring, a phenanthrene ring, a triphenylene ring, a pyrene ring, a thiophene ring, a pyridine ring and a fluorene ring.

Further, as $Ar^{11}$ to $Ar^{15}$, a bivalent group wherein rings of one or more types selected from the above group are directly bonded or linked via a —CH=CH— group, is also preferred, and a biphenylene group and a terphenylene group are further preferred.

Substituents which the aromatic hydrocarbon group and the aromatic heterocyclic group in $Ar^{11}$ to $Ar^{15}$ may have other than the after-mentioned insolubilizing groups, are not particularly limited, but may, for example, one or more types selected from the following [Group Z of substituents].

[Group Z of Substituents]

An alkyl group having preferably from 1 to 24 carbon atoms, more preferably from 1 to 12 carbon atoms, such as a methyl group or an ethyl group;

an alkenyl group having preferably from 2 to 24 carbon atoms, more preferably from 2 to 12 carbon atoms, such as a vinyl group;

an alkynyl group having preferably from 2 to 24 carbon atoms, more preferably from 2 to 12 carbon atoms, such as an ethynyl group;

an alkoxy group having preferably from 2 to 24 carbon atoms, more preferably from 2 to 12 carbon atoms, such as a methoxy group or an ethoxy group;

an aryloxy group or a heteroaryloxy group having preferably from 4 to 36 carbon atoms, more preferably from 5 to 24 carbon atoms, such as a phenoxy group, a naphthoxy group or a pyridyloxy group;

an alkoxycarbonyl group having preferably from 2 to 24 carbon atoms, more preferably from 2 to 12 carbon atoms, such as a methoxycarbonyl group or an ethoxycarbonyl group;

a dialkylamino group having preferably from 2 to 24 carbon atoms, more preferably from 2 to 12 carbon atoms, such as a dimethylamino group or a diethylamino group;

a diarylamino group having preferably from 10 to 36 carbon atoms, more preferably from 12 to 24 carbon atoms, such as a diphenylamino group, a ditolylamino group or an N-carbazolyl group;

an arylalkylamino group having preferably from 6 to 36 carbon atoms, more preferably from 7 to 24 carbon atoms, such as a phenylmethylamino group;

an acyl group having preferably from 2 to 24 carbon atoms, more preferably from 2 to 12 carbon atoms, such as an acetyl group or a benzoyl group;

a halogen atom such as a fluorine atom or a chlorine atom;

a haloalkyl group having preferably from 1 to 12 carbon atoms, more preferably from 1 to 6 carbon atoms, such as a trifluoromethyl group;

an alkylthio group having preferably from 1 to 24 carbon atoms, more preferably from 1 to 12 carbon atoms, such as a methylthio group or an ethylthio group;

an arylthio group or a heteroarylthio group having preferably from 4 to 36 carbon atoms, more preferably from 5 to 24 carbon atoms, such as a phenylthio group, a naphthylthio group or a pyridylthio group;

a silyl group having preferably from 2 to 36 carbon atoms, more preferably from 3 to 24 carbon atoms, such as a trimethylsilyl group or a triphenylsilyl group;

a siloxy group having preferably from 2 to 36 carbon atoms, more preferably from 3 to 24 carbon atoms, such as a trimethylsiloxy group or a triphenylsiloxy group;

a cyano group;

an aromatic hydrocarbon group having preferably from 3 to 36 carbon atoms, more preferably from 6 to 24 carbon atoms, such as a phenyl group or a naphthyl group; and an aromatic heterocyclic group having preferably from 3 to 36 carbon atoms, more preferably from 4 to 24 carbon atoms, such as a thienyl group or a pyridyl group.

Each of the above substituents may further have substituents, which may, for example, be groups exemplified in the above "Group Z of substituents".

The molecular weight of the substituents which the aromatic hydrocarbon group and the aromatic heterocyclic group in $Ar^{11}$ to $Ar^{15}$ may have other than the after-mentioned insolubilizing groups, is preferably at most 500, more preferably at most 250, including the groups further substituted.

From the viewpoint of the solubility in a solvent, the substituents which the aromatic hydrocarbon group and the aromatic heterocyclic group in $Ar^{11}$ to $Ar^{15}$ may have, are preferably each independently a $C_{1-12}$ alkyl group or a $C_{1-12}$ alkoxy group.

When m is 2 or more, the repeating unit represented by the above formula (2) has 2 or more $Ar^{14}$ and $Ar^{15}$. In such a case, the plurality of $Ar^{14}$ or $Ar^{15}$ may be the same or different. Further, the plurality of $Ar^{14}$ or $Ar^{15}$ may be bonded to one another directly or via a linking group to form a cyclic structure.

(With Respect to m)

In the formula (2), m is an integer of from 0 to 3.

It is preferred that m is 0, since it is thereby possible to increase the film-forming property and the solubility of the cross-linking polymer in an organic solvent.

Further, m is at least 1 and at most 3, preferably at most 2, whereby the hole transporting ability of the polymer will be improved.

(With Respect to the Formula (3))

The cross-linking polymer preferably contains repeating units represented by the following formula (3), whereby at the time of cross-linking reaction, the film is less susceptible to cracking, and the polymer main chains tend to be hardly agglomerated.

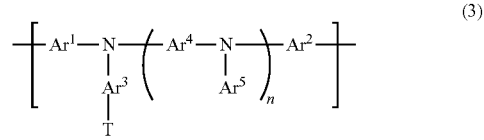

(3)

(wherein each of $Ar^1$ and $Ar^2$ which are independent of each other, is an aromatic hydrocarbon group which may have a substituent, an aromatic heterocyclic group which may have a substituent, or a direct bond; each of $Ar^3$ to $Ar^5$ which are independent of one another, is an aromatic hydrocarbon group which may have a substituent, or an aromatic heterocyclic group which may have a substituent; n is an integer of from 0 to 3; and T is a cross-linking group.)

(With Respect to $Ar^1$ to $Ar^5$)

Each of $Ar^1$ and $Ar^2$ which are independent of each other, is an aromatic hydrocarbon group which may have a substituent, an aromatic heterocyclic group which may have a substituent, or a direct bond, and each of $Ar^3$ to $Ar^5$ which are independent of one another, is an aromatic hydrocarbon group which may have a substituent, or an aromatic heterocyclic group which may have a substituent.

Specific examples of $Ar^1$ to $Ar^5$ may be the above-mentioned examples (examples corresponding to $Ar^{11}$ to $Ar^{15}$, respectively). Further, the preferred groups are also the same.

(Substituents which $Ar^1$ to $Ar^5$ May have)

Specific examples of the substituents which $Ar^1$ to $Ar^5$ may have, may be the above-mentioned "Group Z of substituents". Further, the preferred groups are also the same.

(With Respect to n)

In the formula (3), n is an integer of from 0 to 3.

It is preferred that n is 0, since it is thereby possible to increase the film-forming property and the solubility of the cross-linking polymer in a solvent.

Further, n is at least 1 and at most 3, preferably at most 2, since the hole transporting ability of the cross-linking polymer will be improved.

(With Respect to T)

In the formula (3), T is a cross-linking group. The cross-linking group is preferably a group selected from the above "Group A of cross-linking groups" more preferably a group selected from the above "Group A' of cross-linking groups".

Further, the cross-linking group T may be bonded to $Ar^3$ directly or via a bivalent group wherein from 1 to 30 groups selected from —O— groups, —C(=O)— groups or —CH$_2$— groups (which may have a substituent) are linked in an optional order.

Specific Examples of Cross-Linking Polymer

Further, preferred specific examples of the cross-linking polymer in the present invention will be presented below, but it should be understood that the present invention is by no means limited thereto.

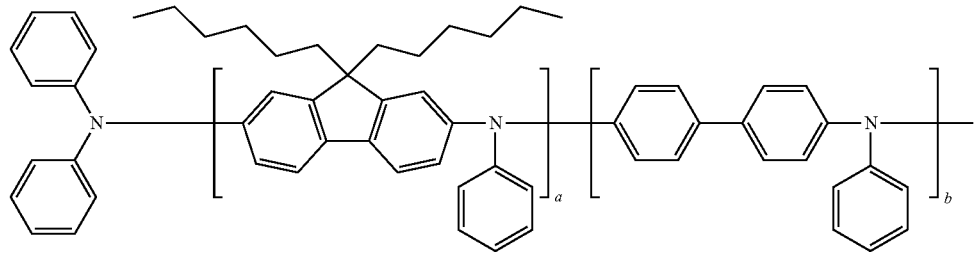

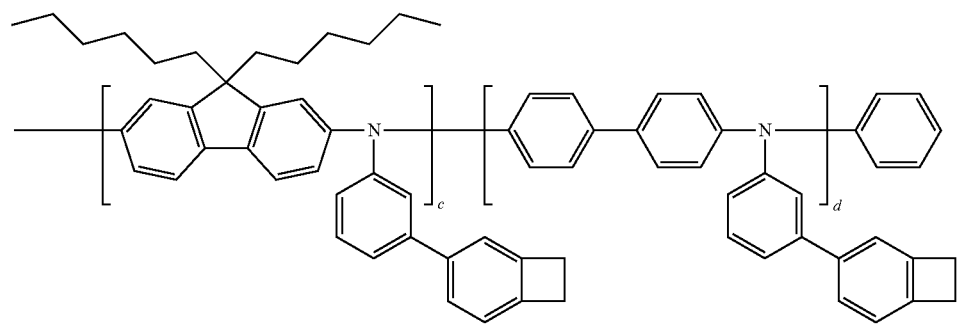

(In the above formula, for example, a=0.475, b=0.475, c=0.025, and d=0.025.)
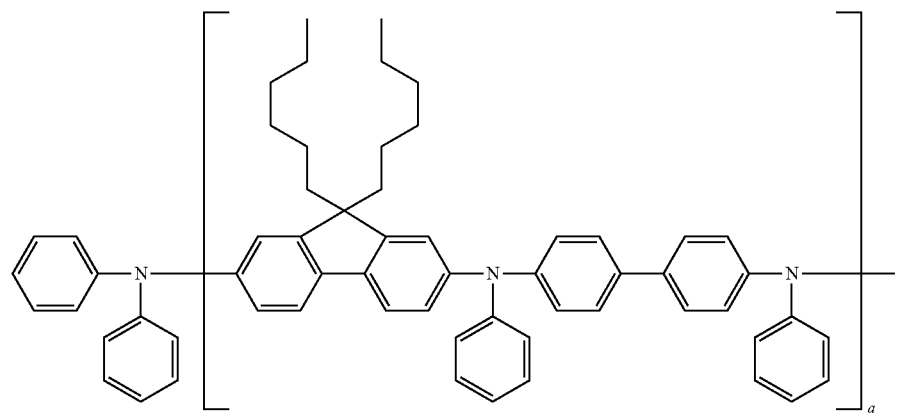
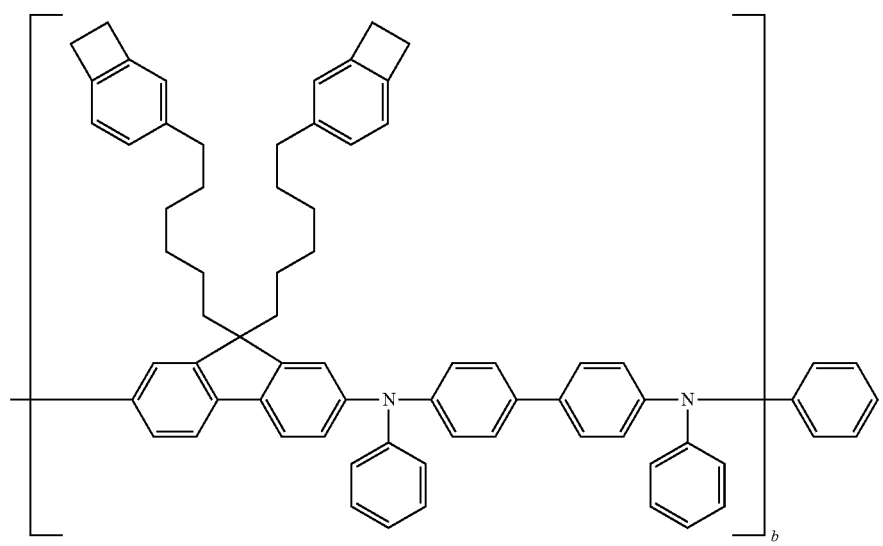
(In the above formula, for example, a=0.9, and b=0.1.)
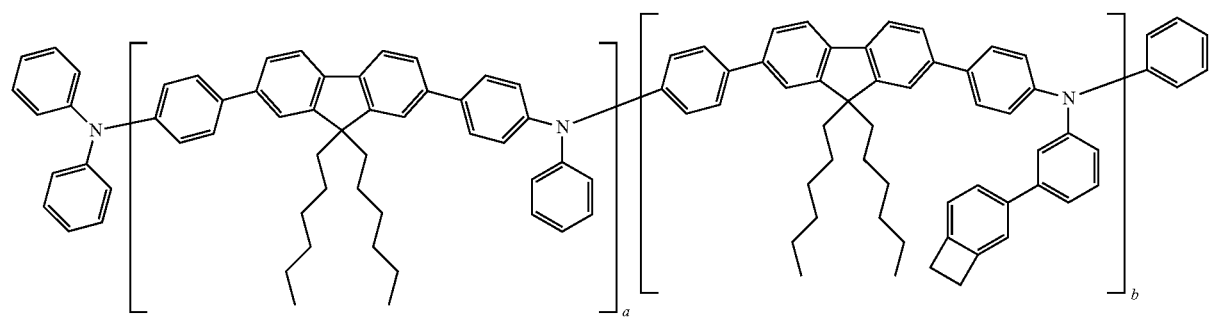

(In the above formula, for example, a=0.8407, and b=0.1593.)
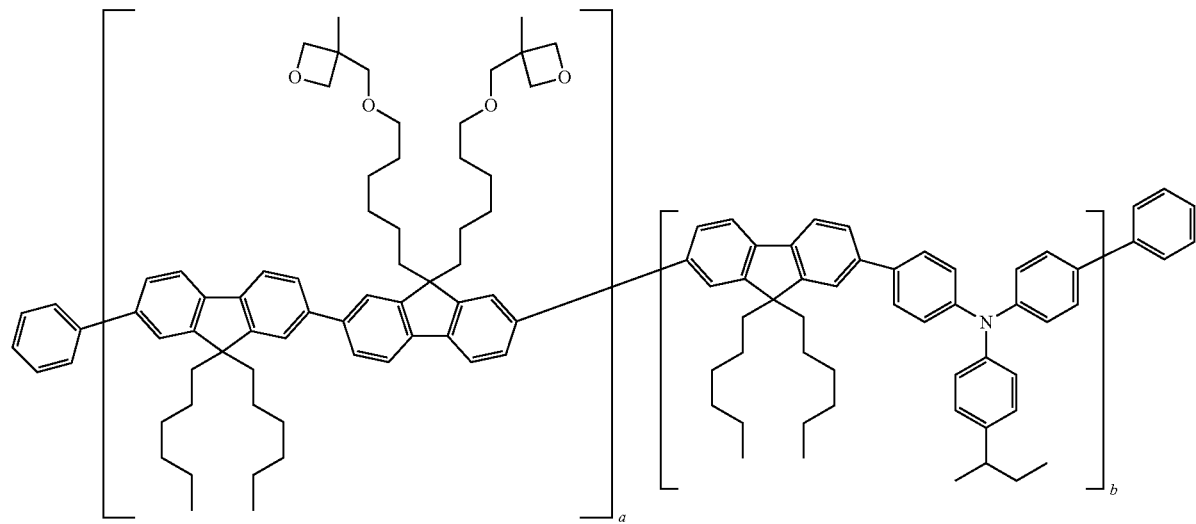
(In the above formula, for example, a=0.1, and b=0.9.)
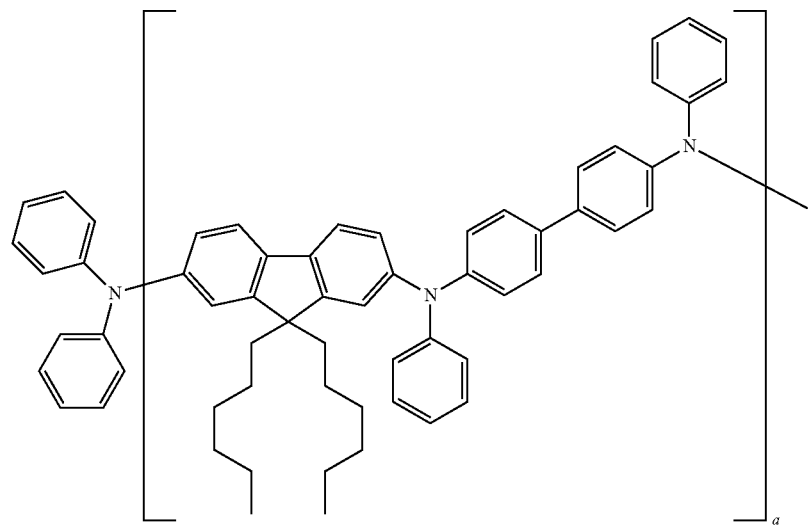

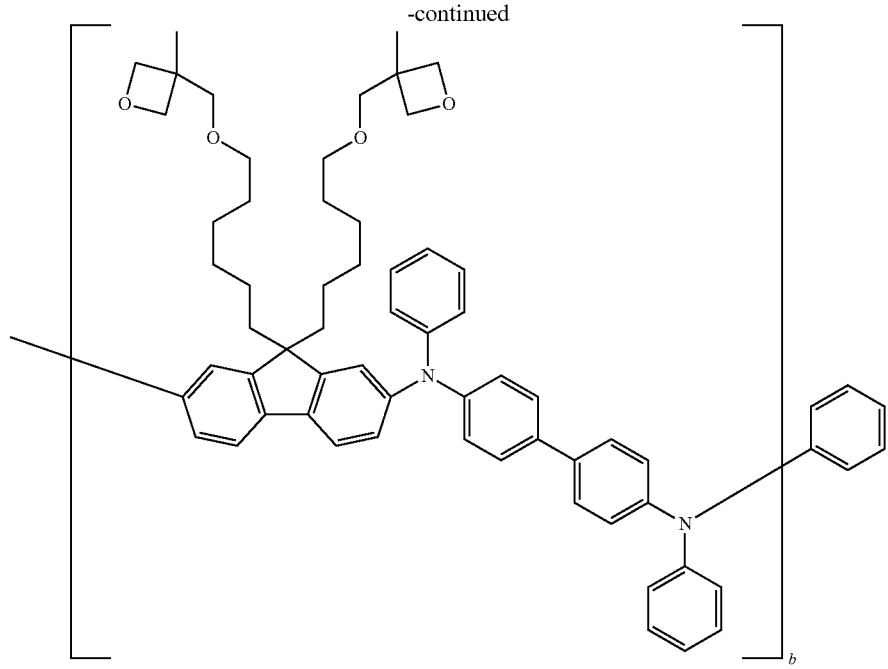
(In the above formula, for example, a=0.9, and b=0.1.)
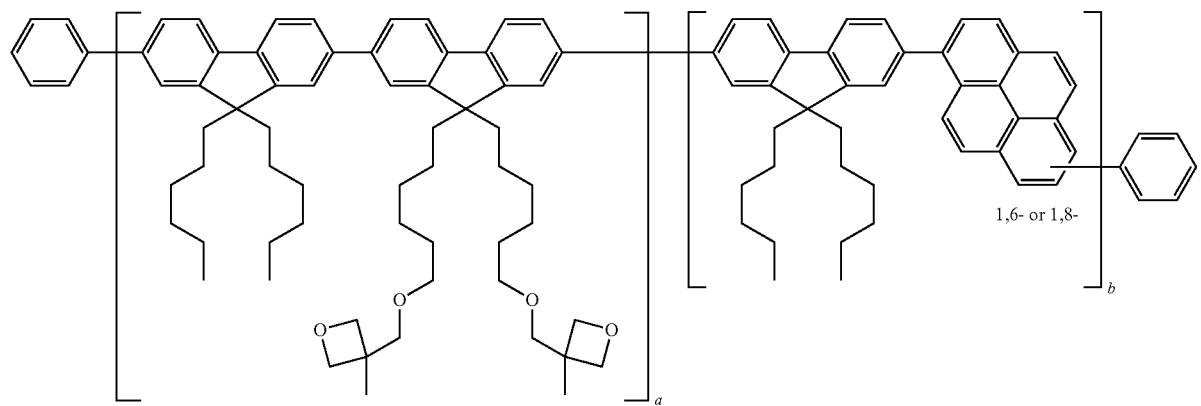

(In the above formula, for example, a=0.1, and b=0.9.)
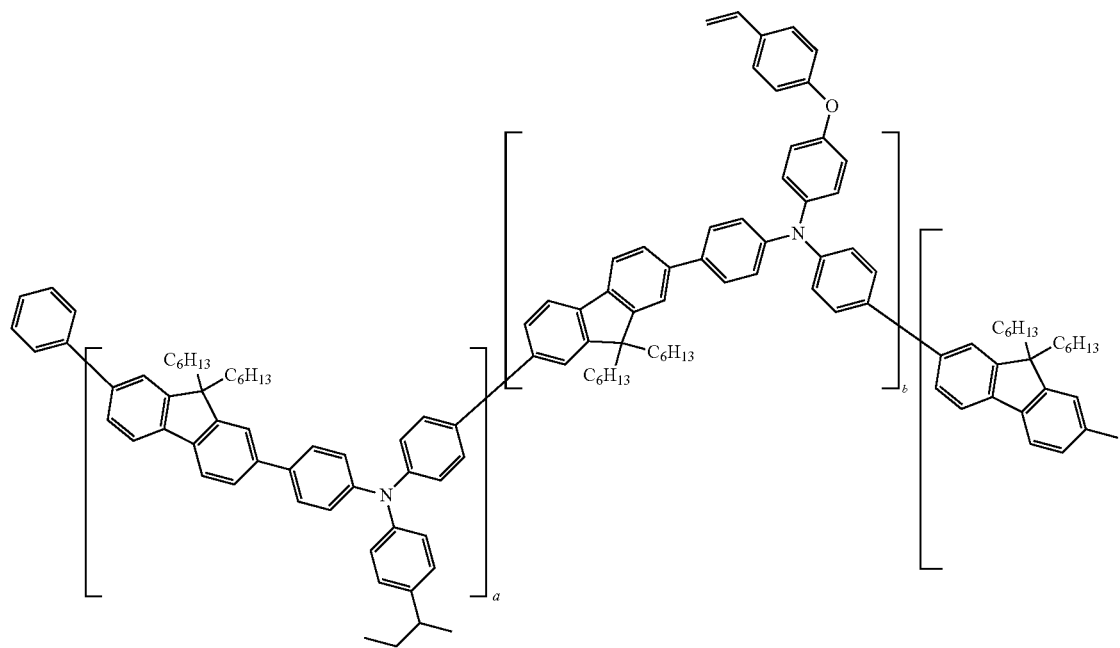
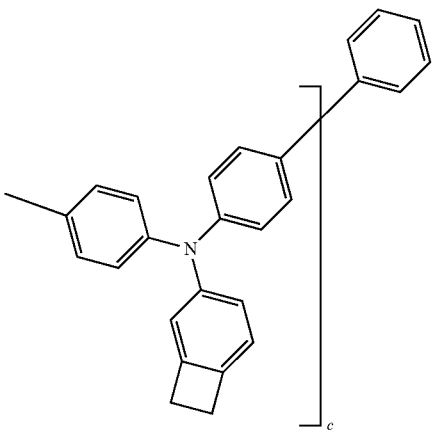

(In the above formula, for example, a=0.8, b=0.1, and c=0.1.)
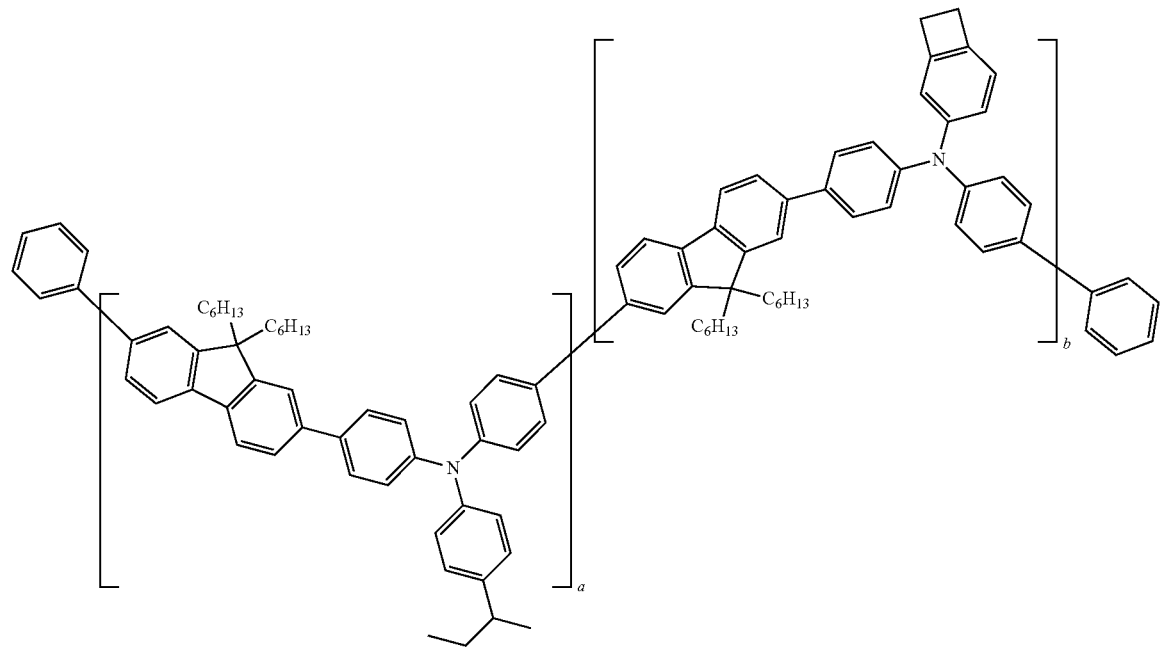
(In the above formula, for example, a=0.8, and b=0.2.)
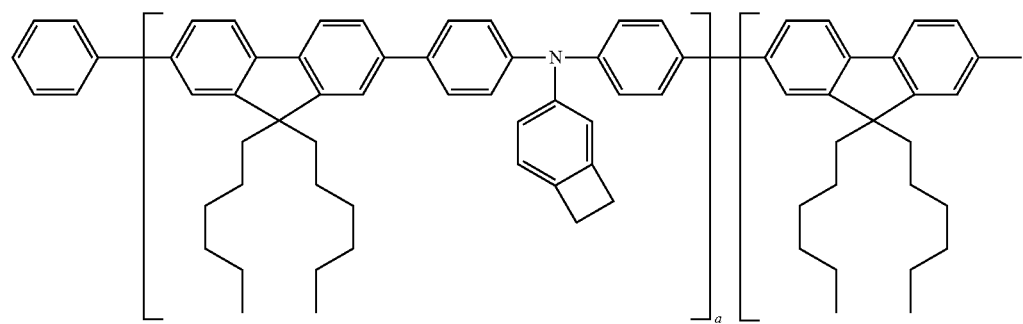
30
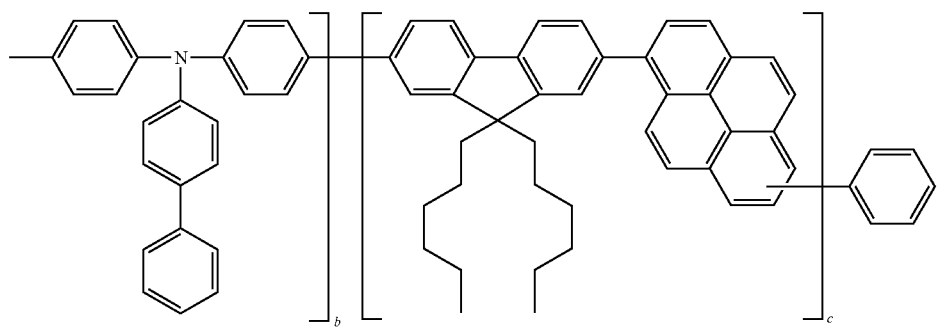

25
(In the above formula, for example, a=0.2, b=0.5, and c=0.3.)
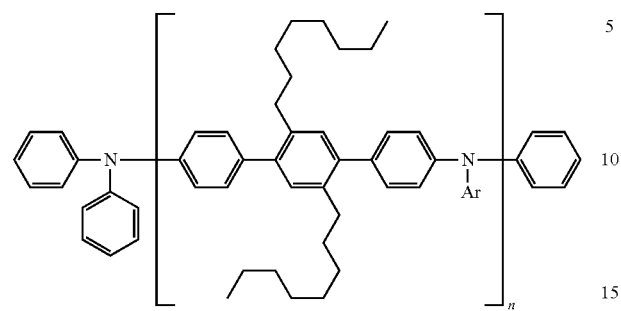
26
-continued
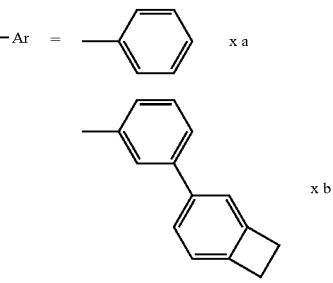
(In the above formula, for example, a=0.9442, and b=0.0558.)
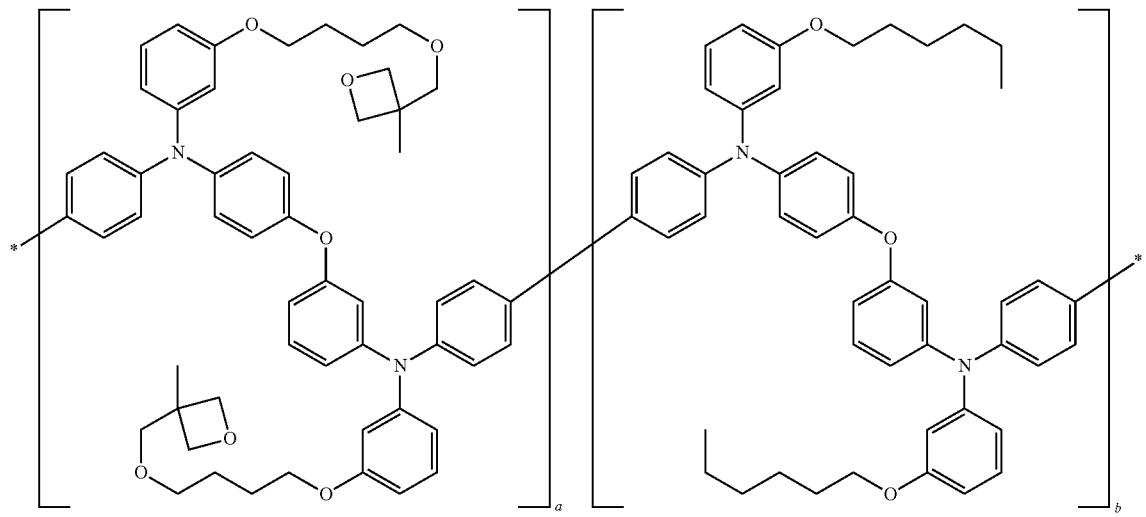
(In the above formula, for example, a=0.1, and b=0.9.)
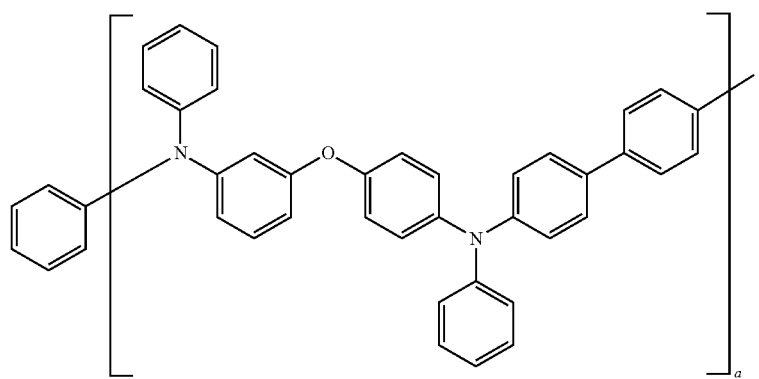

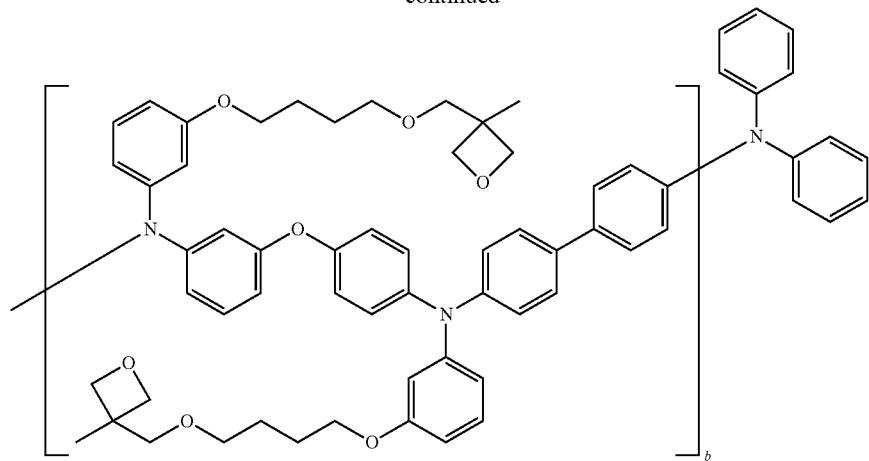
(In the above formula, for example, a=0.9, and b=0.1.)
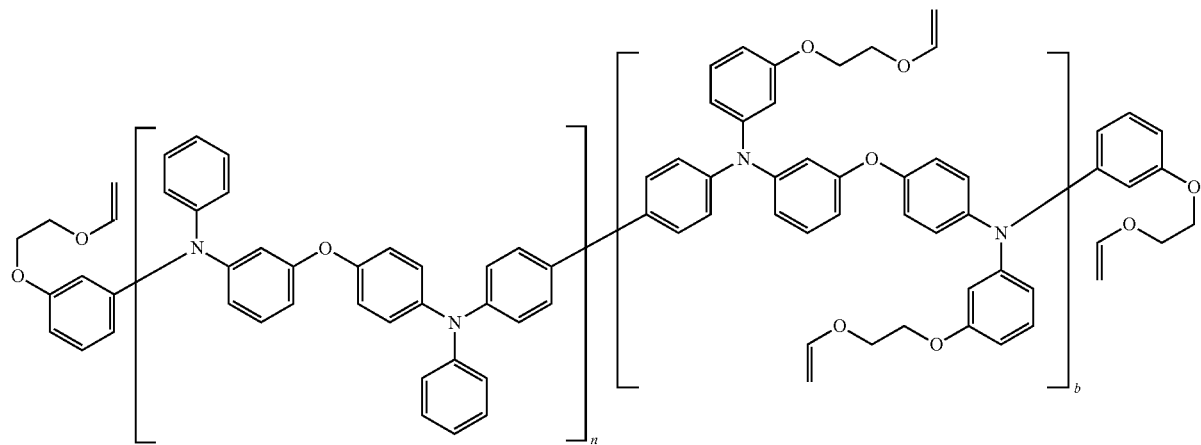
(In the above formula, for example, a=0.94, and b=0.06.)
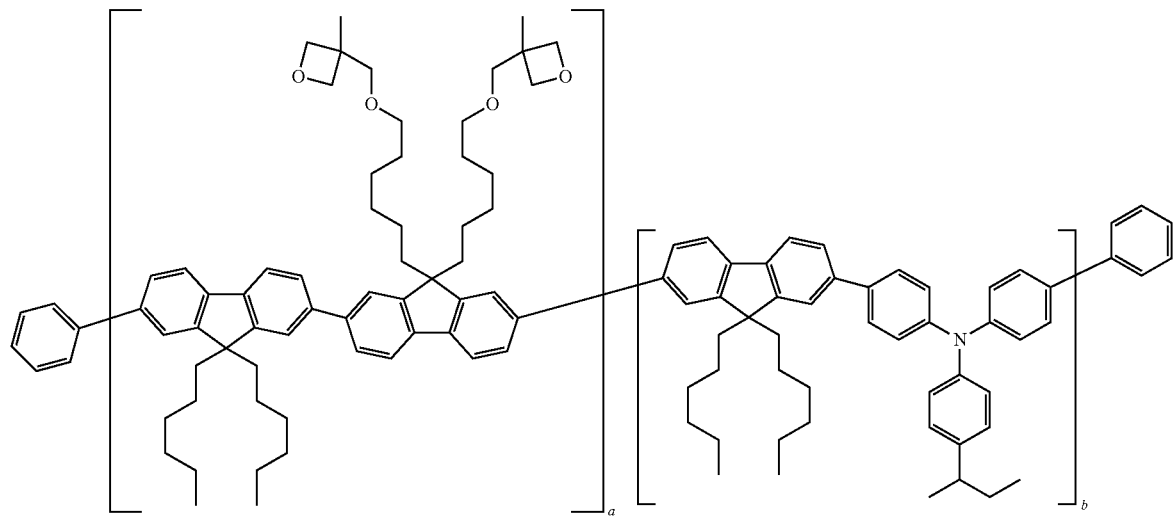

(In the above formula, for example, a=0.9, and b=0.1.)

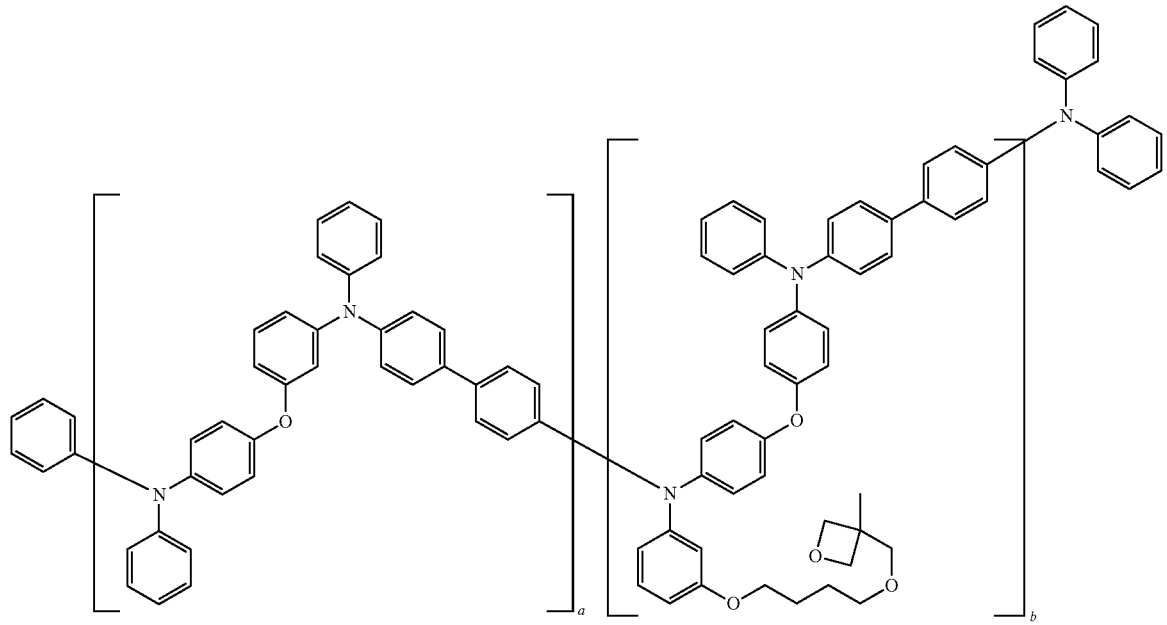

(In the above formula, for example, a=0.9, and b=0.1.)

[Cross-Linked Film-Forming Composition]

The cross-linked film is usually formed by using a cross-linked film-forming composition.

In the present invention, the cross-linked film-forming composition contains at least one type of the above-mentioned cross-linking polymer. Further, as the cross-linking polymer to be contained in the cross-linked film-forming composition, any one type may be used alone, or different two or more types may be used in an optional ratio and combination.

The cross-linked film-forming composition contains the above-mentioned cross-linking polymer, but it usually further contains a solvent.

(Solvent)

Such a solvent is preferably one which dissolves the above cross-linking polymer and is usually a solvent which dissolves the cross-linking polymer in an amount of at least 0.1 wt %, preferably at least 0.5 wt %, more preferably at least 1 wt %.

In the present invention, the cross-linked film-forming composition contains the cross-linking polymer usually in an amount of at least 0.01 wt %, preferably at least 0.05 wt %, more preferably at least 0.1 wt %, and usually at most 50 wt %, preferably at most 20 wt %, more preferably at most 10 wt %.

In the present invention, the solvent contained in the cross-linked film-forming composition is not particularly limited, but since it is necessary to dissolve the above cross-linking polymer, it is preferably an organic solvent, for example, an aromatic solvent such as toluene, xylene, mesitylene or cyclohexylbenzene; a halogenated solvent such as 1,2-dichloroethane, chlorobenzene or o-dichlorobenzene; an ether solvent e.g. an aliphatic ether such as ethylene glycol dimethyl ether, ethylene glycol diethyl ether or propylene glycol 1-monomethyl ether acetate (PGMEA); or an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole or 2,4-dimethylanisole; or an ester solvent e.g. an aliphatic ester such as ethyl acetate, n-butyl acetate, ethyl lactate or n-butyl lactate, or an aromatic ester such as phenyl acetate, phenyl propionate, methyl benzoate, ethyl benzoate, isopropyl benzoate, propyl benzoate or n-butyl benzoate. One type of these solvents may be used alone, or two or more types may be used in combination.

In the present invention, the concentration of the solvent to be contained in the cross-linked film-forming composition, is usually at least 40 wt %, preferably at least 60 wt %, more preferably at least 80 wt %, in the composition.

Further, water is likely to accelerate deterioration of the performance of the organic electroluminescent element, particularly deterioration of luminance during continuous driving, and in order to minimize water remaining in the coating film, among the above-mentioned solvents, one having a solubility of water at 25° C. of at most 1 wt % is preferred, and a solvent having such a solubility of at most 0.1 wt % is more preferred.

In the present invention, the solvent to be contained in the cross-linked film-forming composition may be a solvent having a surface tension at 20° C. of usually less than 40 dyn/cm, preferably at most 36 dyn/cm, more preferably at most 33 dyn/cm, further preferably at most 20 dyn/cm.

That is, when the cross-linked film is formed by a wet film-forming method, the affinity to the substrate is important. The uniformity of the film quality is substantially influential over the uniformity and stability of the light-emission of the organic electroluminescent element, and accordingly the composition to be used for the wet film-forming method is required to have a low surface tension so that a uniform coating film having a higher leveling property (flatness) can be formed. By using such a solvent, it is possible to form a uniform layer containing the above cross-linking polymer.

Specific examples of such a solvent having a low surface tension may, for example, be the above-mentioned aromatic solvent such as toluene, xylene, mesitylene, cyclohexylbenzene, an ester solvent such as ethyl benzoate, an ether solvent such as anisole, trifluoromethoxy anisole, pentafluoromethoxybenzene, 3-(trifluoromethyl)anisole and ethyl (pentafluorobenzoate).

Further, the cross-linked film-forming composition in the present invention may contain various other solvents, as the case requires, in addition to the above-described solvents. As such other solvents, an amide such as N,N-dimethylformamide or N,N-dimethylacetamide, dimethylsulfoxide, etc. may, for example, be mentioned.

Further, the cross-linked film-forming composition in the present invention may contain additives, such as an electron accepting compound, an additive to accelerate the cross-linking reaction, etc., as the case requires. In such a case, as the solvent, it is preferred to use a solvent which dissolves both of the above cross-linking polymer and the additive in an amount of at least 0.1 wt %, preferably at least 0.5 wt %, more preferably at least 1 wt %.

The additives to promote the cross-linking reaction of the cross-linking polymer contained in the cross-linked film-forming composition in the present invention may, for example, be a polymerization initiator or polymerization accelerator such as an alkylphenone compound, an acylphosphine oxide compound, a metallocene compound, an oxime ester compound, an azo compound or an onium salt, and a photosensitizer such as a condensed polycyclic hydrocarbon, a porphyrin compound or a diaryl ketone compound. One of these compounds may be used alone, or two or more of them may be used in combination.

Further, as an electron accepting compound to be contained in the cross-linked film-forming composition in the present invention, one or more types disclosed in the after-described section of (Electron accepting compound) under [Hole-injection layer] in <Organic electroluminescent element> may be used.

Further, the cross-linked film-forming composition in the present invention may further contain various additives such as coating property-improving agents such as a leveling agent, a defoaming agent, etc. Further, it may contain a light-emitting low molecular compound and/or a charge-transporting low molecular compound contained in the after-described mixed layer.

[Method for Forming Cross-Linked Film]

The cross-linked film in the present invention is obtained in such a manner that the above-mentioned cross-linked film-forming composition is formed into a film and then the cross-linking polymer is cross-linked to form a cross-linked film.

(1. Film-Forming Method)

The cross-linked film-forming composition is formed into a film on a substrate or another layer by a wet film-forming method.

In the present invention, the wet film-forming method is a method for forming a film in a wet system, such as a spin coating method, a dip coating method, a die coating method, a bar coating method, a blade coating method, a roll coating method, a spray coating method, a capillary coating method, a nozzle printing method, an inkjet method, a screen printing method, a gravure printing method or a flexo printing method. Among such film-forming methods, a spin coating method, a spray coating method, a nozzle printing method or an inkjet method is preferred, since such a method is suitable for the liquid property specific to a wet film-forming composition to be used for the organic electroluminescent element.

In a case where wet film-forming method is to be employed, a cross-linking polymer and other components which may be used as the case requires (such as an additive to promote the cross-linking reaction, an agent to improve the wet film-forming property, etc.) are dissolved in a suitable solvent to prepare the above cross-linked film-forming composition. This composition is formed into a film on a substrate or another layer by the above-mentioned film-forming method.

After the film formation, the film may be subjected to heat drying or reduced pressure drying.

(2. Cross-Linking Method)

After the coating as described above, by heating and/or irradiation with active energy rays, the cross-linking polymer undergoes a cross-linking reaction, whereby a cross-linked film can be obtained.

In a case where the cross-linking method is carried out by heating, the heating method is not particularly limited, but as a heating condition, the formed film is heated usually at a temperature of at least 120° C. and preferably at most 400° C. The heating time is usually at least 1 minute and preferably at most 24 hours.

Further, the heating means is not particularly limited, but a means of placing the substrate having the film formed thereon or the laminate on a hotplate, or heating it in an oven may be used. For example, it is possible to employ conditions such that it is heated on a hotplate at a temperature of at least 120° C. for at least 1 minute.

In a case where the cross-linking method is carried out by irradiation with active energy rays, a method of using an ultraviolet, visible light or infrared light source such as an ultrahigh pressure mercury lamp, a high pressure mercury lamp, a halogen lamp or an infrared lamp for direct irradiation, or a method of using a mask aligner or conveyer light irradiation apparatus having such a light source built-in for irradiation may be mentioned. Further, a method of using an apparatus to irradiate microwaves generated by e.g. a magnetron, i.e. a so-called microwave for irradiation may be mentioned. The irradiation time is preferably adjusted to set the condition required to lower the melting property of the film, and it is usually at least 0.1 second and preferably at most 10 hours.

The heating and/or irradiation with active energy rays may be carried out alone or in combination. In the case of combination, the order of heating and irradiation is not particularly limited.

The heating and/or irradiation with active energy rays is preferably carried out in an atmosphere containing no water, such as in a nitrogen gas atmosphere, in order to reduce the amount of water contained in the layer after the operation and/or water to be adsorbed on the surface of the layer. For the same purpose, in a case where the heating and/or irradiation with active energy rays are carried out in combination, it is particularly preferred to carry out at least the step immediately before formation of the upper layer in an atmosphere containing no water, such as in a nitrogen gas atmosphere.

The thickness of the cross-linked film in the present invention thus formed, is usually at least 3 nm, preferably at least 5 nm, more preferably at least 10 nm, and usually at most 100 nm, preferably at most 80 nm, more preferably at most 50 nm.

[Dissociating Polymer]

The polymer in the present invention preferably has dissociating groups as the insolubilizing groups, since it will be excellent in the charge transporting ability after the insolubilization (after the dissociation reaction).

That is, the insolubilizing polymer of the present invention is preferably a polymer having dissociating groups (which may be hereinafter referred to as a "dissociating polymer").

In the present invention, the dissociating polymer is a polymer having at least one dissociating group. Here, the polymer may be of a structure having repeating units, and it may have repeating units of two or more different types.

In the present invention, the dissociating polymer is a polymer having repeating units of one or more types, and has at least a partial structure suitable for charge transportation (charge transporting moiety).

In the present invention, the dissociating polymer is soluble in toluene at room temperature in an amount of usually at least 0.1 wt %. The solubility of the polymer in toluene is preferably at least 0.5 wt %, more preferably at least 1 wt %.

(Dissociating Group)

The dissociating group is a group showing solubility in a solvent and represents a group which undergoes thermal dissociation at a temperature of at least 70° C. from the group (e.g. a hydrocarbon ring) to which it is bonded.

Further, by the dissociation of the dissociating group, the solubility of the polymer in a solvent decreases.

However, the dissociating group excludes e.g. a group which dissociates by e.g. a reaction wherein another atom is bonded after the dissociation, for example, by a hydrolytic reaction. The group which dissociates by hydrolysis may, for example, be the after-described eliminable protecting group.

Such a dissociating group is preferably bonded to a hydrocarbon ring, and such a hydrocarbon ring is preferably condensed with an aromatic hydrocarbon ring having no polar group, and it is more preferably a group which undergoes thermal dissociation by a reverse Diels-Alder reaction.

Further, the temperature for thermal dissociation is preferably at least 100° C., more preferably at least 120° C. and preferably at most 300° C., more preferably at most 240° C.

Within the above range, preparation of the polymer is easy, and a problem such as decomposition of the compound during the film formation is less likely to occur.

Further, particularly, a group having a steric structure to suppress intermolecular stacking is preferred, whereby the solubility will be excellent. Examples of the reaction wherein the dissociating group is dissociated from a compound are shown below.

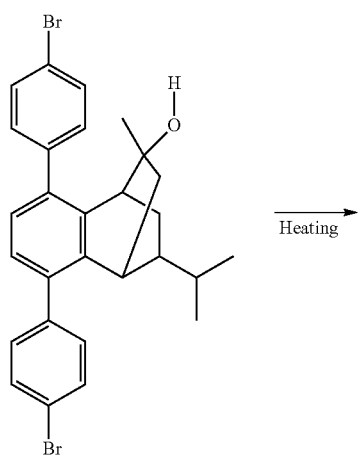

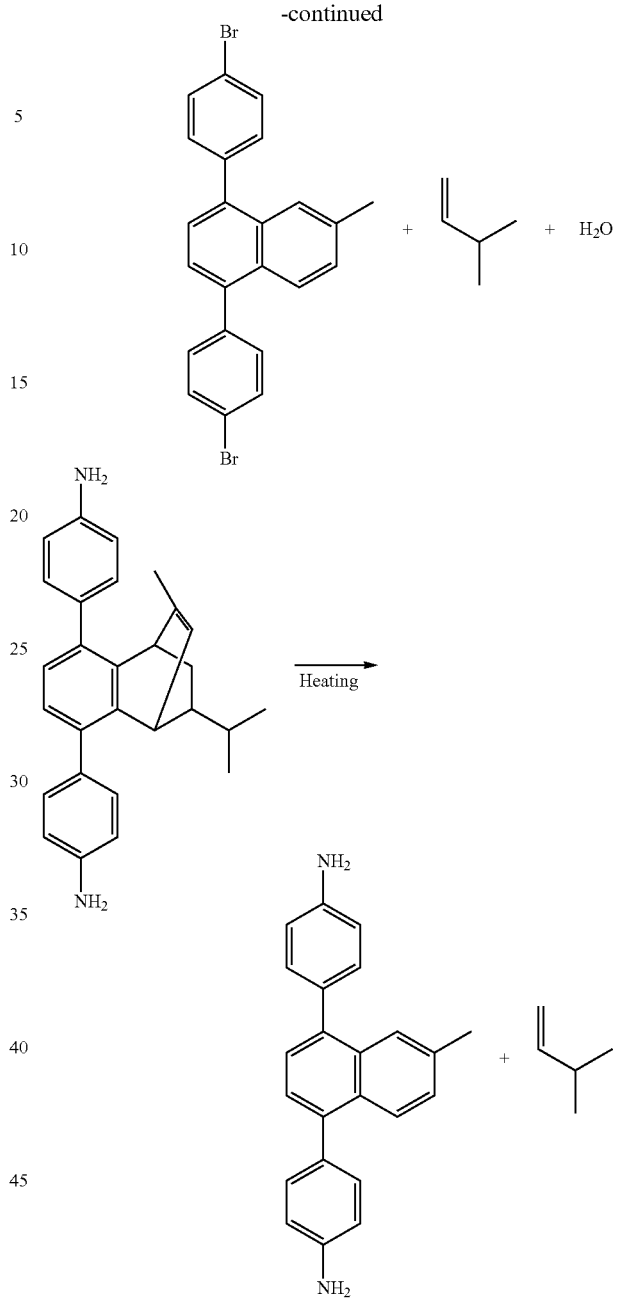

Here, in the above reaction formula, the dissociating group is a portion defined by a circle in the following structure.

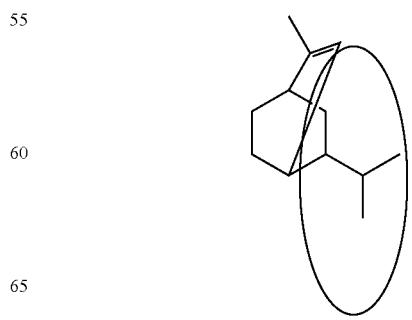

Examples of such dissociation of dissociating groups may, for example, be de-sulfinylacetamide (see J. Am. Chem. Soc., V124, No. 30, 2002, 8813), de-olefine, dealcoholization and dealkylation (see H. Kwart and K. King, Department of Chemistry, University of Delaware, Nework, Del. 19771, p 415-447 (1967), O. Diels and K. Alder, Ber., 62, 554 (1929) and M. C. Kloetzel, Org. Reactions, 4, 6 (1948)), de-1,3-dioxole (see N. D. Field, J. Am. Chem. Soc., 83, 3504 (1961)), de-diene (see R. Huisgen, M. Seidel, G. Wallbillich, and H. Knupfer, Tetrahedron, 17, 3 (1962)), de-isoxazole (see R. Huisgen and M. Christi, Angew. Chem. Intern. Ed. Engl., 5, 456 (1967)), de-triazole (see R. Kreher and J. Seubert, Z. Naturforach., 20B, 75 (1965)), etc.

In the present invention, it is particularly preferred that the hydrocarbon ring to which the dissociating group is bonded is a ring containing an etheno group or an ethano group, whereby the dissociating group is stable, and the synthesis is easy.

Such a dissociating group is capable of preventing intermolecular stacking by virtue of its bulky molecular structure before the heat treatment, or making the polymer have good solubility in an organic coating solvent. Further, as the dissociating group dissociates from the polymer by heat treatment, the solubility of the compound in a solvent after the heating can be remarkably suppressed, and it is possible to impart an organic solvent-resistant coating property to the organic layer containing such a compound. Accordingly, it becomes easy to further form an organic thin film by a wet film-forming method as laminated on the organic layer formed by using the polymer of the present invention.

Specific examples of the group containing a dissociating group are as follows, but it should be understood that the present invention is by no means limited thereto.

Specific examples in a case where the group containing a dissociating group is a bivalent group are as shown in the following <Group A of groups containing bivalent dissociating group>.

<Group A of Groups Containing Bivalent Dissociating Group>

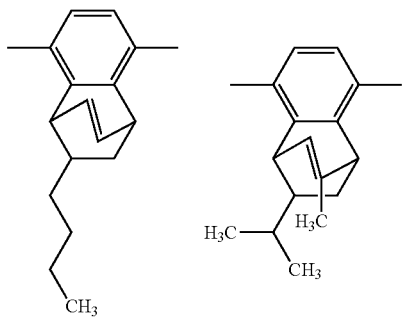

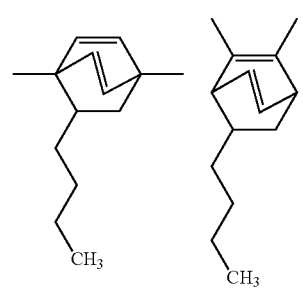

Specific examples in a case where the dissociating group is a monovalent group are as shown in the following <Group B of groups containing monovalent dissociating group>.

<Group B of Groups Containing Monovalent Dissociating Group>

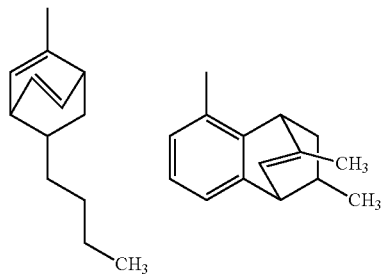

[Arrangement, Proportions, Etc. of Repeating Units]

The dissociating polymer is not particularly limited with respect to the structure of e.g. its repeating units, so long as it has dissociating groups in its structure. However, it preferably has an aromatic ring in its repeating unit, and the above dissociating group is preferably bonded to a hydrocarbon ring bonded to such an aromatic ring.

Among them, it is preferably a dissociating polymer containing repeating units having a partial structure wherein a dissociating group containing an etheno group or an ethano group is bonded, whereby the film-forming property is excellent.

Here, the etheno group or the ethano group is preferably contained in a hydrocarbon ring, and the hydrocarbon ring is further preferably a 6-membered ring.

The dissociating polymer in the present invention preferably contains repeating units represented by the following chemical formula (U3) or (U4), as repeating units having a partial structure wherein the dissociating group is bonded. In such a case, the content of the repeating units (U3) or (U4) in the polymer chain is preferably at least 10 mol %, more preferably at least 30 mol %.

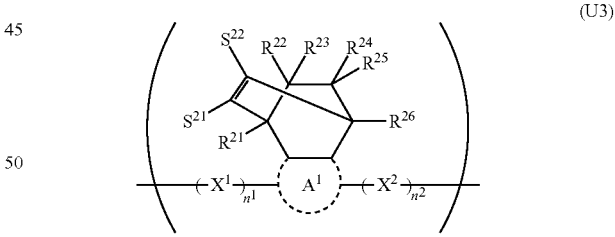
(U3)

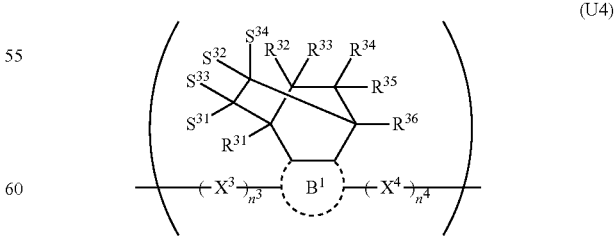
(U4)

(in the formula (U3), ring $A^1$ represents an aromatic ring. Such an aromatic ring may have substituents. Further, such substituents may be bonded to each other directly or via a bivalent linking group to form a ring.

Each of $S^{21}$, $S^{22}$ and $R^{21}$ to $R^{26}$ which are independent of one another, is a hydrogen atom, a hydroxy group, an alkyl group which may have a substituent, an aromatic hydrocarbon group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.

Each of $X^1$ and $X^2$ which are independent of each other, is a $C_{6-50}$ bivalent aromatic hydrocarbon ring group which may have a substituent, or a $C_{6-50}$ bivalent aromatic heterocyclic group which may have a substituent.

In the formula (U4), ring $B^1$ represents an aromatic ring. Such an aromatic ring may have substituents. Further, such substituents may be bonded to each other directly or via a bivalent linking group to form a ring.

Each of $S^{31}$ to $S^{34}$, $R^{31}$ to $R^{36}$, $X^3$ and $X^4$ which are independent of one another, is the same as the one exemplified above as $S^{21}$, $S^{22}$, $R^{21}$ to $R^{26}$, $X^3$, and $X^4$.

Each of $n^1$ to $n^4$ which are independent of one another, is an integer of from 0 to 5.)

In the chemical formulae (U3) and (U4), each of rings $A^1$ and $B^1$ represents an organic ring to which a dissociating group is bonded, and it may be an aromatic hydrocarbon ring or an aromatic heterocyclic ring. Among them, it is preferably an aromatic hydrocarbon ring, since the electrochemical stability will be excellent, and the charge will be less likely to be localized. Further, such an aromatic ring may have substituents. Further, such substituents may be bonded to each other directly or via a bivalent linking group to form a ring.

In a case where each of rings $A^1$ and $B^1$ is an aromatic hydrocarbon ring, the number of carbon atoms in the nucleus of such an aromatic hydrocarbon ring is usually at least 6, and usually at most 40, preferably at most 30, more preferably at most 20. Further, when each of rings $A^1$ and $B^1$ is an aromatic heterocyclic ring, the number of carbon atoms in the nucleus of such an aromatic heterocyclic ring is usually at least 3, preferably at least 4, more preferably at least 5, and usually at most 50, preferably at most 30, more preferably at most 20.

The aromatic hydrocarbon ring may, for example, be a benzene ring, a naphthalene ring, an anthracene ring, a phenanthrene ring, a perylene ring, a tetracene ring, a pyrene ring, a benzopyrene ring, a chrysene ring, a benzochrysene ring, a triphenylene ring, a fluoranthene ring or a fluorene ring.

Among them, it is preferred that each of rings $A^1$ and $B^1$ which are independent of each other, is selected from the group consisting of a benzene ring, a naphthalene ring, an anthracene ring and a tetracene ring.

Whereas, the aromatic heterocyclic ring may, for example, be a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a flopyrrole ring, a flofuran ring, a thienofuran ring, a benzisoxazole ring, a benzoisothiazole ring, a benzimidazole ring, a pyridine ring, a pyrazine ring, a pyridazine ring, a pyrimidine ring, a quinoline ring, an isoquinoline ring, a quinoxaline ring, a perimidine ring, a quinazoline ring or a quinazolinone ring.

Further, in the chemical formulae (U3) and (U4), rings $A^1$ and $B^2$ may have a structure wherein from 1 to 10 cyclic structural units of the same type or different types may be linked to one another directly or via at least one bivalent linking group selected from a nitrogen atom, a sulfur atom, a chain group having a total number of carbon atoms of from 1 to 20 which may contain a hetero atom, and an aliphatic group having a number of carbon atoms of from 1 to 20. Here, the cyclic structural units to be linked may be the same as the above-mentioned aromatic hydrocarbon rings or aromatic heterocyclic rings, or different aromatic hydrocarbon rings or aromatic heterocyclic rings. Further, such aromatic hydrocarbon rings and aromatic heterocyclic rings may have substituents.

The substituent on ring $A^1$ or $B^2$ may, for example, be a $C_{1-10}$ linear or branched alkyl group such as a methyl group, an ethyl group, a n-propyl group, a 2-propyl group, a n-butyl group, an isobutyl group or a tert-butyl group; a $C_{1-8}$ alkenyl group such as a vinyl group, an allyl group or a 1-butenyl group; a $C_{1-8}$ alkynyl group such as an ethynyl group or a propargyl group; a $C_{2-8}$ aralkyl group such as a benzyl group; an arylamino group such as a phenylamino group, a diphenylamino group or a ditolylamino group; a heteroarylamino group such as a pyridylamino group, a thienylamino group or a dithienylamino group; an acylamino group such as an acetylamino group or a benzoylamino group; a $C_{1-8}$ alkoxy group such as a methoxy group, an ethoxy group or a butoxy group; a $C_{1-15}$ acyloxyl group such as an acryloyloxyl group, a methylcarbonyloxyl group, an ethylcarbonyloxyl group, a hydroxycarbonylmethylcarbonyloxyl group, a hydroxycarbonylethylcarbonyloxyl group or a hydroxyphenylcarbonyloxyl group; or a $C_{10-20}$ aryloxyl group such as a phenyloxy group, a 1-naphthyloxy group or a 2-naphthyloxy group. These substituents may be bonded to one another directly or via a bivalent linking group such as —O—, —S—, >CO, >SO$_2$, —(C$_x$H$_{2x}$)—, —O—(C$_y$H$_{2y}$)—, a substituted or unsubstituted C$_{2-20}$ alkylidene group, or a C$_{2-20}$ alkylene group which may have a substituent, to form a cyclic structure. Each of x and y which are independent of each other is an integer of from 1 to 20.

One or more such substituents of one or more types may be substituted on ring $A^1$ or $B^1$ in an optional combination.

In the above chemical formulae (U3) and (U4), each of $S^{21}$, $S^{22}$, $R^{21}$ to $R^{26}$, $S^{31}$ to $S^{34}$ and $R^{31}$ to $R^{36}$ which are independent of one another, is a hydrogen atom; a linear or branched alkyl group having usually from 1 to 50, preferably at most 10, carbon atoms, which may have a substituent, such as a methyl group, an ethyl group, a n-propyl group, a 2-propyl group, a n-butyl group, an isobutyl group or a tert-butyl group; an aromatic hydrocarbon ring group having usually from 5 to 50 carbon atoms in the nucleus which may have a substituent; an aromatic heterocyclic ring group having from 5 to 40 carbon atoms in the nucleus which may have a substituent; an aralkyl group having usually at least 6, preferably at least 7 and usually at most 50, preferably at most 8, carbon atoms in the nucleus which may have a substituent, such as a benzyl group; an alkoxy group having usually at least 1 and usually at most 50, preferably at most 8, carbon atoms which may have a substituent, such as a methoxy group, an ethoxy group or a butoxy group; an aryloxy group having usually at least 5, preferably at least 6 and usually at most 50, preferably at most 15, carbon atoms in the nucleus, which may have a substituent, such as a phenyloxy group, a 1-naphthyloxy group or a 2-naphthyloxy group; an acyl group having usually at least 2 and at most 50 carbon atoms in the nucleus which may have a substituent; an alkenyl group having usually from 1 to 8 carbon atoms which may have a substituent, such as a vinyl group, an allyl group or a 1-butenyl group; an alkynyl group having usually from 1 to 8 carbon atoms which may have a substituent, such as an ethynyl group or a propargyl group; an acyloxy group having usually at least 2 and usually at most 50, preferably at most 15, carbon atoms in the nucleus which may have a substituent, such as an acryloyloxyl group, a methylcarbonyloxyl group, an ethylcarbonyloxyl group, a hydroxycarbonylmethylcarbonyloxyl group, a hydroxycarbonylethylcarbonyloxyl group or a hydroxyphenylcarbonyloxyl group; an arylamino group having usually from 6 to 50 carbon atoms in the nucleus which may have a substituent, such as a phenylamino group, a diphenylamino group or a ditolylamino group; a heteroarylamino group having usually from 5 to 50 carbon atoms in the nucleus which may have a substituent, such as a pyridylamino group, a thienylamino group or a dithienylamino group; or an acylamino group having usually from 2 to 50 carbon atoms which may have a substituent, such as an acetylamino group or a benzoylamino group.

The dissociating polymer of the present invention preferably contains repeating units represented by the above formula (2).

(Proportion of Heat Dissociating Soluble Groups)

The dissociating groups may be contained in a portion other than the repeating units of the above dissociating polymer. The number of dissociating groups contained in one polymer chain of the dissociating polymer is preferably at least 5 on average, more preferably at least 10 on average, further preferably at least 50 on average.

Within the above range, the decrease of the solubility of the dissociated film in an organic solvent will be sufficient, and the mixed layer can easily be formed, such being desirable.

(Molecular Weight of Dissociating Polymer)

The weight average molecular weight of the dissociating polymer is usually at most 3,000,000, preferably at most 1,000,000, more preferably at most 500,000 and usually at least 1,000, preferably at least 2,500, more preferably at least 5,000.

Further, the number average molecular weight is usually at most 2,500,000, preferably at most 750,000, more preferably at most 400,000, and usually at least 500, preferably at least 1,500, more preferably at least 3,000.

Within the above range, the film-forming property of the composition containing such a dissociating polymer is good, and the glass transition temperature, melting point and vaporization temperature of the dissociating polymer are high, whereby the heat resistance is good.

Specific Examples

Now, preferred specific examples of the dissociating polymer in the present invention will be presented, but the present invention is by no means limited thereto.

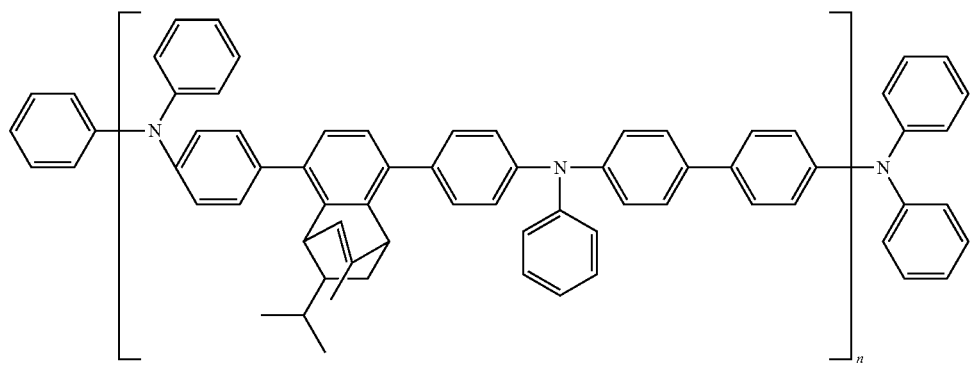

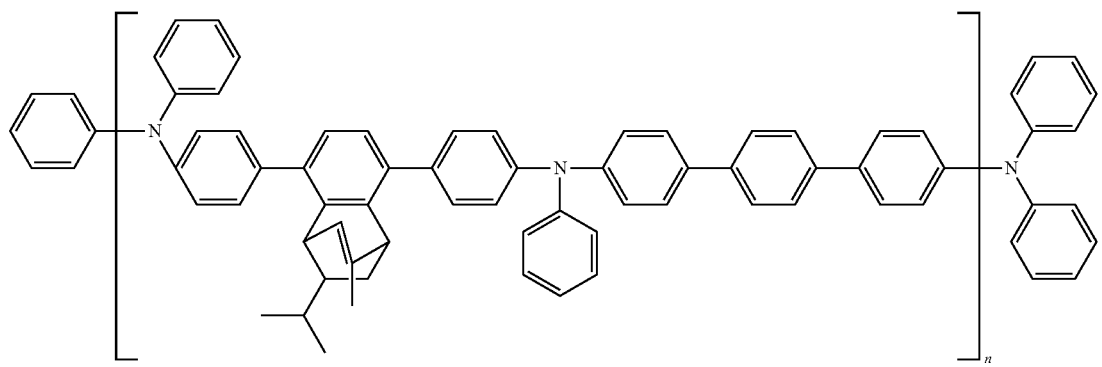

-continued
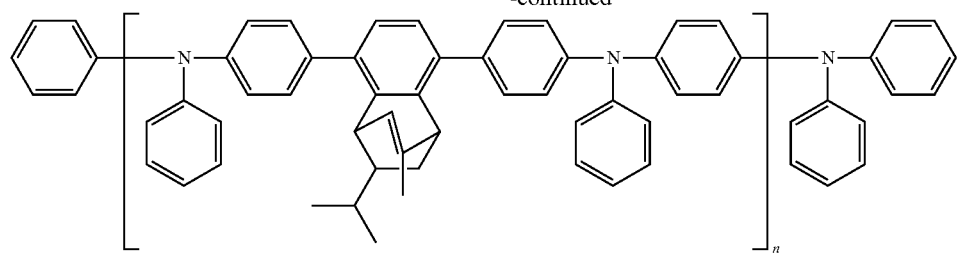
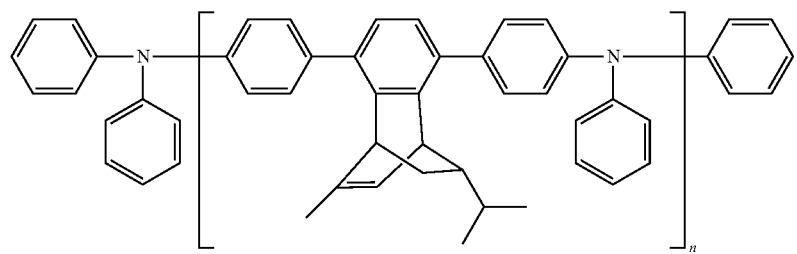
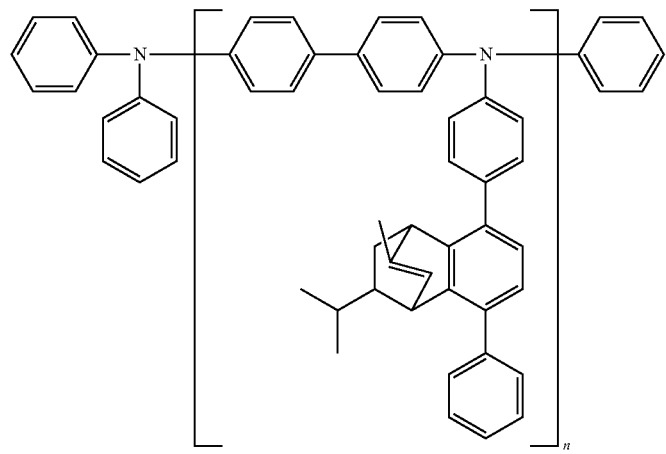
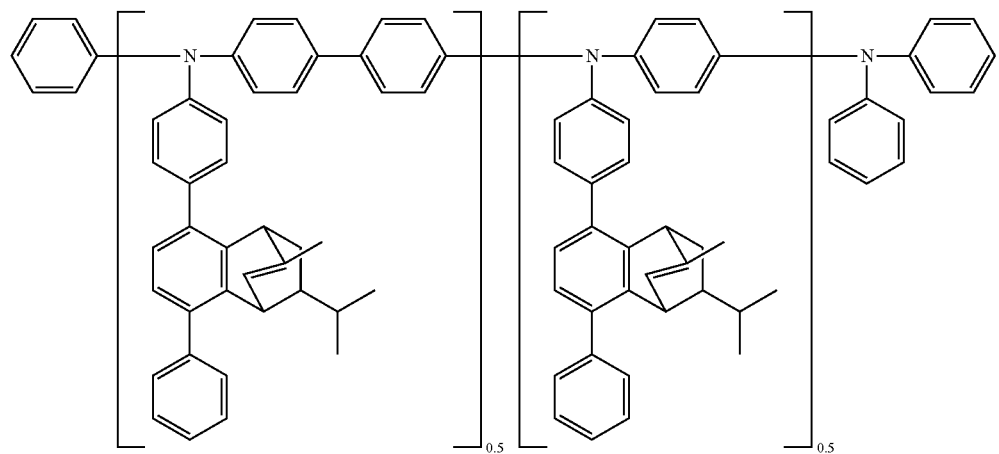

-continued

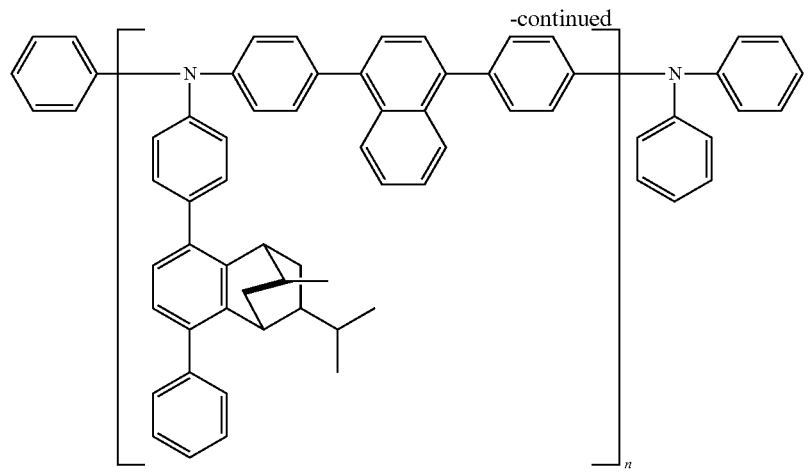

In the above formulae, n is an optional integer.

[Dissociated Film-Forming Composition]

A dissociated film is usually formed by using a dissociated film-forming composition.

In the present invention, the dissociated film-forming composition contains at least one type of the above dissociating polymer. Further, the dissociating polymer contained in the dissociated film-forming composition may contain any one type alone or different two or more types in an optional ratio and combination.

Ones other than the dissociating polymer contained in the dissociated film-forming composition are the same as those disclosed in the above section for [Cross-linked film-forming composition]. Preferred embodiments are also the same.

[Method for Forming Dissociated Film]

The method for forming a dissociated film is the same as the one disclosed in the above section for [Method for forming cross-linked film]. Preferred embodiments are also the same.

[Eliminating Polymer]

The polymer in the present invention preferably has eliminable protecting groups as insolubilizing groups, whereby the protecting groups can be eliminated by heat treatment to change the molecular structure, so that the solubility in an organic solvent can be changed.

That is, the insolubilizing polymer of the present invention is preferably a polymer having eliminable protecting groups (which may be hereinafter referred to as an "eliminating polymer").

In the present invention, the eliminating polymer is a polymer having at least one eliminable protecting group. Here, the polymer may be of a structure having repeating units, and it may have different two or more repeating units.

In the present invention, the dissociating polymer is a polymer having repeating units of one or more types and has at least a partial structure (charge transporting moiety) suitable for charge transportation.

(Eliminable Protecting Group)

In the present invention, the eliminable protecting group is a group having a low activity which can be replaced by a hydrogen atom of a highly active group by heating and which further shows a solubility in a solvent. While a heat dissociating group merely dissociates by heat, the eliminable protecting group is different in that it is replaced by H derived from (mainly) water by heat.

A material having an amino group is widely used as a hole injecting or transporting material for an organic EL element, and as a protecting group for such an amino group, a t-butoxycarbonyl group, a benzoyl group, a benzylcarbonyl group, an allyloxycarbonyl group or a methoxymethyl group may, for example, be mentioned.

(Proportion of Eliminable Protecting Groups)

The eliminable protecting groups may be contained in a portion other than the repeating units of an eliminating polymer. The number of eliminable protecting groups contained in one polymer chain of an eliminating polymer is preferably at least 5 on average, more preferably at least 10 on average, further preferably at least 50 on average.

Within the above range, insolubilization of the eliminated film will be sufficient, and the mixed layer can easily be formed, such being desirable.

Specific Examples

Now, preferred specific examples of the eliminating polymer in the present invention will be presented, but the present invention is by no means limited thereto.

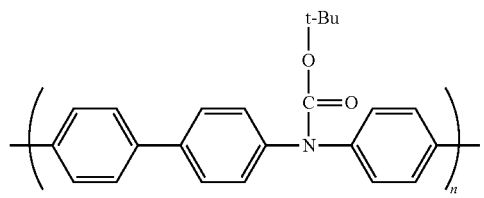

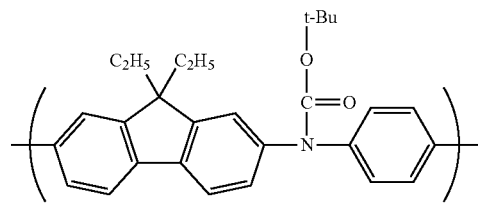

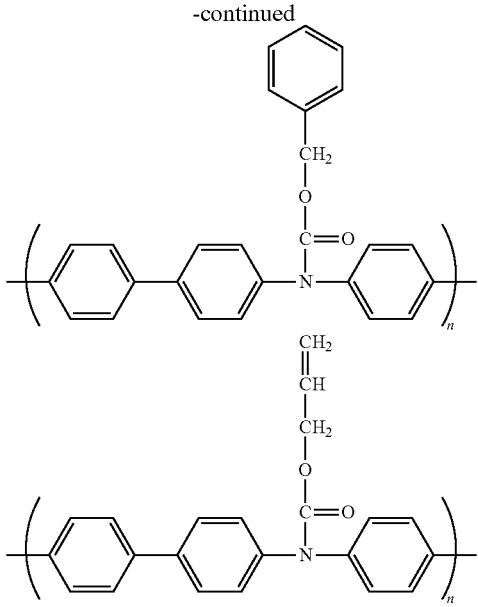

In the above formulae, n is an optional integer.

[Eliminated Film-Forming Composition]

An eliminated film is usually formed by using an eliminated film-forming composition.

In the present invention, the eliminated film-forming composition contains at least one type of the above eliminating polymer. Further, the eliminating polymer contained in the eliminated film-forming composition may contain any one type alone or different two or more types in an optional ratio and combination.

Ones other than the eliminating polymer contained in the eliminated film-forming composition are the same as those disclosed in the above section for [Cross-linked film-forming composition]. Preferred embodiments are also the same.

[Method for Forming Eliminated Film]

The method for forming the eliminated film is the same as the one disclosed in the above section for [Method for forming cross-linked film]. Preferred embodiments are also the same.

[Light-Emitting Low Molecular Compound]

The light-emitting low molecular compound is not particularly limited so long as it is a compound defined by a single molecular weight and having a light-emitting property, and a known material may be used. For example, it may be a fluorescence-emitting low molecular compound or a phosphorescence-emitting low molecular compound, but from the viewpoint of the internal quantum efficiency, preferred is a phosphorescence-emitting low molecular compound.

Further, for the purpose of improving the solubility in a solvent, it is preferred to lower the rigidity or symmetry of the molecule of the light-emitting low molecular compound, or to introduce a lipophilic substituent such as an alkyl group.

Now, among the light-emitting low molecular compounds, examples of the fluorescence-emitting low molecular compound will be mentioned, but it should be understood that the fluorescence-emitting low molecular compound is not limited to the following exemplified ones.

As fluorescence-emitting low molecular compounds presenting blue emission (blue fluorescence-emitting low molecular compounds), naphthalene, perylene, pyrene, anthracene, coumarin, chrysene, p-bis(2-phenylethenyl)benzene and their derivatives may, for example, be mentioned.

As fluorescence-emitting low molecular compounds presenting green emission (green fluorescence-emitting low molecular compounds), a quinacridone derivative, a coumarin derivative, and an aluminum complex such as $Al(C_9H_6NO)_3$ may, for example, be mentioned.

As fluorescence-emitting low molecular compounds presenting yellow emission (yellow fluorescence-emitting low molecular compounds), rubrene and perimidone derivatives may, for example, be mentioned.

As fluorescence-emitting low molecular compounds presenting red emission (red fluorescence-emitting low molecular compounds), a DCM (4-(dicyanomethylene)-2-methyl-6-(p-dimethylaminostyryl)-4H-pyran) compound, a benzopyran derivative, a rhodamine derivative, a benzothioxanthen derivative and an azabenzothioxanthen may, for example, be mentioned.

The phosphorescence-emitting low molecular compound may, for example, be an organic metal complex containing a metal selected from Groups 7 to 11 of Long Form of the Periodic Table (hereinafter, "Periodic Table" means "Long Form of the Periodic Table" unless otherwise specified).

As the metal selected from Groups 7 to 11 of the Periodic Table, preferably, ruthenium, rhodium, palladium, silver, rhenium, osmium, iridium, platinum or gold may, for example, be mentioned.

The ligand of the complex is preferably a ligand wherein a (hetero)aryl group is linked to e.g. pyridine, pyrazole or phenanthroline, such as a (hetero)aryl pyridine ligand or a (hetero)aryl pyrazole ligand, particularly preferably a phenylpyridine ligand or a phenylpyrazole ligand. Here, "(hetero)aryl" represents an aryl group or a heteroaryl group.

Specifically, a phosphorescence-emitting low molecular compound may, for example, be tris(2-phenylpyridine) iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethyl platinum porphyrin, octaphenyl platinum porphyrin, octaethyl palladium porphyrin or octaphenyl palladium porphyrin.

The molecular weight of the compound to be used as the light-emitting low molecular compound is optional so long as it does not substantially impair the effects of the present invention, but it is usually at most 10,000, preferably at most 5,000, more preferably at most 4,000, further preferably at most 3,000 and usually at least 100, preferably at least 200, more preferably at least 300, further preferably at least 400. If the molecular weight of the light-emitting low molecular compound is too small, the heat resistance may substantially be lowered, gas generation is likely to be caused, the film quality when formed into a film is likely to deteriorate, or a change in morphology of the organic electroluminescent element is likely to occur due to e.g. migration. On the other hand, if the molecular weight of the light-emitting low molecular compound is too large, purification of the light-emitting low molecular compound tends to be difficult, or it tends to take time at the time of dissolving it in a solvent.

Further, among the above-described light-emitting low molecular compounds, any one type may be used alone, or two or more types may be used in an optional combination and ratio.

[Charge Transporting Low Molecular Compound]

In the present invention, the charge transporting low molecular compound is a compound having a charge transporting property such as a hole transporting property or an electron transporting property and is a compound defined by a single molecular weight.

In the present invention, among the charge transporting low molecular compounds, one type may be used alone, or two or more types may be used in an optional combination and ratio.

In the light-emitting layer, it is preferred to use the light-emitting low molecular compound as a dopant material and the charge transporting low molecular compound as a host material.

The charge transporting low molecular compound may be a compound which is commonly used in a light-emitting layer of an organic electroluminescent element, and it is particularly preferably a compound which is used as a host material in a light-emitting layer.

Specifically, the charge transporting low molecular compound may, for example, be an aromatic amine compound, a phthalocyanine compound, a porphyrin compound, an oligothiophene compound, a polythiophene compound, a benzylphenyl compound, a compound having a tertiary amine linked with a fluorene group, a hydrazone compound, a silazane compound, a silanamine compound, a phosphamine compound, a quinacridone compound, an anthracene compound, a pyrene compound, a carbazole compound, a pyridine compound, a phenanthroline compound, an oxadiazole compound or a silole compound.

For example, it may be an aromatic diamine containing at least two tertiary amines and having at least two condensed aromatic rings substituted on a nitrogen atom as represented by 4,4'-bis[N-(1-naphthyl)-N-phenylamino]biphenyl (JP-A-5-234681), an aromatic amine compound having a star burst structure such as 4,4',4''-tris(1-naphthylphenylamino)triphenylamine (J. Lumin., vol. 72-74, p. 985, 1997), an aromatic amine compound made of a tetramer of triphenylamine (Chem. Commun., p. 2175, 1996), a fluorene compound such as 2,2',7,7'-tetrakis(diphenylamino)-9,9'-spirobifluorene (Synth. Metals, vol. 91, p. 209, 1997), a carbazole compound such as 4,4'-N,N'-dicarbazolebiphenyl, an oxadiazole compound such as 2-(4-biphenylyl)-5-(p-tert-butylphenyl)-1,3,4-oxadiazole (tBu-PBD) or 2,5-bis(1-naphthyl)-1,3,4-oxadiazole (BND), a silole compound such as 2,5-bis(6'-(2',2''-bipyridyl))-1,1-dimethyl-3,4-diphenylsilole (PyPySPyPy) or a phenanthroline compound such as bathophenanthroline (BPhen) or 2,9-dimethyl-4,7-diphenyl-1,10-phenanthroline (BCP, bathocuproin).

[Mixed Layer]

The organic electroluminescent element of the present invention has a mixed layer containing a light-emitting low molecular compound and/or charge-transporting low molecular compound in an insolubilized film.

The mixed layer may, for example, be formed by forming an insolubilized film and then applying on such a film a composition comprising the light-emitting low molecular compound, the charge-transporting low molecular compound and a solvent (a composition for light-emitting layer described in detail hereinafter) by a wet film-forming method, whereby the light-emitting low molecular compound and the charge-transporting low molecular compound are swelled and infiltrated into the formed insolubilized film to form a mixed layer.

When formed in such a manner, the entire insolubilized film may be the mixed layer in the present invention, or only a partial region close to the interface with the light-emitting layer may be the mixed layer, and a region remote from the interface may be the insolubilized layer.

Otherwise, the mixed layer may be formed by incorporating the light-emitting low molecular compound and the charge-transporting low molecular compound to the above insolubilized film-forming composition, followed by forming a film in the same manner as the above insolubilized film to form a mixed layer containing the light-emitting low molecular compound and/or charge-transporting low molecular compound in the insolubilized film.

When formed in such a manner, the entire insolubilized film usually becomes the mixed layer in the present invention.

In such a case, the insolubilized film composition contains the light-emitting low molecular compound in an amount of usually at least 0.05 wt %, preferably at least 0.1 wt %, more preferably at least 0.5 wt % and usually at most 20 wt %, preferably at most 15 wt %, further preferably at most 10 wt %.

Likewise, it contains the charge-transporting low molecular compound in an amount of usually at least 0.1 wt %, preferably at least 0.5 wt %, more preferably at least 1 wt %, and usually at most 50 wt %, preferably at most 40 wt %, further preferably at most 20 wt %.

Further, in the composition for light-emitting layer, the content (wt %) ratio of the light-emitting low molecular compound to the charge-transporting low molecular compound (i.e. light-emitting low molecular compound/charge-transporting low molecular compound) is usually at least 0.001, preferably at least 0.01 and usually at most 0.5, preferably at most 0.2.

Further, it is preferred that the charge-transporting low molecular compound is contained in the mixed layer, so that handing over of an electric charge between the insolubilized polymer and the charge-transporting low molecular compound is facilitated to improve the current efficiency or lowering of the driving voltage.

Further, by adopting the construction of the present invention, transportation of the charge, injection of the charge into the adjacent layer and functional separation from light emission are highly facilitated. As a result, the organic electroluminescent element of the present invention has a high luminescent efficiency.

[Light-Emitting Layer]

In the present invention, the light-emitting layer represents a layer which is adjacent to the mixed layer and which contains a light-emitting low molecular compound and a charge-transporting low molecular compound and does not contain an insolubilized polymer.

The light-emitting layer may be formed by forming a film by using a composition (a composition for light-emitting layer) comprising a light-emitting low molecular compound, a charge-transporting low molecular compound and a solvent, or may be formed into a film by vapor-depositing a light-emitting low molecular compound and a charge-transporting low molecular compound.

As described above, formation of the light-emitting layer is preferably made by using the composition for light-emitting layer in that the mixed layer can be formed by directly applying the composition for light-emitting layer on an insolubilized film.

As the light-emitting low molecular compound and the charge-transporting low molecular compound, the compounds disclosed in the above sections for [Light-emitting low molecular compound] and [Charge-transporting low molecular compound], respectively.

Further, the solvent is not particularly limited so long as it is a solvent wherein the light-emitting low molecular compound and the charge-transporting low molecular compound are well dissolved.

The dissolving power of the solvent is preferably such that it is capable of dissolving the light-emitting low molecular compound and the charge-transporting low molecular compound, respectively, in an amount of usually at least 0.01 wt %, preferably at least 0.05 wt %, more preferably at least 0.1 wt %, at room temperature under atmospheric pressure.

Now, specific examples of the solvent will be given below, but the present invention is by no means limited to such specific examples so long as the effects of the present invention are not impaired.

It may, for example, be an alkane such as n-decane, cyclohexane, ethylcyclohexane, decalin or bicyclohexane; an aromatic hydrocarbon such as toluene, xylene, mesitylene, cyclohexylbenzene or tetralin; a halogenated aromatic hydrocarbon such as chlorobenzene, dichlorobenzene or trichlorobenzene; an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole or diphenyl ether; an aromatic ester such as phenyl acetate, phenyl propionate, methyl benzoate, ethyl benzoate, propyl benzoate or n-butyl benzoate; an alicyclic ketone such as cyclohexanone, cyclooctanone or fenchone; an alicyclic alcohol such as cyclohexanol or cyclooctanol; an aliphatic ketone such as methyl ethyl ketone or dibutyl ketone; an aliphatic alcohol such as butanol or hexanol; or an aliphatic ether such as ethylene glycol dimethyl ether, ethylene glycol diethyl ether, propylene glycol-1-monomethyl ether acetate (PGMEA).

Among them, preferred is an alkane or an aromatic hydrocarbon. Among these solvents, one type may be used alone, or two or more types may be used in an optional combination and ratio.

Further, in order to obtain a uniform film, it is preferred that from the liquid film immediately after the film formation, the solvent will evaporate at a proper rate. For this purpose, the boiling point of the solvent is usually at least 80° C., preferably at least 100° C., more preferably at least 120° C., and usually at most 270° C., preferably at most 250° C., more preferably at most 230° C.

The amount of the solvent to be used is optional so long as the effects of the present invention are not substantially impaired, but it is preferably at least 10 parts by weight, more preferably at least 50 parts by weight, particularly preferably at least 80 parts by weight, and preferably at most 99.95 parts by weight, more preferably at most 99.9 parts by weight, particularly preferably at most 99.8 parts by weight, per 100 parts by weight of the composition for light-emitting layer. If the content is lower than the lower limit, the viscosity tends to be too high, whereby the film forming operation efficiency is likely to deteriorate. On the other hand, if it exceeds the upper limit, the thickness of the film obtainable by removing the solvent after the film formation tends to be insufficient, whereby the film formation tends to be difficult. Here, in a case where two or more solvents are used as mixed for the composition for light-emitting layer, the total amount of such solvents is adjusted to be within this range.

Further, the composition for light-emitting layer in the present invention may contain various additives such as a leveling agent, a defoaming agent, etc. for the purpose of improving the film-forming properties.

The composition for light-emitting layer in the present invention contains the light-emitting low molecular compound in an amount of usually at least 0.01 wt %, preferably at least 0.05 wt %, further preferably at least 0.1 wt %, and usually at most 20 wt %, preferably at most 10 wt %, further preferably at most 5 wt %.

The composition for light-emitting layer in the present invention contains the charge-transporting low molecular compound in an amount of usually at least 0.1 wt %, preferably at least 0.5 wt %, further preferably at least 1 wt %, and usually at most 20 wt %, preferably at most 10 wt %, further preferably at most 5 wt %.

Further, in the composition for light-emitting layer, the content (wt %) ratio of the light-emitting low molecular compound to the charge-transporting low molecular compound (i.e. light-emitting low molecular compound/charge-transporting low molecular compound) is usually at least 0.01, preferably at least 0.03, and usually at most 0.5, preferably at most 0.2.

(Method for Forming Light-Emitting Layer)

In the present invention, the method for forming the light-emitting layer is preferably carried out by a wet film-forming method, since it is advantageous from an industrial viewpoint at the time of forming the mixed layer.

After applying the composition for light-emitting layer to produce a light-emitting layer, the obtained coating film is dried to remove the solvent for a light-emitting layer thereby to form a light-emitting layer. The system of the wet film-forming method is not particularly limited so long as the effects of the present invention are not substantially impaired. For example, it may be a wet film-forming method in the present invention as described in the above [Method for forming cross-linked film] (1. Film forming method), and particularly preferred are a spin coating method, a nozzle printing method and an inkjet method.

For the light-emitting layer to be present adjacent to the mixed layer, the thickness of the light-emitting layer obtained by forming the composition for light-emitting layer into a film on glass by wet film-forming, is preferably thicker than the thickness of the insolubilized film obtained by forming the insolubilized film-forming composition into a film on glass by wet film formation.

From the viewpoint of the efficiency and durability of the organic electroluminescent element, the thickness of the light-emitting layer on glass is preferably thicker by at least 10 nm than the thickness of the insolubilized film on glass.

Particularly in the case of a cross-linking polymer, if the number of cross-linking groups per a molecular weight of 10,000 of the cross-linking polymer is increased, mixing between the cross-linking polymer and the light-emitting layer is suppressed, and the light-emitting layer tends to be thick.

Accordingly, by adjusting the relation between the light-emitting layer and the cross-linked layer and the number of cross-linking groups per a molecular weight of 10,000 of the cross-linking polymer, it is possible to form the light-emitting layer adjacent to the mixed layer.

The thickness of the light-emitting layer is optional so long as the effects of the present invention are not substantially impaired, but it is usually at least 3 nm, preferably at least 5 nm, and usually at most 200 nm, preferably at most 100 nm. If the thickness of the light-emitting layer is too thin, the film is likely to have defects, and if it is too thick, the driving voltage is likely to increase.

The proportion of the light-emitting low molecular compound in the light-emitting layer is optional so long as the effects of the present invention are not substantially impaired, but it is usually at least 0.05 wt %, preferably at least 0.3 wt %, more preferably at least 0.5 wt %, and usually at most 35 wt %, preferably at most 25 wt %, more preferably at most 20 wt %. If the content of the light-emitting low molecular compound is too small, fluctuation in light emission is likely to occur, and if it is too large, the luminescent efficiency is likely to deteriorate. Further, in a case where two or more light-emitting low molecular compounds are used in combination, their total content is adjusted to be within the above range.

Further, the proportion of the charge-transporting low molecular compound in the light-emitting layer is optional so long as the effects of the present invention are not substantially impaired, but it is usually at least 0.1 wt %, preferably at least 0.5 wt %, more preferably at least 1 wt %, and usually at most 99.95 wt %, preferably at most 95 wt %, more preferably at most 90 wt %. Further, in a case where two or more charge-transporting low molecular compounds are used in combination, their total content is adjusted to be within the above range.

[Reason for the Effects of the Present Invention]

With respect to a case where in the present invention, among polymers having insolubilizing groups, the particularly preferred cross-linking polymer and the dissociating polymer are used, the reason for the effects of the present invention may be considered as follows.

(Reason for being Cross-Linked Film)

In the film formed by using a cross-linking polymer, polymer chains are fixed to one another by cross-linked bonds. Therefore, when the light-emitting composition is applied on such a cross-linked film by a wet film-forming method, the composition is uniformly swelled and infiltrated into the cross-linked film to form a uniform mixed layer.

On the other hand, in a film (a polymer film) formed by using a polymer not having an insolubilizing group such as a cross-linking group, the polymer chains are fixed only by the intermolecular mutual action, as is different from the case where the cross-linking polymer is used. Therefore, when the composition for light-emitting layer is applied on such a polymer film by a wet film-forming method, since the polymers are not fixed to one another, the composition tend to hardly swell and infiltrate into the polymer film and tend to be dissolved in the coating solvent, or the dissolved polymer is likely to be moved by a shearing force during the coating, and further, it is not easy to form a uniform mixed layer.

(Reason for being Dissociated Film)

When dissociating groups are dissociated by heat from the groups (e.g. hydrocarbon rings) to which they are bonded, the polymer as a whole will have a structure having a high planarity. Here, if the groups after dissociation of the dissociating groups have a structure containing a large amount of sp2 carbon atoms, the polymer chains in the film become energywise stabilized and fixed by π-π stacking. Therefore, when the composition for light-emitting layer is applied on such a dissociated film by a wet film-forming method, the composition is uniformly swelled and infiltrated into the dissociated film to form a uniform mixed layer.

[Method for Confirming Mixed Layer]

Confirmation of the mixed layer is carried out, for example, by the following method.

Firstly, the composition for light-emitting layer is applied on a glass substrate to determine the conditions for forming a light-emitting layer coating film having a desired thickness. Then, on an insolubilized film, the composition for light-emitting layer is applied under the determined conditions to prepare an element. The emission spectrum of the obtained organic electroluminescent element is obtained. This operation is carried out by changing the film thickness, and the change in the emission spectrum is observed, whereby formation of a mixed layer can be confirmed.

The EL (electroluminescence) spectrum of the organic electroluminescent element can be obtained by dispersing the spectrum. Specifically, a prescribed electric current is applied to the prepared element, and the obtainable EL spectrum is measured by an instantaneous multi-photometry system (MCPD-2000 (manufactured by Otsuka Electrics Co., Ltd.).

Here, the measuring machine to be used is not limited to the above measuring machine, so long as an equivalent measurement can be carried out, and other measuring instruments may be employed.

Further, confirmation of the mixed layer can be carried out by TOF-SIMS (time-of-flight secondary ion mass spectrometry).

(Method by Depth Profiling)

By analyzing the constituting components of molecules/atoms in the depth direction by means of TOF-SIMS, determination of the mixed layer can be carried out.

In the TOF-SIMS method, the measurement is carried out by using TOF-SIMS IV (manufactured by ION-TOF).

The measuring method is such that a sample to be measured is subjected to etching by sputtering ions and after the etching, irradiated with primary ions, whereby TOF-SIMS spectrum of secondary ions discharged from the sample is measured by a positive ion mode in the case of positive ions or in a negative ion mode in the case of negative ions. As primary ions, bivalent positive ions of a bismuth trimer cluster are used, as sputtering ions, positive ions of argon are used. Further, the etching area is 300 $\mu m^2$, and the sputtering analysis area is 150 $\mu m^2$. The etching and TOF-SIMS measurements are repeated to evaluate the distribution of various ions in the depth direction from the surface of the sample.

For example, with respect to the spectrum intensity of ions contained only in the light-emitting material, the light-emitting material is regarded as infiltrated to a portion where the spectrum intensity observed in the light-emitting layer becomes a level of about $\frac{1}{20}$.

(Method by Combination with Precision Oblique Cutting Technique)

By combining a precision oblique cutting technique using e.g. SAICAS (precision oblique cutting apparatus) with TOF-SIMS, it is possible to confirm the distribution in the depth direction with a higher resolution.

Specifically, by the precision oblique cutting, a cut surface will be formed such that the distance in the depth direction is seemingly enlarged at least 500 times. The obtained cut film surface is analyzed by TOF-SIMS, and with respect to the detected molecular ions, ion intensity mapping is carried out. From the light-emitting layer, molecular ions of the light-emitting material are detected, and from the mixed region, molecular ions of the light-emitting material and the charge-transporting material are detected, and the ratio of the detected intensities is generally proportional to the presence of the respective materials, and accordingly, it is possible to distinguish the light-emitting layer and the mixed region.

For the determination of the mixed layer, the above-described three methods may be mentioned, and any one of them may be used.

Further, the measuring instruments to be used for the determination in the present invention are not particularly limited to the above-described measuring instruments so long as the equivalent measurement can be carried out, and other measuring equipments may be employed. However, it is preferred to employ the above measuring equipments.

(Organic Electroluminescent Element B)

The organic electroluminescent element B of the present invention comprises an anode, a cathode and an organic layer disposed between the anode and the cathode, wherein the organic layer comprises a mixed layer containing at least a polymer, and a light-emitting low molecular compound and/or a charge-transporting low molecular compound, and, adjacent to the mixed layer, a layer containing a light-emitting low molecular compound and a charge-transporting low molecular compound and not containing a polymer, and after dipped at from 20 to 25° C. for 60 seconds in each of water, ethyl benzoate and a hydrocarbon solvent, the layer containing the polymer has a remaining film thickness of at least 95% as compared to the film thickness before the dipping. The dipping temperature may be within a range of from 20 to 25° C., and dipping is carried out, for example, at 25° C.

The hydrocarbon solvent may be toluene, xylene or cyclohexylbenzene, and it is preferred that against each of them, at least 95% of the film thickness remains after dipping as compared to before dipping.

[Maximum Emission Wavelength of Emission Spectrum]

The organic electroluminescent element of the present invention is characterized in that the maximum emission wavelength $\lambda_{EL}$ in the emission spectrum of the organic electroluminescent element and the maximum emission wavelength $\lambda_{PL}$ in the emission spectrum of the above light-emitting low molecular compound by photoexcitation, satisfy the following formula (1).

$$\lambda_{PL}-5 \text{ nm} < \lambda_{EL} < \lambda_{PL}+5 \text{ nm} \tag{1}$$

The method for measurement of the maximum emission wavelength of the light-emitting low molecular compound by photoexcitation will be shown below.

(Preparation of Test Sample)

A test sample is prepared by forming a film on a glass substrate by a wet film-forming method using a composition for test sample which will be described below in detail. The film thickness of the test sample is optional within a range not to make the measurement substantially difficult, but it is usually about 50 nm.

(Composition for Test Sample)

The composition for test sample contains a light-emitting low molecular compound and a charge-transporting low molecular compound to be contained in the light-emitting layer of the organic electroluminescent element and further contains a solvent. The ratio of the light-emitting low molecular compound to the charge-transporting low molecular compound contained in the composition for test sample is the same as in the composition for light-emitting layer.

The solvent is not particularly limited, but it is preferred to employ the same solvent as in the composition for light-emitting layer.

Other components which may be contained, may be ones contained in the composition for light-emitting layer.

Further, the film forming method at the time of preparing the test sample may be the same or different from the method for forming the light-emitting layer for the organic electroluminescent element, but it is preferred to employ the same method. In a case where a different film-forming method is employed, there is no particular restriction to such a method, and any method disclosed in the above section of [Method for forming cross-linked film] (Film-forming method) may be used for film formation. For example, a spin coating method or an inkjet method may be used.

(Measuring Method)

The emission spectrum is measured, for example, by a spectrophotometer F-4500 (manufactured by Hitachi, Ltd.).

Firstly, a wavelength at which the absorbance of the test sample shows the maximum (hereinafter referred to as an "excitation light wavelength") is selected in a wavelength range of from 300 to 800 nm.

Further, the emission from the test sample excited by a selected excitation light wavelength is measured within a wavelength range of from the excitation light wavelength to 800 nm at a scanning speed of 1,200 nm/min with an excitation side slit of 5.0 nm and a fluorescent side slit of 5.0 nm at a photomul voltage of 400 V, to obtain the emission spectrum of the test sample. Thus, the maximum emission wavelength in the emission spectrum of the test sample by photoexcitation is obtained.

Here, so long as the equivalent measurement is possible, the measuring instruments are not limited to the above-mentioned measuring instruments, and other measuring instruments may be used. However, it is preferred to employ the above-mentioned measuring instruments.

The reason as to why the current efficiency is improved by satisfying the formula (1) is considered to be as follows.

In an organic electroluminescent element not satisfying the formula (1), re-combination of an electron and a hole takes place in the mixed layer in the present invention. That is, in the organic electroluminescent element, the emission from the excited state of compounds formed by application of a voltage includes not only the emission from the light-emitting low molecular compound, but also the emission from the insolubilized polymer, or is composed solely of the emission from the insolubilized polymer.

That is, it is considered that the energy which should be given to the light-emitting low molecular compound by application of the voltage, is given to the insolubilized polymer, thus leading to deterioration of the current efficiency of the element.

Further, depending upon the construction of the element, the following may likewise be considered.

After forming an insolubilized film, on such a film, film-forming is carried out by a wet film-forming method using the above composition for light-emitting layer to form a mixed layer and a light-emitting layer, whereby the light-emitting low molecular compound or the charge-transporting low molecular compound is swelled and infiltrated into the insolubilized film to form a mixed layer. By such a method for forming a mixed layer and a light-emitting layer, there may be a case where the light-emitting layer cannot be formed in a sufficient thickness, and only the mixed layer is formed. In such a case, if the element has a layer formed by using a compound having an electron-transporting property on the light-emitting layer, the insolubilized polymer and the electron-transporting compound are likely to approach to each other to form a charge-transfer complex. Thus, the emission of the organic electroluminescent element under application of a voltage tends to be an emission derived from the charge-transfer complex, thus leading to deterioration of the current efficiency like the above-described case.

Now, the case of preparing an element which satisfies the formula (1) by a method wherein after forming the insolubilized film, on such a film, a mixed layer and a light-emitting layer are formed by wet film-forming using the above composition for light-emitting layer, will be described in detail.

Here, the concentrations of the light-emitting low molecular compound and the charge-transporting low molecular compound in the composition for light-emitting layer are preferably ones disclosed in the above section of [Composition for light-emitting layer].

That is, by controlling the above two points, it is possible to suitably form a light-emitting layer having a film thickness as disclosed in the above section of [Light-emitting layer] (Method for forming light-emitting layer), as the film thickness of the light-emitting layer of the obtained element, thereby to obtain an element which satisfies the formula (1).

Further, in a case where as a method for forming a mixed layer, the above light-emitting low molecular compound and charge-transporting low molecular compound are incorporated to the above composition for cross-linked film, and a film is formed in the same manner as the above cross-linked film thereby to incorporate the light-emitting low molecular compound and charge-transporting low molecular compound in the cross-linked film to form a mixed layer, a light-emitting layer is formed with a film thickness as disclosed in the above section of [Light-emitting layer] (Method for forming light-emitting layer) as the film thickness of the light-emitting layer of the obtained element, thereby to obtain an element which satisfies the formula (1).

<Process for Producing Organic Electroluminescent Element>

The organic electroluminescent element of the present invention is preferably prepared by a process (hereinafter referred to as "process of the present invention") for producing an organic electroluminescent element comprising an anode, a cathode and an organic layer disposed between the anode and the cathode, wherein the organic layer is formed via a step of forming an insolubilized film by applying an active energy to a film containing an insolubilizing polymer, and a step of applying a composition containing a light-emitting low molecular compound and/or a charge-transporting low molecular compound and a solvent, on the insolubilized film, to form a film.

In the process of the present invention, the step of forming an insolubilized film by insolubilizing an insolubilizing polymer may be carried out by a method disclosed in the above section of [Method for forming cross-linked film], [Method for forming dissociated film] or [Method for forming eliminated film], and the step of applying a composition containing a light-emitting low molecular compound and/or a charge-transporting low molecular compound and a solvent, on the insolubilized film, to form a film, may be carried out by a method disclosed in the above section of [Light-emitting layer] (Method for forming light-emitting layer).

Further, in addition to the above steps, the process of the present invention may have one or more other steps. Such other steps may be carried out at an optional timing.

<Organic Electroluminescent Element>

The organic electroluminescent element A of the present invention is an organic electroluminescent element comprising an anode, a cathode and an organic layer disposed between the anode and the cathode, wherein the organic layer comprises a mixed layer containing a light-emitting low molecular compound and/or a charge-transporting low molecular compound in a film containing at least an insolubilized polymer obtained by insolubilizing an insolubilizing polymer, and, adjacent to the mixed layer, a layer containing a light-emitting low molecular compound and a charge-transporting low molecular compound and not containing an insolubilized polymer.

Further, the organic electroluminescent element B of the present invention is an organic electroluminescent element comprising an anode, a cathode and an organic layer disposed between the anode and the cathode, wherein the organic layer comprises a mixed layer containing at least a polymer, and a light-emitting low molecular compound and/or a charge-transporting low molecular compound, and, adjacent to the mixed layer, a layer containing a light-emitting low molecular compound and a charge-transporting low molecular compound and not containing a polymer, and after dipped at from 20 to 25° C. for 60 seconds in each of water, ethyl benzoate and a hydrocarbon solvent, the layer containing the polymer has a remaining film thickness of at least 95% as compared to the film thickness before the dipping.

Now, the organic electroluminescent element of the present invention and the process for producing the organic electroluminescent element will be described in detail with reference to FIG. 1. FIG. 1 is a cross-sectional view schematically illustrating the layered construction of an organic electroluminescent element according to one embodiment of the present invention. The organic electroluminescent element shown in FIG. 1 is constituted by laminating, on a substrate, an anode, a hole injection layer, a hole transport layer, a mixed layer, a light-emitting layer, a hole blocking layer, an electron transport layer, an electron injection layer and a cathode.

In the organic electroluminescent element A of the present invention, in the case of the element shown in FIG. 1, the hole transport layer corresponds to the insolubilized layer.

[Substrate]

The substrate is one constituting a support for an organic electroluminescent element, and a quartz or glass plate, a metal plate or metal foil, or a plastic film or sheet, may, for example, be used. Particularly, a glass plate or a transparent plate of synthetic resin such as polyester, polymethacrylate, polycarbonate or polyether sulfone, is preferred. In a case where a synthetic resin plate is to be used, it is necessary to pay attention to the gas barrier property. If the gas barrier property of a substrate is too small, the organic electroluminescent element is likely to be deteriorated by external air passed through the substrate, such being undesirable. Therefore, it is one of preferred methods to provide a dense silicon oxide film or the like on at least one side of the synthetic resin substrate to secure a gas barrier property.

[Anode]

On the substrate, an anode is provided. The anode plays a role of hole injection into a layer (such as a hole injection layer) on the light-emitting layer side.

Such an anode is usually constituted by a metal such as aluminum, gold, silver, nickel, palladium or platinum, a metal oxide such as indium and/or tin oxide, a halogenated metal such as copper iodide, carbon black, or a conductive polymer such as poly(3-methylthiophene), polypyrrole or polyaniline.

The anode may usually be formed by a sputtering method, a vacuum vapor deposition method or the like. Further, in a case where an anode is formed by using fine particles of metal such as silver, fine particles of copper iodide or the like, fine particles of carbon black or conductive metal oxide, or fine powder of a conductive polymer, such fine particles or powder may be dispersed in a suitable binder resin solution and applied on a substrate to form an anode. Further, in the case of a conductive polymer, it is possible to form an anode by forming a thin film directly on a substrate by electropolymerization or by applying the conductive polymer on a substrate by coating (Appl. Phys. Lett., vol. 60, p. 2711, 1992).

The anode is usually in a single layer structure, but may be made to have a laminated structure comprising a plurality of materials, as the case requires.

The thickness of the anode varies depending upon the required transparency. When transparency is required, the transmittance of visible light is preferably adjusted to be usually at least 60%, preferably at least 80%. In such a case, the thickness of the anode is usually at least 5 nm, preferably at least 10 nm and usually at most 1,000 nm, preferably at most 500 nm. When the anode may be opaque, the thickness of the anode is optional and may be the same as the substrate. Further, on such an anode, a different conductive material may be laminated.

For the purpose of improving the hole injection property by removing impurities deposited on the anode or adjusting the ionization potential, it is preferred that the anode surface is subjected to ultraviolet ray (UV)/ozone treatment, oxygen plasma treatment or argon plasma treatment.

[Hole Injection Layer]

In the present invention, the method for forming the hole injection layer is not particularly limited, but with a view to reducing dark spots, the hole injection layer is preferably formed by wet film-forming. The wet film-forming method is also industrially excellent in that as compared with a conventional vacuum vapor deposition method, a uniform defect-free thin film can be obtained, or the time for the formation is short.

Here, the wet film-forming (method) in the present invention is a method for forming a film by using an ink containing a solvent, such as a spin coating method, a dip coating method, a die-coating method, a bar coating method, a blade coating method, a roll coating method, a spray coating method, a capillary coating method, a nozzle printing method, an inkjet method, a screen printing method, a gravure printing method, a flexo printing method or an offset printing. From the viewpoint of the patterning efficiency, a die coating method, a roll coating method, a spray coating method, an inkjet method or a flexo printing method is preferred.

In a case where the hole injection layer is formed by wet film-forming, materials for the hole injection layer are usually mixed with a suitable solvent (solvent for hole injection layer) to prepare a composition for film forming (composition for hole injection layer), and this composition for hole injection layer is applied on a layer (usually an anode) corresponding to a lower layer of the hole injection layer, by a suitable method, to form a film, followed by drying to form a hole injection layer.

(Hole Transporting Material)

The composition for hole injection layer usually contains at least a hole-transporting material and a solvent as materials for the hole injection layer. The hole-transporting material may be a low molecular compound or a high molecular compound so long as it is a compound having a hole-transporting property which is commonly used for a hole injection layer of an organic electroluminescent element.

The low molecular compound is not particularly limited so long as it is a compound having a hole transporting property defined by a single molecular weight, and a known material may be used. It may, for example, be an aromatic diamine containing at least two tertiary amines and having at least two condensed aromatic rings substituted on a nitrogen atom, as represented by 4,4'-bis[N-(1-naphthyl)-N-phenylamino]biphenyl (JP-A-5-234681), an aromatic amine compound having a star burst structure such as 4,4',4"-tris (1-naphthylphenylamino)triphenylamine (Journal of Luminescence, 1997, vol. 72-74, pp. 985), an aromatic amine compound made of a tetramer of triphenylamine (Chemical Communications, 1996, pp. 2175) or a Spiro compound such as 2,2',7,7'-tetrakis(diphenylamino)-9,9'-spirobifluorene (Synthetic Metals, 1997, Vol. 91, pp. 209).

Further, the hole-transporting material is preferably a compound having an ionization potential of from 4.5 eV to 6.0 eV from the viewpoint of a barrier against charge injection from the anode to the hole injection layer. Examples of the hole-transporting material may, for example, be an aromatic amine compound, a phthalocyanine derivative, a porphyrin derivative, an oligothiophene derivative, a polythiophene derivative, a benzylphenyl compound, a compound having tertiary amines linked by a fluorene group, a hydrazone compound, a silazane compound, a silanamine derivative, a phosphamine derivative, a quinacridone compound, a phthalocyanine derivative, etc.

The polymer compound is preferably an aromatic amine compound from the viewpoint of non crystallinity and the transmittance of visible light. Particularly preferred is an aromatic tertiary amine compound. Here, the aromatic tertiary amine compound is a compound having an aromatic tertiary amine structure and includes a compound having a group derived from an aromatic tertiary amine. The type of the aromatic tertiary amine compound is not particularly limited, but a polymer compound (a polymer having repeating units) having a weight average molecular weight of at least 1,000 and at most 1,000,000, is further preferred from the viewpoint of uniform emission due to surface planarization effect. As a preferred example of the aromatic tertiary amine polymer compound, a polymer compound having repeating units represented by the following formula (1) may be mentioned.

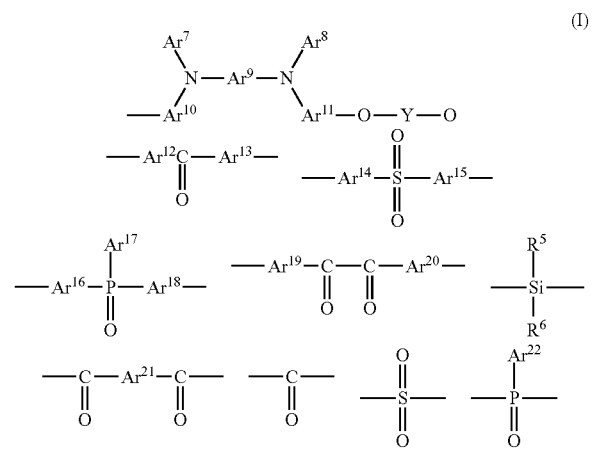

In the above formulae, each of $Ar^{12}$ to $Ar^{22}$ which are independent of one another, is an aromatic hydrocarbon group which may have a substituent, or an aromatic heterocyclic group which may have a substituent, and each of $R^5$ and $R^6$ which are independent of each other, is a hydrogen atom or an optional substituent.

In the formula (1), each of $Ar^7$ to $Ar^{11}$ which are independent of one another, is an aromatic hydrocarbon group which may have a substituent, or an aromatic heterocyclic group which may have a substituent. They may be the same or different from one another. The aromatic hydrocarbon group and/or the aromatic heterocyclic group for $Ar^7$ to $Ar^{22}$ may further have substituents. The molecular weight of the substituents is usually at most 400, preferably at most about 250. Each of $Ar^7$ and $Ar^8$ which are independent of each other, is preferably a group derived from a benzene ring, a naphthalene ring, a phenanthrene ring, a thiophene ring or a pyridine ring, from the viewpoint of the solubility, heat resistance and hole injection/transport properties of the aromatic tertiary amine polymer compound. A phenyl group (a group derived from a benzene ring) or a naphthyl group (a group derived from a naphthalene ring) is preferred.

Whereas, each of $Ar^9$ to $Ar^{11}$ which are independent of one another, is preferably a group derived from a benzene ring, a naphthalene ring, a triphenylene ring or a phenanthrene ring, from the viewpoint of the heat resistance, and the hole injection/transport properties including the oxidation reduction potential. A phenyl group (a group derived from a benzene ring), biphenylene group (a group derived from a benzene ring) or a naphthylene group (a group derived from a naphthalene ring) is preferred.

Specific examples of the aromatic tertiary amine polymer compound having repeating units represented by the formula (1) may, for example, be those disclosed in WO2005/089024.

Further, the hole-transporting compound may be a cross-linking polymer disclosed in the following section of [Hole-transport layer]. The same applies to the method for forming a film by using such a cross-linking polymer.

The hole-transporting material to be used as the material for the hole injection layer may contain one of these compounds alone or two or more of them. When two or more hole-transporting materials are contained, the combination is optional, but it is preferred to use one or more aromatic tertiary amine polymer compounds and one or more other hole-transporting materials in combination.

(Electron-Accepting Compound)

The composition for hole injection layer preferably contains an electron-accepting compound. The electron-accepting compound is preferably a compound having an oxidizing power and having an ability to accept an electron from the above-described hole-transporting material, and specifically, it is preferably a compound having an electron affinity of at least 4 eV, more preferably a compound having an electron affinity of at least 5 eV. The electron-accepting compound may, for example, be one or more compounds selected from the group consisting of a triaryl boron compound, a halogenated metal, a Lewis acid, an organic acid, an onium salt, a salt of an arylamine with a halogenated metal, and a salt of an arylamine with a Lewis acid. Further specifically, an onium salt substituted with an organic group, such as 4-isopropyl-4'-methyldiphenyl iodonium tetrakis(pentafluorophenyl) borate or triphenylsulfonium tetrafluoroborate (WO2005/089024); a high-valent inorganic compound such as iron(III) chloride (JP-A-11-251067) or ammonium peroxodisulfate; a cyano compound such as a tetracyanoethylene; an aromatic boron compound such as tris(pentafluorophenyl)borane (JP-A-2003-31365); a fullerene derivative; or iodine, may, for example, be mentioned. Such an electron-accepting compound is capable of improving the electrical conductivity of the hole injection layer by oxidizing the hole-transporting material. The content of the electron-accepting compound in the hole-transporting material is usually at least 0.1 mol %, preferably at least 1 mol %. However, it is usually at most 100 mol %, preferably at most 40 mol %.

(Solvent)

Among solvents to be used for the wet film-forming method, at least one type is preferably a compound capable of dissolving the materials of the hole injection layer. The boiling point of the solvent is usually at least 110° C., preferably at least 140° C., particularly preferably at least 200° C. and usually at most 400° C., particularly preferably at most 300° C. If the boiling point of the organic solvent is too low, the drying speed is fast, and the film quality is likely to deteriorate. On the other hand, if the boiling point of the organic solvent is too high, it is necessary to make the temperature of the drying step high, whereby other layers or glass substrate may be adversely affected. The solvent may, for example, be an ether solvent, an ester solvent, an aromatic hydrocarbon solvent or an amide solvent. Specifically, the etheric solvent may, for example, be an aliphatic ether such as ethylene glycol dimethyl ether, ethylene glycol diethyl ether or propylene glycol-1-monomethyl ether acetate (PGMEA); or an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole or 2,4-dimethylanisole.

The ester solvent may, for example, be an aromatic ester such as phenyl acetate, phenyl propionate, methyl benzoate, ethyl benzoate, propyl benzoate or n-butyl benzoate.

The aromatic hydrocarbon solvent may, for example, be toluene, xylene, cyclohexylbenzene, 3-isopropylbiphenyl, 1,2,3,4-tetramethylbenzene, 1,4-diisopropylbenzene, cyclohexylbenzene or methylnaphthalene.

The amide solvent may, for example, be N,N-dimethylformamide or N,N-dimethylacetamide.

As another solvent, dimethylsulfoxide may also be used.

These solvents may be used alone, or two or more of them may be used in an optional combination and ratio.

Among the above-mentioned solvents, a solvent having an ability (dissolving ability) to dissolve the material of the hole injection layer or having a high affinity with the material is preferred. It is thereby possible to optionally set the concentration of the composition for the hole injection layer to prepare the composition with a concentration excellent in the efficiency in the film-forming step.

(Concentration)

The concentration of the hole-transporting material in the composition for hole injection layer is optional so long as the effects of the present invention are not substantially impaired, but from the viewpoint of the uniformity of the film thickness, it is usually at least 0.01 wt %, preferably at least 0.1 wt %, more preferably at least 0.5 wt %, and usually at most 70 wt %, preferably at most 60 wt %, more preferably at most 50 wt %. If the concentration is too high, non-uniformity in the film thickness is likely to result, and if it is too low, the formed organic layer may have defects.

(Other Components which May be Contained)

As materials for the hole injection layer, in addition to the hole-transporting material and the electron-accepting compound, other components may be further incorporated so long as the effects of the present invention are not substantially impaired. Examples of such other components may, for example, be various light-emitting materials, electron-transporting compounds, binder resins or coating property-improving agents. Here, such other components may be used alone, or two or more of them may be used in an optional combination and ratio.

After preparing the composition for hole injection layer, such composition is applied on a layer (usually an anode) corresponding to an underlayer of the hole injection layer by wet film-forming to form a film, followed by drying, to form a hole injection layer.

After forming a film, it is dried usually by heating. The heating means to be used in the heating step is not particularly limited so long as the effects of the present invention are not substantially impaired. Examples of the heating means may, for example, be a clean oven, a hotplate, infrared rays, a halogen heater, microwave irradiation, etc. Among them, in order to present a heat uniformly over the entire film, a clean oven and a hotplate are preferred.

In the case of layer forming by vacuum vapor deposition, one or more materials (the hole-transporting material, the electron-accepting material, etc.) are put in crucibles set in a vacuum container (in a case where two or more materials are used, they are put in the respective crucibles), and the interior of the vacuum container is evacuated to a level of about $10^{-4}$ Pa (gauge pressure, the same applies hereinafter) by a suitable vacuum pump. Then, the crucible is heated (in a case where two or more materials are used, their respective crucibles are heated) for evaporation while controlling the amount of evaporation (when two or materials are used, they are evaporated while controlling the amounts of their evaporation independently) to form a hole injection layer on an anode of the substrate disposed to face the crucible(s). Here, when two or more materials are to be used, it is also possible that their mixture may be put into a crucible and heated and evaporated to form a hole injection layer.

The thickness of the hole injection layer is usually at least 5 nm, preferably at least 10 nm and usually at most 1,000 nm, preferably at most 500 nm.

Further, in a case where after forming a cross-linked film, on such a film, a film of the composition for light-emitting layer is formed by a wet film-forming method to form a mixed layer, the hole injection layer may be formed by the compound and method as disclosed in the above-described [Method for forming cross-linked film].

[Hole Transport Layer]

On the hole injection layer, a hole transport layer is formed. The hole transport layer has a function to inject holes injected in the anode and the hole injection layer in this layer into the light-emitting layer and at the same time has a function to suppress deterioration of the emission efficiency to be caused by injection of electrons from the light-emitting layer to the anode side. Further, in a case where after forming a cross-linked film, on such a film, a film of the composition for light-emitting layer is formed by a wet film-forming method to form a mixed layer, the hole transport layer may be formed by the compound and method as disclosed in the above-described [Method for forming cross-linked film].

Here, in a case where a layer between an anode and a light-emitting layer in an organic electroluminescent element is only one, such a layer is referred to as a "hole transport layer", and in a case where two or more such layers are present, the layer in contact with the anode is referred to as a "hole injection layer", and other layers are generally referred to as a "hole transport layer". Further, a layer(s) formed between an anode and a light-emitting layer may generally be referred to as a "hole injection/transport layer".

The film thickness of the hole transport layer is usually at least 0.1 nm, preferably at least 5 nm, and usually at most 300 nm, preferably at most 100 nm.

[Light-Emitting Layer]

In the case of the layer structure shown in FIG. 1, a light-emitting layer is provided on the hole transport layer. The light-emitting layer is a layer which becomes a main emission source as excited by re-combination of holes injected from the anode and electrons injected from the cathode, between the electrodes having an electric field given.

The light-emitting layer may be formed by a wet film-forming method by using the above composition for light-emitting layer, or may be formed by a vacuum vapor deposition method. In a case where the light-emitting layer is to be formed by a vacuum vapor deposition method, the above-mentioned light-emitting low molecular compound and charge-transporting low molecular compound may be used, and the method may be carried out by means of a known technique.

[Hole Blocking Layer]

Between the light-emitting layer and the after-mentioned electron injection layer, a hole blocking layer may be provided. The hole blocking layer is a layer laminated on the light-emitting layer so that it is in contact with the interface on the cathode side of the light-emitting layer.

Such a hole blocking layer has a function to block holes moving from the anode not to reach the cathode and a function to transport electrons injected from the cathode efficiently to the direction of the light-emitting layer.

The physical properties required for the material constituting the hole blocking layer are such that the electron mobility is high, the hole mobility is low, the energy gap (the difference between HOMO and LUMO) is large, and the excited triplet level (T1) is high. The material for the hole blocking layer to satisfy such conditions may, for example, be a mixed ligand compound such as bis(2-methyl-8-quinolinolate)(phenolate)aluminum or bis(2-methyl-8-quinolinolate)(triphenylsilanolate)aluminum, a metal complex such as bis(2-methyl-8-quinolate)aluminum-μ-oxo-bis(2-methyl-8-quinolilate)aluminum binuclear metal complex, a styryl compound such as a distyrylbiphenyl derivative (JP-A-11-242996), a triazole derivative such as 3-(4-biphenylyl)-4-phenyl-5(4-tert-butylphenyl)-1,2,4-triazole (JP-A-7-41759), or a phenanthroline derivative such as bathocuproin (JP-A-10-79297). Further, a compound having at least one pyridine ring having 2-, 4- and 6-positions substituted, as disclosed in WO2005-022962 is also preferred as a material for the hole blocking layer.

Here, the materials for the hole blocking layer may be used alone, or two or more of them may be used in an optional combination and ratio.

The method for forming the hole blocking layer is not limited. Accordingly, it may be formed by a wet film-forming method, a vapor deposition method or another method.

The thickness of the hole blocking layer is optional so long as the effects of the present invention are not substantially impaired, but it is usually at least 0.3 nm, preferably at least 0.5 nm, and usually at most 100 nm, preferably at most 50 nm.

[Electron Transport Layer]

Between the light-emitting layer and the after-mentioned electron injection layer, an electron transport layer may be provided.

The electron transport layer is provided for the purpose of further improving the luminous efficiency of the element, and it is formed from a compound which is capable of transporting electrons injected from the cathode efficiently to the direction of the light-emitting layer, between electrodes having an electric field given.

As the electron-transporting compound to be used for the electron transport layer, a compound is usually employed which has a high efficiency for injection of electrons from the cathode or the electron injection layer and which has a high electron mobility so that it is capable of efficiently transporting the injected electrons. The compound which satisfies such conditions may, for example, be a metal complex such as an aluminum complex of 8-hydroxyquinoline (JP-A-59-194393), a metal complex of 10-hydroxybenzo[h]quinoline, an oxadiazole derivative, a distyrylbiphenyl derivative, a silole derivative, a 3-hydroxyflavone metal complex, a 5-hydroxyflavone metal complex, a benzoxazole metal complex, a benzothiazole metal complex, trisbenzimidazolyl benzene (U.S. Pat. No. 5,645,948), a quinoxaline compound (JP-A-6-207169), a phenanthroline derivative (JP-A-5-331459), 2-t-butyl-9,10-N,N'-dicyanoanthraquinonediimine, a n-type hydrogenated amorphous silicon carbide, n-type zinc sulfide, or a n-type zinc cerenate.

Such materials for the electron transport layer may be used alone, or two or more of them may be used in an optional combination and ratio.

The method for forming the electron transport layer is not particularly limited. Accordingly, it may be formed by a wet film-forming method, a vapor deposition method or another method.

The thickness of the electron transport layer is optional so long as the effects of the present invention are not substantially impaired, but it is usually at least 1 nm, preferably at least 5 nm, and usually at most 300 nm, preferably at most 100 nm.

[Electron Injection Layer]

The electron injection layer plays a role to efficiently inject electrons injected from the cathode into the light-emitting layer. To carry out the electron injection efficiently, the material to form the electron injection layer is preferably a metal having a low work function. As specific examples, an alkali metal such as sodium or cesium, an alkaline earth metal such as barium or calcium, etc. may be used, and the film thickness is usually at least 0.1 nm and at most 5 nm.

Further, it is preferred to dope an alkali metal such as sodium, potassium, cesium, lithium or rubidium to an organic electron-transporting compound represented by a nitrogen-containing heterocyclic compound such as bathophenanthroline or a metal complex such as an aluminum complex of 8-hydroxyquinoline (JP-A-10-270171, JP-A-2002-100478, JP-A-2002-100482, etc.), whereby the electron injection/transport properties can be improved, and an excellent film quality can also be obtained. In such a case, the film thickness is usually at least 5 nm, preferably at least 10 nm, and usually at most 200 nm, preferably at most 100 nm.

Such materials for the electron injection layer may be used alone, or two or more of them may be used in an optional combination and ratio.

The method for forming the electron injection layer is not limited. Accordingly, it may be formed by a wet film-forming method, a vapor deposition method or another method.

[Cathode]

The cathode plays a role to inject electrons to a layer (an electron injection layer or a light-emitting layer) on the light-emitting layer side.

As the material for the cathode, a material to be used for the above anode may be employed, but in order to carry out electron injection efficiently, a metal having a low work function is preferred, and a proper metal such as tin, magnesium, indium, calcium, aluminum or silver, or an alloy thereof, may, for example, be used. As a specific example, an alloy electrode having a low work function such as a magnesium/silver alloy, a magnesium/indium alloy or an aluminum/lithium alloy may be mentioned.

Such materials for the cathode may be used alone, or two or more of them may be used in an optional combination and ratio.

The thickness of the cathode is usually the same as the anode.

Further, for the purpose of protecting the cathode made of a metal having a low work function, it is preferred to further laminate thereon a metal which has a high work function and which is stable against atmospheric air, whereby the stability of the element will be increased. For this purpose, a metal such as aluminum, silver, copper, nickel, chromium, gold or platinum may, for example, be used.

These materials may be used alone, or two or more of them may be used in an optional combination and ratio.

[Other Layers]

The organic electroluminescent element of the present invention may have another construction within a range not to depart from the concept of the present invention. For example, it may have an optional layer in addition to the above-described layers, between the anode and the cathode, or an optional layer may be omitted, so long as its performance is not impaired.

<Electron Blocking Layer>

As such an optional layer, an electron blocking layer may, for example, be mentioned.

The electron blocking layer may be provided between the hole injection layer or the hole transport layer and the light-emitting layer to prevent electrons moving from the light-emitting layer not to reach the hole injection layer, thereby to play a role to increase the re-combination probability of holes and electrons in the light-emitting layer and to play a role to transport holes injected from the hole injection layer efficiently to the direction of the light-emitting layer. Especially when as a light-emitting material, a phosphorescence material is employed or a blue emission material is employed, it is effective to provide an electron blocking layer.

The properties required for the electron blocking layer may, for example, be such that the hole-transporting property is high, the energy gap (difference between HOMO and LUMO) is large, and the excited triplet level (T1) is high. Further, in the present invention, when the light-emitting layer is prepared by a wet film-forming method, the electron blocking layer is also required to be suitable for wet film formation. The material to be used for such an electron blocking layer may, for example, be a copolymer of dioctyl fluorene and triphenylamine represented by F8-TFB (WO2004/084260).

Such materials for the electron blocking layer may be used alone, or two or more of them may be used in an optional combination and ratio.

The method for forming the electron blocking layer is not limited. Accordingly, it may be formed by a wet film-forming method, a vapor deposition method or another method.

Further, it is an effective method to improve the efficiency of the element to insert an extremely thin insulating film (0.1 to 5 nm) formed of e.g. lithium fluoride (LiF), magnesium fluoride ($MgF_2$), lithium oxide ($Li_2O$), or cesium(II) carbonate ($CsCO_3$) at the interface between the cathode and the light-emitting layer or the electron transport layer (Applied Physics Letters, 1997, Vol. 70, pp. 152; JP-A-10-74586; IEEE Transactions on Electron Devices, 1997, Vol. 44, pp. 1245; SID 04 Digest, pp. 154, etc.).

Further, in the above-described layered structure, constituting elements other than the substrate may be laminated in the reverse order. For example, in the layered structure in FIG. 1, other constituting elements may be formed on the substrate in the order of a cathode, an electron injection layer, an electron transport layer, a hole blocking layer, a light-emitting layer, a mixed layer, a hole transport layer, a hole injection layer and an anode.

Further, it is also possible to constitute the organic electroluminescent element of the present invention by laminating constituting elements other than the substrate between two substrates, of which at least one has transparency.

Further, it may take a structure wherein a constituting unit other than the substrate (emission unit) is overlaid one on another in multiple stages (structure wherein a plurality of emission units are laminated). In such a case, it is preferred to provide a carrier generation layer (CGL) made of e.g. vanadium pentaoxide ($V_2O_5$) instead of the interface layer (in a case where the anode is an ITO (indium.tin oxide) transparent conductive film, and the cathode is Al, such two layers) between the respective stages (between emission units), whereby a barrier between the stages is reduced, such being preferred from the viewpoint of the luminous efficiency and the driving voltage.

Further, the organic electroluminescent element of the present invention may be constructed as a single organic electroluminescent element, or may be applied to a construction wherein a plurality of organic electroluminescent elements are disposed in an array or to a construction wherein the anode and the cathode are disposed in an X—Y matrix form.

Further, in the above-described respective layers, a component other than those described as materials may be contained so long as the effects of the present invention are not substantially impaired.

<Organic EL Display Device and Organic EL Illumination>

The organic EL display device and the organic EL illumination of the present invention are ones wherein the organic electroluminescent element of the present invention as described above, is employed. The types or structures of the organic EL display device and the organic EL illumination of the present invention are not particularly limited, and they may be assembled in accordance with a conventional method by using the organic electroluminescent element of the present invention.

For example, the organic EL display device and the organic EL illumination of the present invention may be formed by the method as disclosed in e.g. "Organic EL display device" (published by Ohmsha, Ltd., on Aug. 20, 2004, edited by shizuo tokito, Chihaya Adachi and Hideyuki Murata).

EXAMPLES

Now, the present invention will be described in further detail with reference to Examples, but it should be understood that the present invention is by no means limited to the following Examples.

Preparation of Organic Electroluminescent Element

Example 1

An organic electroluminescent element as shown in FIG. 1 was prepared.

An indium.tin oxide (ITO) transparent conductive film deposited in a thickness of 120 nm on a glass substrate (a sputter-deposited product, manufactured by Sanyo Vacuum Industries Co., Ltd.) was subjected to patterning in stripes with a width of 2 mm by means of a usual photolithography technique and hydrochloric acid etching to form an anode. The patterned ITO substrate was subjected to cleaning in the order of ultrasonic cleaning by an aqueous surfactant solution, water washing by ultrapure water, ultrasonic cleaning by ultrapure water and water washing by ultrapure water, then dried by compressed air and finally subjected to ultraviolet ray ozone cleaning.

Firstly, a composition for hole injection layer comprising a hole-transporting polymer compound (weight average molecular weight: 26,500, number average molecular weight: 12,000) having a repeating structure represented by the following structural formula (P1), 4-isopropyl-4'-methyldiphenyliodonium tetrakis(pentafluorophenyl)borate represented by the structural formula (A1) and ethyl benzoate, was prepared. This composition was spin-coated on the anode under the following conditions to obtain a hole injection layer having a film thickness of 30 nm.

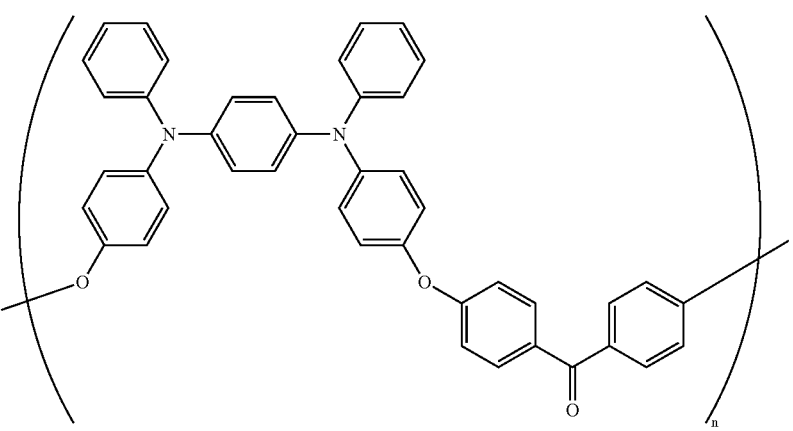

P1

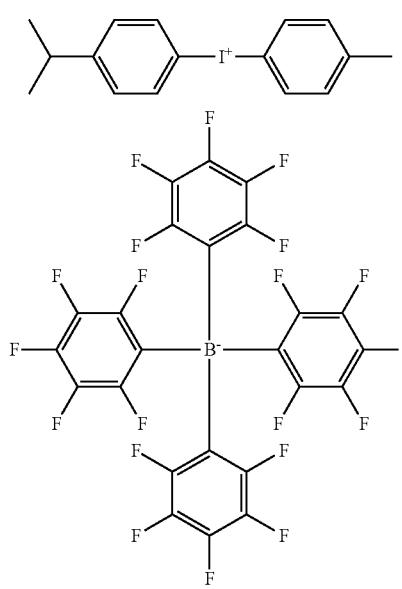

A1

| <Composition for hole injection layer> | |
|---|---|
| Solvent | Ethyl benzoate |
| Concentrations in composition | (P1): 2.0 wt % |
| | (A1): 0.8 wt % |
| <Film-forming conditions for hole injection layer> | |
| Rotational speed of spinner | 1,500 rpm |
| Rotational time of spinner | 30 seconds |
| Spin coating atmosphere | In atmospheric air |
| Heating conditions | In atmospheric air at 230° C. for 3 hours |

Then, a cross-linked film-forming composition containing cross-linking polymer (H1) (weight average molecular weight: 86,000) having the following structural formula, was prepared and applied by a spin coating method under the following conditions. Then, the composition was cross-linked by heating to form a cross-linked film (corresponding to a hole transport layer) having a thickness of 20 nm.

H1

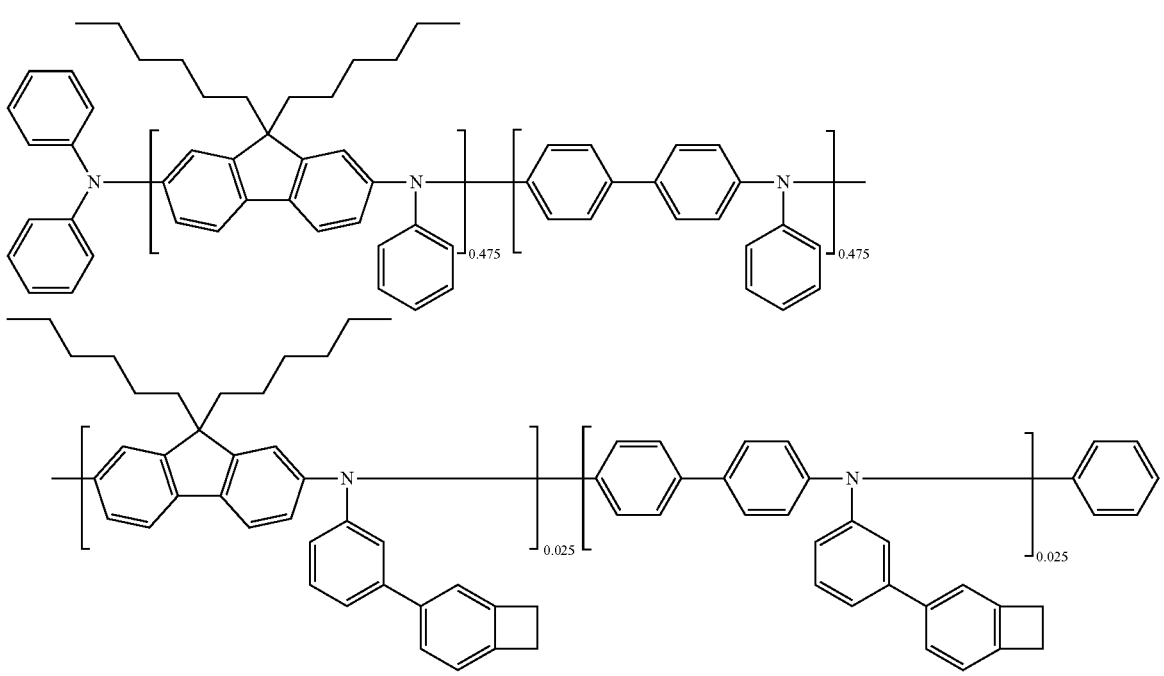

| <Cross-linked film-forming composition> | |
|---|---|
| Solvent | Toluene |
| Solid content concentration | 0.4 wt % |
| <Film-forming conditions> | |
| Rotational speed of spinner | 1,500 rpm |
| Rotational time of spinner | 30 seconds |
| Spin coating atmosphere | In nitrogen |
| Heating conditions | In nitrogen at 230° C. for 3 hours |

Then, in order to form a light-emitting layer and a mixed layer, the following composition for light-emitting layer was prepared by using the following charge-transporting low molecular compound (C1) and light-emitting low molecular compound (D1), and spin-coated on the cross-linked film under the following conditions to form a light-emitting layer and a mixed layer. Here, the thickness of the light-emitting layer was 40 nm as the film thickness when the film was formed on a glass plate.

| <Composition for light-emitting layer> | |
|---|---|
| Solvent | Toluene |
| Concentrations in composition | (C1): 0.75 wt % |
| | (D1): 0.08 wt % |
| <Film-forming conditions for light-emitting layer> | |
| Rotational speed of spinner | 1,500 rpm |
| Rotational time of spinner | 30 seconds |
| Spin coating atmosphere | In nitrogen |
| Heating conditions | Under reduced pressure (0.1 MPa) at 130° C. for 1 hour |

Here, the substrate having up to the light-emitting layer formed, was transferred into a vacuum vapor deposition apparatus connected to a nitrogen globe box, and the apparatus was evacuated until the vacuum degree in the apparatus became at most $2.4 \times 10^4$ Pa, whereupon the following BAlq (C4) was deposited by a vacuum vapor deposition method to obtain a hole blocking layer. By controlling the vapor deposition rate within a range of from 0.7 to 0.8 Å/sec, it was laminated on the light-emitting layer to form a hole blocking layer having a thickness of 10 nm. The vacuum degree during the vapor deposition was from 2.4 to $2.7 \times 10^{-4}$ Pa.

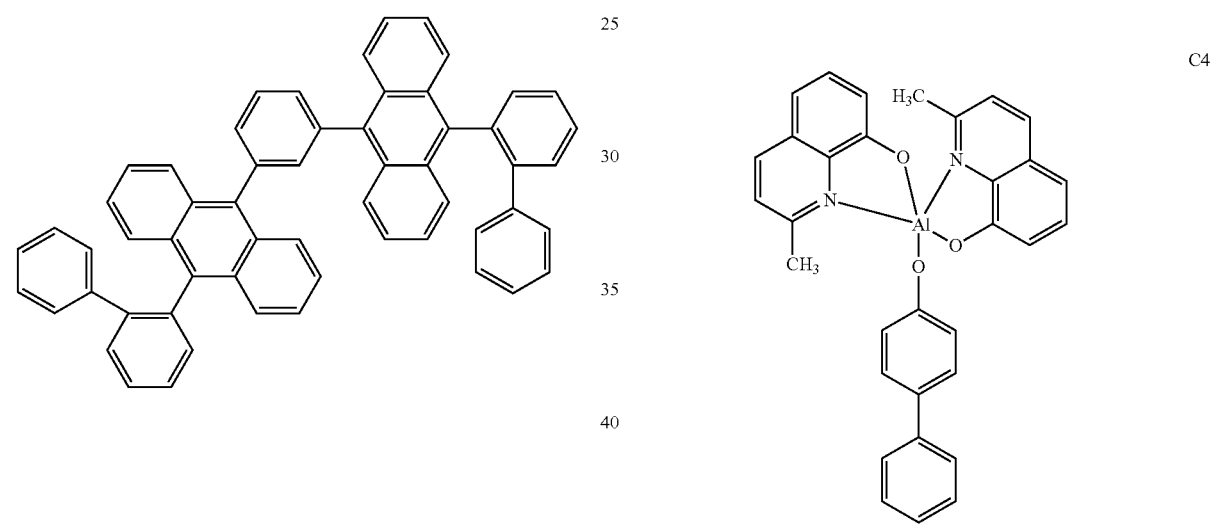

Then, the following Alq₃ (C3) was heated to carry out vapor deposition to form an electron transport layer. The vacuum degree during the vapor deposition was from 0.4 to $1.6 \times 10^{-4}$ Pa, and the vapor deposition rate was controlled within a range of from 1.0 to 1.5 Å/sec, to laminate it on the hole blocking layer to form an electron transport layer having a thickness of 30 nm.

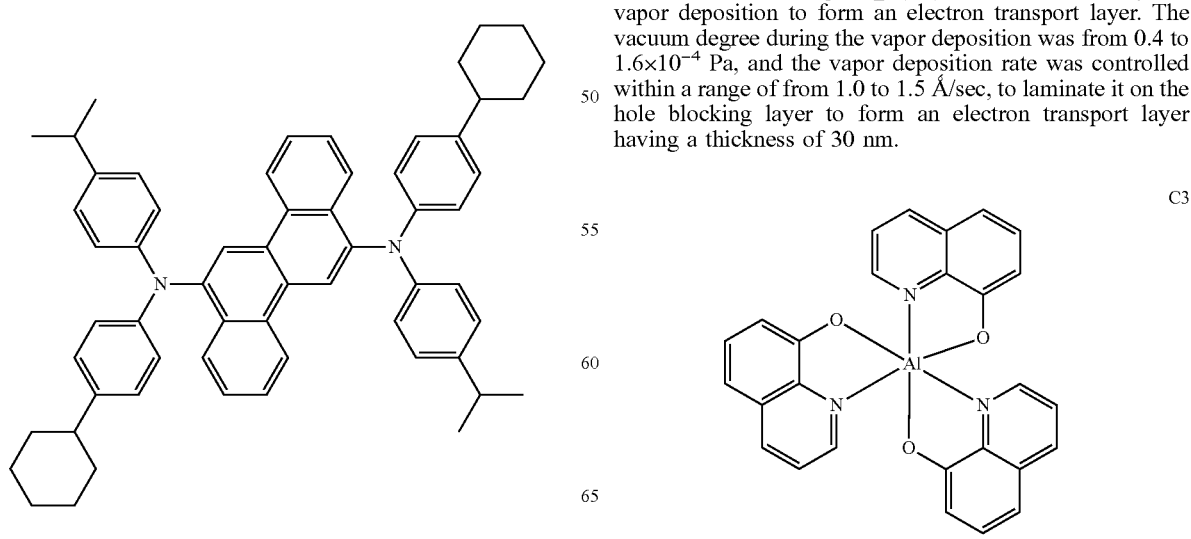

Here, the element having up to the electron transport layer formed, was transported in vacuum to a chamber connected to the chamber wherein the hole blocking layer and the electron transport layer were vapor-deposited, whereupon a shadow mask having stripes with a width of 2 mm, as a mask for cathode vapor deposition, was adhered to the element so that the stripes were perpendicular to the ITO stripes of the anode.

As an electron injection layer, lithium fluoride (LiF) was firstly deposited on the electron transport layer in a thickness of 0.5 nm by using a molybden boat and controlling the vapor deposition rate to be from 0.1 to 0.4 Å/sec and the vacuum degree to be from 3.2 to $6.7 \times 10^{-4}$ Pa. Then, as a cathode, an aluminum layer having a thickness of 80 nm was formed by heating aluminum in a molybden boat in the same manner by controlling the vapor deposition rate to be from 0.7 to 5.3 Å/sec and the vacuum degree to be from 2.8 to $11.1 \times 10^{-4}$ Pa. The substrate temperature during the vapor deposition of the above two layers was maintained at room temperature.

Then, sealing treatment was carried out by the following method to prevent the element from deterioration by e.g. moisture in the atmospheric air during the storage.

In a nitrogen globe box, a photocurable resin (30Y-437 manufactured by Three Bond Co., Ltd.) was applied with a width of about 1 mm along the peripheral portion of a glass plate with a size of 23 mm×23 mm, and at the center portion, a desiccating agent sheet (manufactured by DYNIC CORPORATION) was set. Thereon, the substrate having the cathode formation completed was bonded so that the vapor-deposited surface faced the desiccating agent sheet. Then, only the region coated with the photocurable resin was irradiated with ultraviolet light, and the resin was cured. In such a manner as described above, an organic electroluminescent element having an emission area portion with a size of 2 mm×2 mm, was obtained. The emission characteristics of such an element are shown in Table 1.

From the results in Table 1, it is evident that the organic electroluminescent element of the present invention having a mixed layer has a low driving voltage and a high current efficiency.

Example 2

An organic electroluminescent element was prepared in the same manner as in Example 1 except that in Example 1, a light-emitting layer was formed under such a condition that the film thickness would be 20 nm when the film was formed on a glass plate, a hole blocking layer was formed in a thickness of 5 nm by using the compound (C5) represented by the following structural formula, and an electron transport layer was formed by adjusting the film thickness of $Alq_3$ to 10 nm.

C5

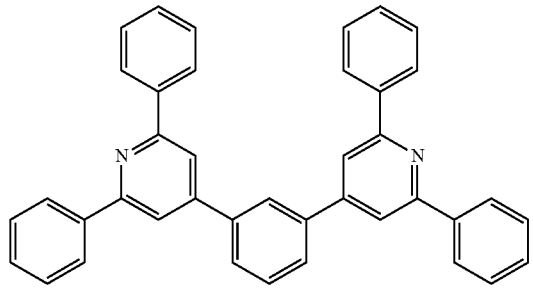

Figure 2:
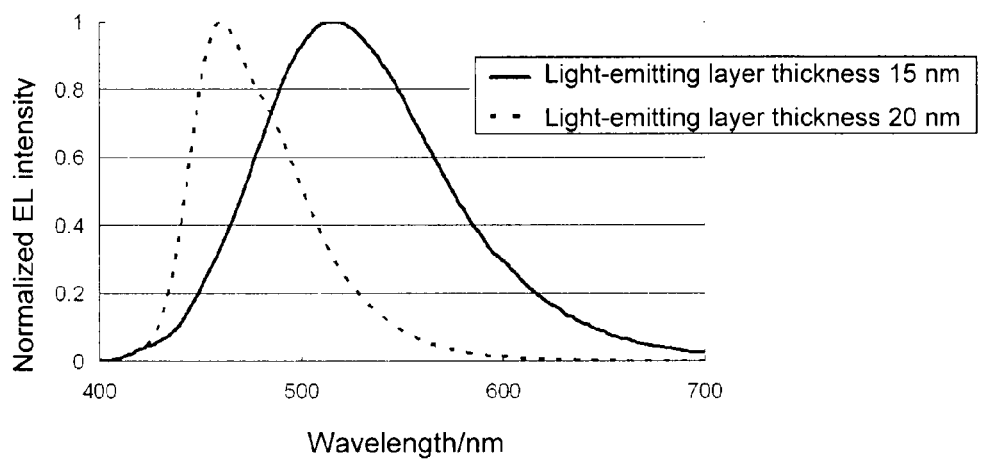
FIG. 2 is a graph showing the emission spectrum (broken line) of the element prepared in Example 2 and the emission spectrum (solid line) of the element prepared in Comparative Example 1. The vertical axis represents the normalized EL intensity, and the horizontal axis represents the wavelength (nm).

The results of measurement of the emission spectrum of this element are shown in FIG. 2. It was an organic electroluminescent element having the maximum wavelength at 460 nm.

Comparative Example 1

An organic electroluminescent element was prepared in the same manner as in Example 2 except that in Example 2, a light-emitting layer was formed under such conditions that the film thickness would be 15 nm when the film was formed on a glass plate.

The results of measurement of the emission spectrum of this element are shown in FIG. 2.

The emission spectrum of this element shows a green emission having a peak at 516 nm, as is different from Example 2 showing a blue emission having a peak at 460 nm.

This indicates that by forming a film of the composition for light-emitting layer on the cross-linked film, the light-emitting low molecular compound and the charge-transporting low molecular compound infiltrate into the cross-linked film to form a mixed layer in such a state that no layer containing the light-emitting low molecular compound and the charge-transporting low molecular compound is present adjacent to the mixed layer, and a cross-linking polymer (H1) after cross-linking and the compound (C5) used to form a hole blocking layer are so close to each other as to form a charge transfer complex. That is, the light-emitting layer having a thickness of 15 nm when formed on the glass plate in Comparative Example 1 forms, if formed on a cross-linked film, a mixed layer with the cross-linked film, and the thickness of the mixed layer is 15 nm.

On the other hand, the element prepared in Example 2 has an emission spectrum at 516 nm and contains a layer containing the light-emitting low molecular compound and the charge-transporting low molecular compound adjacent to the mixed layer. Further, in Example 2, the light-emitting layer is formed under such a condition that the thickness when formed on a glass plate would be 20 nm. That is, the thickness of the mixed layer of this element is at most 20 nm.

As described above, the element in Example 1 wherein the element is prepared by using the same compounds as the cross-linking polymer, the light-emitting low molecular compound and the charge-transporting low molecular compound in Example 2 and Comparative Example 1, has a mixed layer having a thickness of from 15 to 20 nm. Further, it also has a light-emitting layer, since the layer is formed under such a condition that the thickness of the light-emitting layer when formed on a glass plate would be 40 nm.

Example 3

An organic electroluminescent element as shown in FIG. 1 was prepared in the same manner as in Example 1 except that in Example 1, the cross-linked film was formed as follows.

A cross-linked film-forming composition containing a cross-linking polymer (H2) (weight average molecular weight: 61,000) having the following structural formula, was prepared and applied by a spin coating method under the following conditions and cross-linked by heating to form a cross-linked film having a thickness of 20 nm.

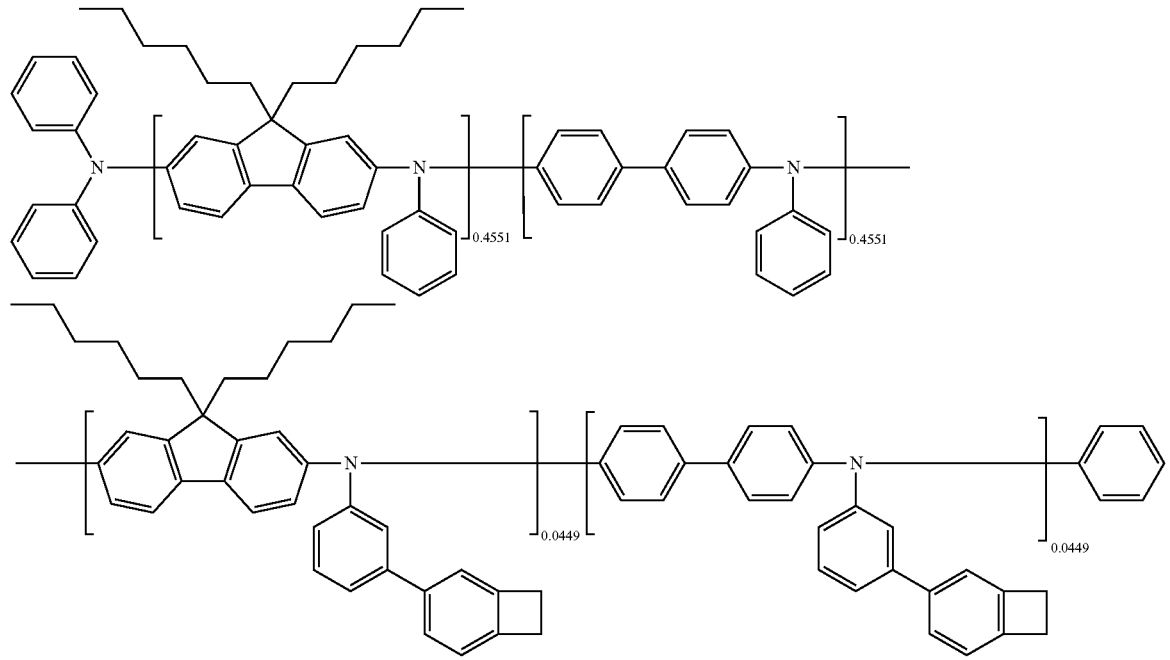

H2

| <Cross-linked film-forming composition> | |
|---|---|
| Solvent | Toluene |
| Concentrations in composition | 0.4 wt % |
| <Film-forming conditions> | |
| Rotational speed of spinner | 1,500 rpm |
| Rotational time of spinner | 30 seconds |
| Spin coating atmosphere | In nitrogen |
| Heating conditions | In nitrogen at 230° C. for 1 hour |

In such a manner as described above, an organic electroluminescent element having an emission area portion with a size of 2 mm×2 mm, was obtained. The emission characteristics of this element are shown in Table 1. From the results in Table 1, it is evident that the organic electroluminescent element of the present invention having a mixed layer has a low driving voltage and a high current efficiency.

Example 4

An organic electroluminescent element was prepared in the same manner as in Example 3 except that in Example 3, the light-emitting layer was formed in a thickness of 15 nm, the hole blocking layer was formed in a thickness of 5 nm by using the compound (C5), and the electron transport layer was formed so that the thickness of Alq₃ (C3) was 10 nm.

Figure 3:
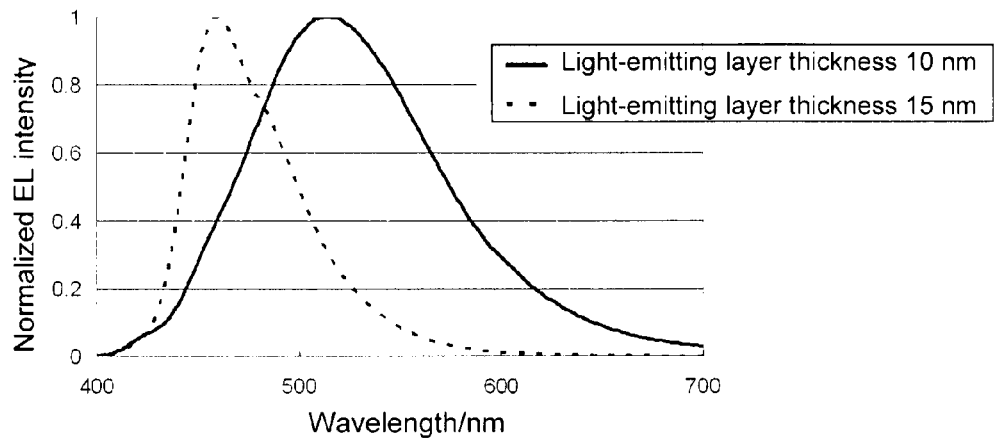
FIG. 3 is a graph showing the emission spectrum (broken line) of the element prepared in Example 4 and the emission spectrum (solid line) of the element prepared in Comparative Example 2. The vertical axis represents the normalized EL intensity, and the horizontal axis represents the wavelength (nm).

The results of measurement of the emission spectrum of this element are shown in FIG. 3.

Comparative Example 2

An organic electroluminescent element was prepared in the same manner as in Example 4 except that in Example 4, the light-emitting layer was formed in a thickness of 10 nm.

The results of measurement of the emission spectrum of this element are shown in FIG. 3.

The emission spectrum of this element shows a green emission having a peak at 516 nm, as is different from Example 2 showing a blue emission having a peak at 460 nm.

This indicates that by forming a film of the composition for light-emitting layer on the cross-linked film, the light-emitting low molecular compound and the charge-transporting low molecular compound infiltrate into the cross-linked film to form a mixed layer in such a state that no layer containing the light-emitting low molecular compound and the charge-transporting low molecular compound is present adjacent to the mixed layer, and a cross-linking polymer (H2) after cross-linking and the compound (C5) used to form a hole blocking layer are so close to each other as to form a charge transfer complex. That is, the light-emitting layer having a thickness of 10 nm when formed on the glass plate in Comparative Example 2 forms, if formed on a cross-linked film, a mixed layer with the cross-linked film, and the thickness of the cross-linked film is 10 nm.

On the other hand, the organic electroluminescent element prepared in Example 4 has an emission spectrum at 516 nm and contains a layer containing the light-emitting low molecular compound and the charge-transporting low molecular compound adjacent to the mixed layer. Further, in Example 4, the light-emitting layer is formed under such a condition that the thickness when formed on a glass plate would be 15 nm. That is, the thickness of the mixed layer of this element is at most 15 nm.

As described above, the element in Example 3 wherein the element is prepared by using the same compounds as the cross-linking polymer, the light-emitting low molecular compound and the charge-transporting low molecular compound in Example 4 and Comparative Example 2, has a mixed layer having a thickness of from 10 to 15 nm. Further, it also has a light-emitting layer, since the layer is formed under such a condition that the thickness of the light-emitting layer when formed on a glass plate would be 40 nm.

Example 5

An organic electroluminescent element as shown in FIG. 1 was prepared in the same manner as in Example 1 except that in Example 1, the cross-linked film was formed as follows.

A cross-linked film-forming composition containing a cross-linking polymer (H3) (weight average molecular weight: 76,000) having the following structural formula, was prepared and applied by a spin coating method under the following conditions and cross-linked by heating to form a cross-linked film having a thickness of 20 nm.

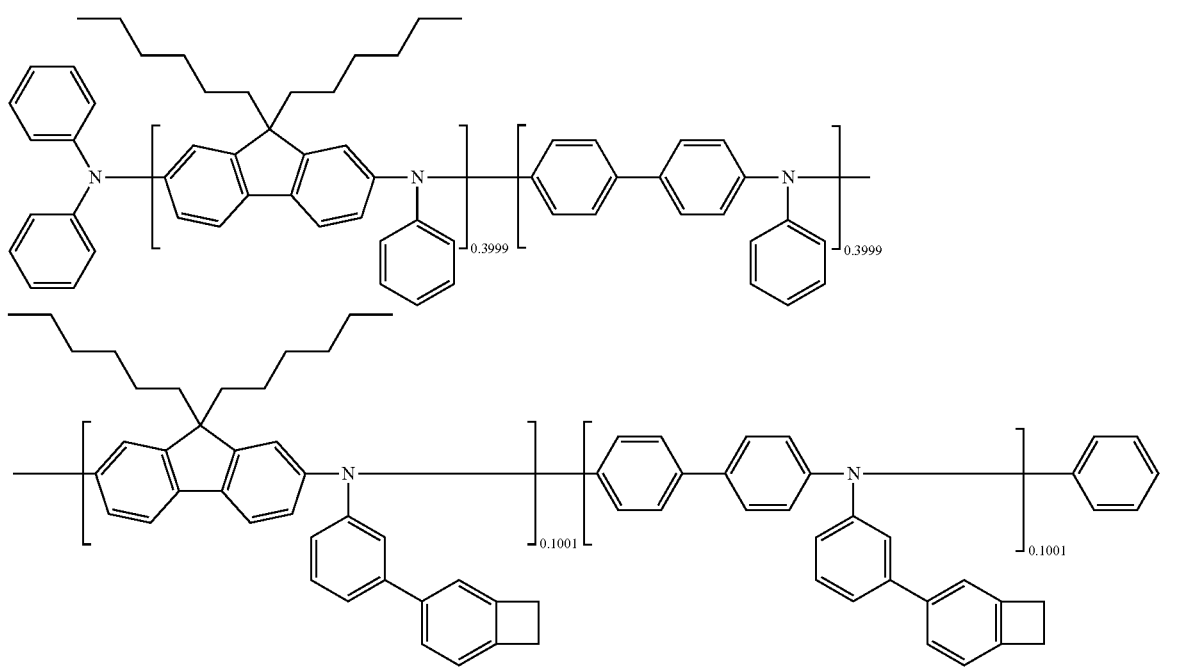

H3

| <Cross-linked film-forming composition> | |
|---|---|
| Solvent | Toluene |
| Concentrations in composition | 0.4 wt % |
| <Film-forming conditions> | |
| Rotational speed of spinner | 1,500 rpm |
| Rotational time of spinner | 30 seconds |
| Spin coating atmosphere | In nitrogen |
| Heating conditions | In nitrogen at 230° C. for 1 hour |

In such a manner as described above, an organic electroluminescent element having an emission area portion with a size of 2 mm×2 mm, was obtained. The emission characteristics of this element are shown in Table 1.

From the results in Table 1, it is evident that the organic electroluminescent element of the present invention having a mixed layer has a low driving voltage and a high current efficiency.

Example 6

An organic electroluminescent element was prepared in the same manner as in Example 5 except that in Example 5, the light-emitting layer was formed in a thickness of 10 nm, a hole blocking layer is formed in a thickness of 5 nm by using the compound (C5), and the electron transport layer was formed by adjusting the film thickness of $Alq_3$ to 10 nm.

Figure 4:
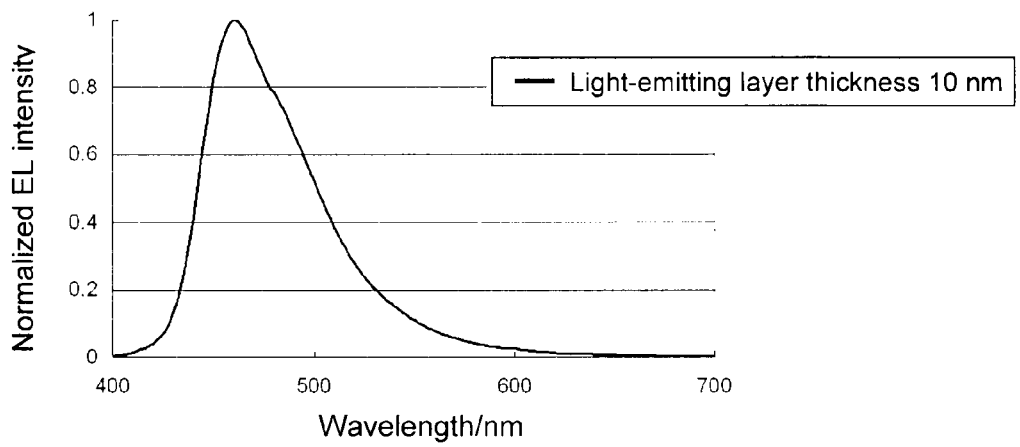
FIG. 4 is a graph showing the emission spectrum of the element prepared in Example 6. The vertical axis represents the normalized EL intensity, and the horizontal axis represents the wavelength (nm).

The results of measurement of the emission spectrum of this element are shown in FIG. 4.

The emission spectrum of this element shows a blue emission having a peak at 460 nm. This indicates that by forming a film of the composition for light-emitting layer on the cross-linked film, the light-emitting low molecular compound and the charge-transporting low molecular compound infiltrate into the cross-linked film to form a mixed layer, and a light-emitting layer is also formed. That is, the thickness of the mixed layer is at most 10 nm.

As described above, the element in Example 5 prepared by using the same compounds as the cross-linking polymer, the light-emitting low molecular compound and the charge-transporting low molecular compound in Example 6, is an element having a mixed layer and a light-emitting layer, since the film is formed under such conditions that the thickness of the light-emitting layer when formed on a glass substrate would be 40 nm. Further, the thickness of the mixed layer is at most 10 nm.

Example 7

An organic electroluminescent element as shown in FIG. 1 was prepared in the same manner as in Example 1 except that in Example 1, the cross-linked film was formed as follows.

A composition for an organic electroluminescent element containing a cross-linking polymer (H4) (weight average molecular weight: 125,000) having the following structural formula, was prepared and formed into a film by a spin coating method under the following conditions and cross-linked by heating to form a cross-linked film having a thickness of 20 nm.

H4

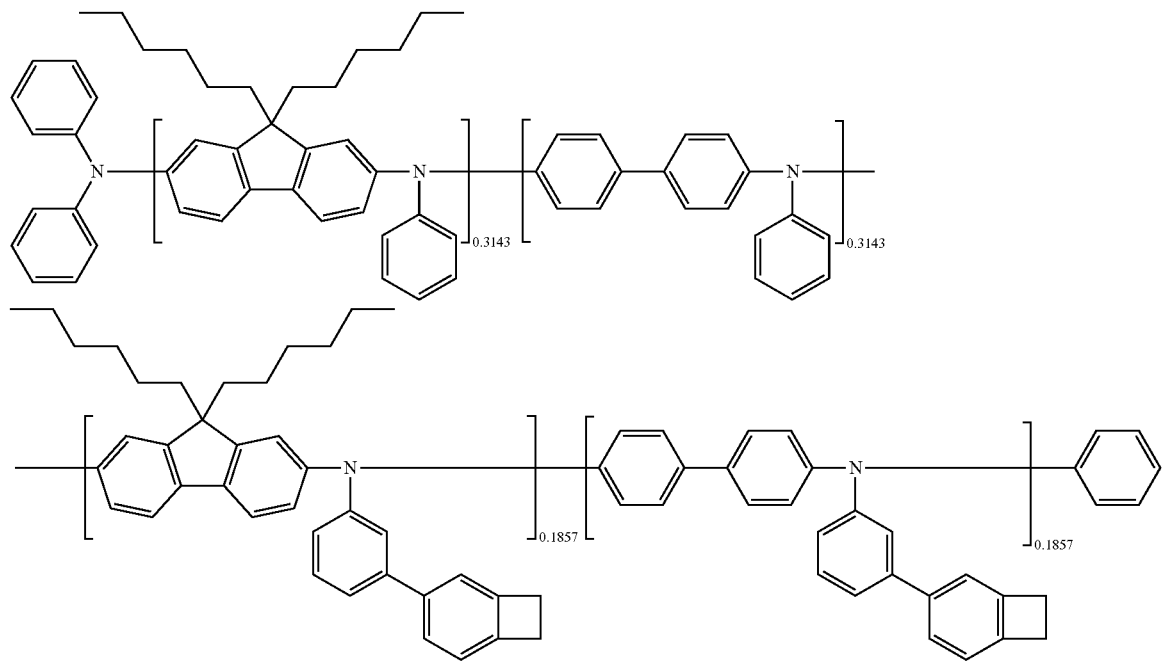

| <Cross-linked film-forming composition> | |
|---|---|
| Solvent | Toluene |
| Concentration in composition | 0.4 wt % |
| <Film-forming conditions> | |
| Rotational speed of spinner | 1,500 rpm |
| Rotational time of spinner | 30 seconds |
| Spin coating atmosphere | In nitrogen |
| Heating conditions | In nitrogen at 230° C. for 1 hour |

In such a manner as described above, an organic electroluminescent element having an emission area portion with a size of 2 mm×2 mm, was obtained. The emission characteristics of this element are shown in Table 1.

From the results in Table 1, it is evident that the organic electroluminescent element of the present invention having a mixed layer has a low driving voltage and a high current efficiency.

Example 8

An organic electroluminescent element was prepared in the same manner as in Example 7 except that in Example 7, the light-emitting layer was formed in a thickness of 10 nm, the hole transport layer was formed in a thickness of 5 nm by using the compound (C5), and the electron transport layer was formed by adjusting the film thickness of Alq$_3$ to 10 nm.

Figure 5:
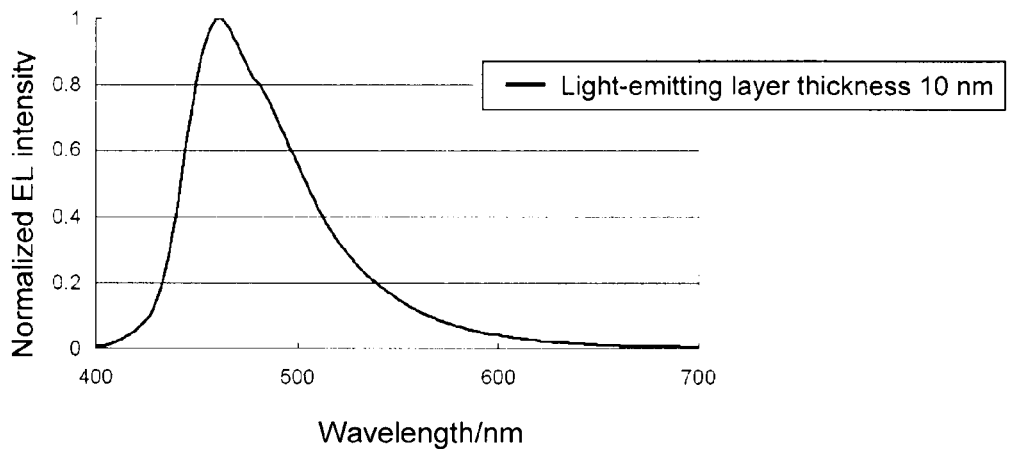
FIG. 5 is a graph showing the emission spectrum of the element prepared in Example 8. The vertical axis represents the normalized EL intensity, and the horizontal axis represents the wavelength (nm).

The results of measurement of the emission spectrum of this element are shown in FIG. 5.

The emission spectrum of this element shows a blue emission having a peak at 460 nm. This indicates that by forming a film of the composition for light-emitting layer on the cross-linked film, the light-emitting low molecular compound and the charge-transporting low molecular compound infiltrate into the cross-linked film to form a mixed layer, but a light-emitting layer is also formed. That is, the thickness of the mixed layer is at most 10 nm.

As described above, the organic electroluminescent element in Example 7 prepared by using the same compounds as the cross-linking polymer, the light-emitting low molecular compound and the charge-transporting low molecular compound in Example 8, is an organic electroluminescent element having a mixed layer and a light-emitting layer, since the film is formed under such conditions that the thickness of the light-emitting layer when formed on a glass substrate would be 40 nm. Further, the thickness of the mixed layer is at most 10 nm.

Comparative Example 3

An organic electroluminescent element as shown in FIG. 1 was prepared in the same manner as in Example 1 except that in Example 1, the light-emitting layer was formed as follows.

The substrate having the film formed up to the hole transport layer was transferred into a vacuum vapor deposition apparatus connected to a nitrogen globe box, and the interior of the apparatus was evacuated until the vacuum degree became at most 2.4×10$^4$ Pa. The above-mentioned charge-transporting low molecular compound (C1) and the above-mentioned light-emitting low molecular compound (D1) were co-vapor deposited by a vacuum vapor deposition method to form a light-emitting layer having a thickness of 40 nm. During the vapor deposition, the deposition rate of (C1) was controlled to be within a range of from 0.7 to 0.8 Å/sec, and the deposition rate of (D1) was controlled to be within a range of from 0.07 to 0.08 Å/sec, and the vacuum degree during the vapor deposition was from 2.4 to 2.7×10$^{-4}$ Pa.

In such a manner as described above, an organic electroluminescent element having an emission area portion with a size of 2 mm×2 mm, was obtained. The emission characteristics of such an element are shown in Table 1.

Further, this element has no mixed layer, since the light-emitting layer is formed by a vacuum vapor deposition method.

TABLE 1

| | | At 100 cd/cm$^2$ | | |
| --- | --- | --- | --- | --- |
| | Thickness of light-emitting layer (nm) | Current efficiency (cd/A) | Voltage (V) | Power efficiency (lm/W) |
| Ex. 1 | 25 | 2.0 | 5.7 | 1.1 |
| Ex. 3 | 30 | 1.5 | 6.2 | 0.7 |
| Ex. 5 | 30 to 40 | 0.9 | 7.5 | 0.4 |
| Ex. 7 | 30 to 40 | 0.7 | 8.1 | 0.3 |
| Comp. Ex. 3 | 0 | 0.8 | 8.2 | 0.3 |

In Table 1, the thickness of a light-emitting layer of an element prepared in each Example was obtained as follows.

Example 1: From Example 2 and Comparative Example 1, a mixed layer of 15 nm is formed, and therefore, the substantial thickness of the light-emitting layer in Example 1 is 25 nm.

Example 3: From Example 4 and Comparative Example 2, a mixed layer of 10 nm is formed, and therefore, the substantial thickness of the light-emitting layer in Example 3 is 30 nm.

Example 5: From Example 6, a mixed layer of at most 10 nm is formed, and therefore, the substantial thickness of the light-emitting layer in Example 5 is from 30 to 40 nm.

Example 7: From Example 8, a mixed layer of at most 10 nm is formed, and therefore, the substantial thickness of the light-emitting layer in Example 7 is from 30 to 40 nm.

From Table 1, it is evident that the organic electroluminescent element of the present invention has a high current efficiency, a low driving voltage and a high power efficiency.

Example 9

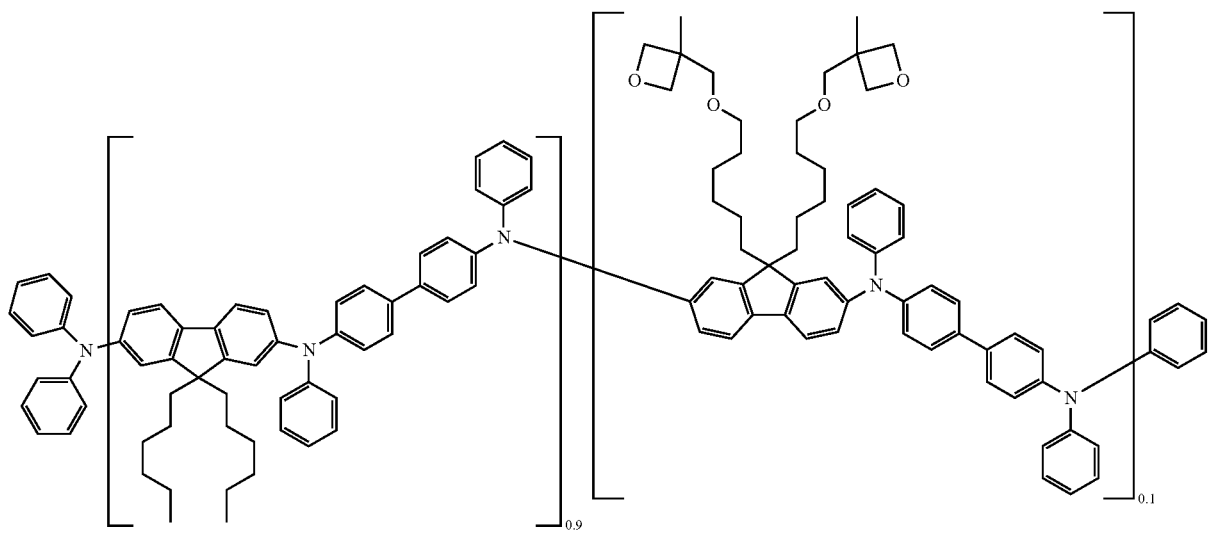

H5

| <Composition for organic electroluminescent element> | |
|---|---|
| Solvent | Toluene |
| Solid content concentration | 0.4 wt % |
| <Film-forming conditions for hole transport layer 4> | |
| Rotational speed of spinner | 1,500 rpm |
| Rotational time of spinner | 30 seconds |
| Spin coating atmosphere | In nitrogen |
| Heating conditions | In nitrogen at 230° C. for 1 hour |

Figure 6:
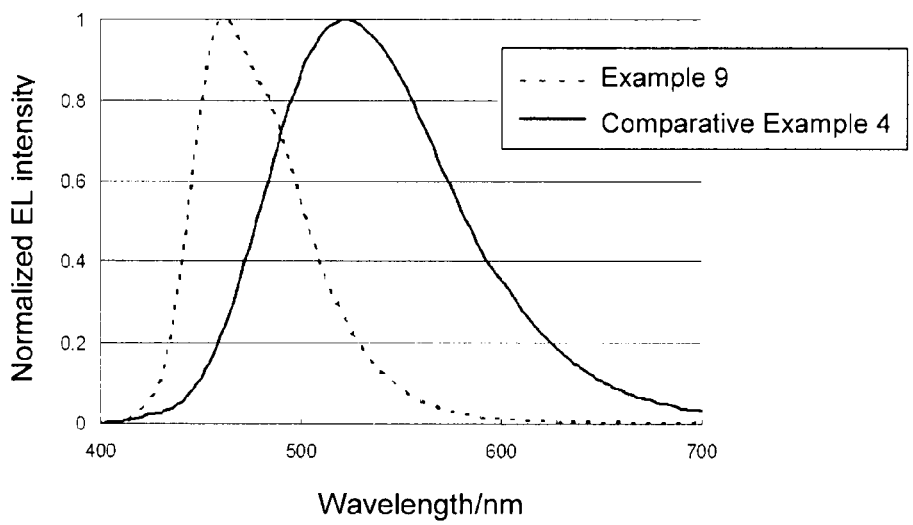
FIG. 6 is a graph showing the emission spectrum (broken line) of the element prepared in Example 9 and the emission spectrum (solid line) of the element prepared in Comparative Example 4. The vertical axis represents the normalized EL intensity, and the horizontal axis represents the wavelength (nm).

The results of measurement of the emission spectrum of this element are shown in FIG. 6. It was an organic electroluminescent element having the maximum emission wavelength at 462 nm.

Comparative Example 4

An organic electroluminescent element was prepared in the same manner as in Example 9 except that in Example 9, the light-emitting layer was formed under such conditions that when it was formed on a glass plate, the thickness would be 8 nm.

The results of measurement of the emission spectrum of this element are shown in FIG. 6.

The emission spectrum of this element shows a green emission having a peak at 520 nm as is different from Example 9 showing a blue emission having a peak at 462 nm.

This indicates that by forming a film of the composition for light-emitting layer on the cross-linked film, the light-emitting low molecular compound and the charge-transporting low molecular compound infiltrate into the cross-linked film to form a mixed layer in such a state that no layer containing the light-emitting low molecular compound and the charge-transporting low molecular compound is present adjacent to the mixed layer, and the cross-linking polymer (H5) after cross-linking and the compound (C5) used to form the hole blocking layer are so close to each other as to form a charge transfer complex. That is, the light-emitting layer having a thickness of 8 nm when formed on the glass plate in Comparative Example 4 forms, if formed on a cross-linked film, a mixed layer with the cross-linked film, and the thickness of the mixed layer is 8 nm.

On the other hand, the element prepared in Example 9 has an emission spectrum at 462 nm and has a layer containing the light-emitting low molecular compound and the charge-transporting low molecular compound adjacent to the mixed layer. Further, in Example 9, the light-emitting layer is formed in such a condition that the thickness when formed on a glass plate would be 18 nm. That is, the thickness of the mixed layer of this element is less than 18 nm.

Example 10

Formation up to the hole injection layer was carried out in the same manner as in Example 1.

[Hole Transport Layer]

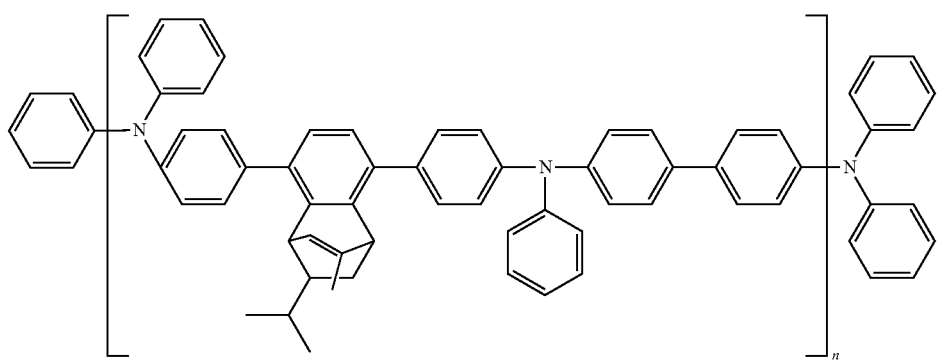

Polymer 1

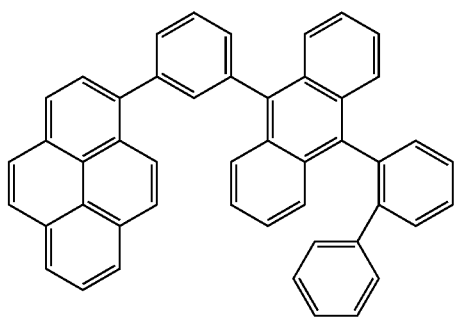

(DDD-1)

[Hole Blocking Layer/Electron Transport Layer]

Then, on the formed light-emitting layer, a hole blocking layer was formed, and further, on the hole blocking layer, an electron transport layer was formed. Using the following HB-1 as the material for a hole blocking layer, the hole blocking layer having a thickness of 10 nm was formed by a vacuum vapor deposition method.

(HB-1)

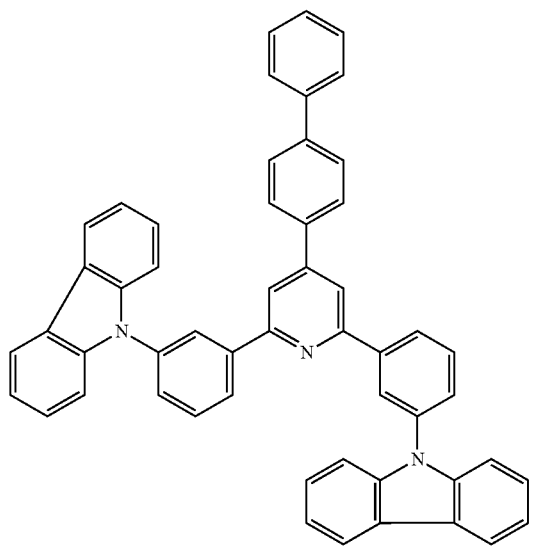

[Electron Injection Layer/Cathode]

Then, on the electron transport layer, an electron injection layer was formed, and on the electron injection layer, a cathode was formed.

For the electron injection layer, using lithium fluoride (LiF), an electron injection layer having a thickness of 0.5 nm was formed by a vacuum vapor deposition method in the same manner as for the electron transport layer.

Further, using aluminum as the material for a cathode, the cathode having a thickness of 80 nm was laminated in stripes with a width of 2 mm in a shape perpendicular to the ITO stripes as the anode.

To an organic electroluminescent element having an emission area portion with a size of 2 mm×2 mm prepared by the foregoing operation, a voltage of 7 V was applied, whereby the presence or absence of an emission as a light-emitting element, and an emission color were evaluated.

As a result, from the organic electroluminescent element prepared by using compound DDD-1, a blue emission was obtained. Further, when emitted at 100 cd/cm$^2$, the driving voltage was 7.0 V.

Reference Example

Confirmation of Formation of Mixed Layer (DDD-2)

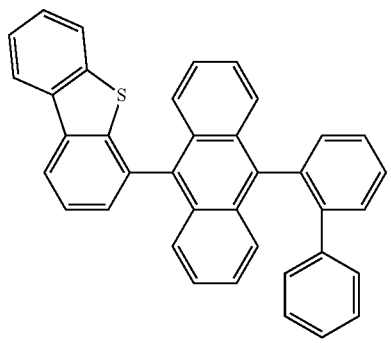

With respect to such a multilayered film, the distribution in the depth direction (thickness direction) was confirmed by means of TOF-SIMS. The results are shown in FIG. 7.

Figure 7:
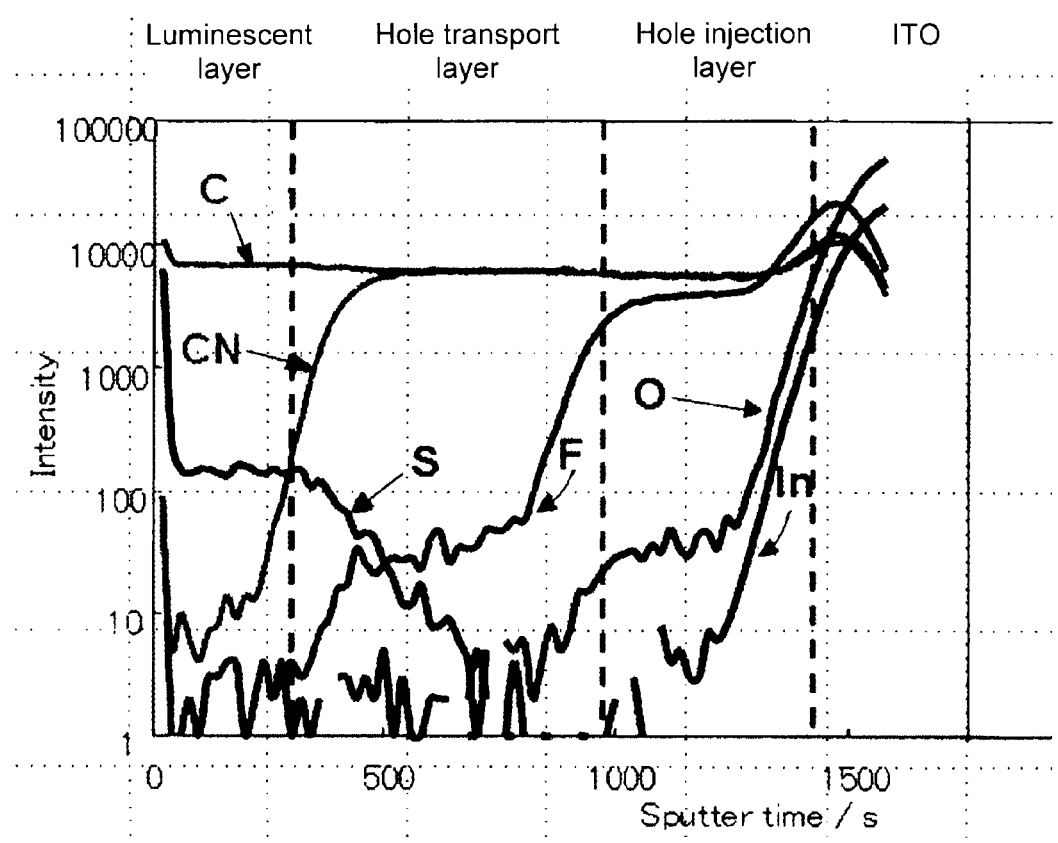
FIG. 7 is a depth profile of the element prepared in [Reference Example] in Example 10. The vertical axis represents the spectrum intensity (arbitrary unit), and the horizontal axis represents the sputtering time (seconds).

As is evident from FIG. 7, from the vicinity of the interface between the light-emitting layer and the hole transport layer formed by a polymer, the signal of S (sulfur) derived from DDD-2 gradually decreased, and the signal was no longer observed at about half (about 10 nm) of the hole transport layer (except for a noise component). That is, it was estimated that between the light-emitting layer and the hole transport layer, a mixed region of about 10 nm was formed.

INDUSTRIAL APPLICABILITY

The organic electroluminescent element of the present invention can be suitably used in the fields of e.g. flat panels and displays (for example, for OA computers or wall-hung television sets), light sources utilizing the surface-emitting characteristics (e.g. light sources for copy machines, backlight power sources for liquid crystal displays or various meters), display panels, sign lamps, etc.

The entire disclosure of Japanese Patent Application No. 2008-208358 filed on Aug. 13, 2008 including specification, claims, drawings and summary is incorporated herein by reference in its entirety.

MEANINGS OF SYMBOLS

1: Substrate
2: Anode
3: Hole injection layer
4: Hole transport layer
5: Mixed layer
6: Light-emitting layer
7: Hole blocking layer
8: Electron transport layer
9: Electron injection layer
10: Cathode

The invention claimed is:

1. An organic electroluminescent element, comprising:
an anode;
a cathode; and
an organic layer disposed between the anode and the cathode;
wherein:
the organic layer comprises a first layer and a second layer adjacent to the first layer;
the first layer comprises in a single, mixed layer: (i) at least one of a light-emitting low molecular weight compound and a charge-transporting low molecular weight compound, and (ii) an insolubilized polymer;
the second layer comprises in a single, mixed layer: (i) a light-emitting low molecular weight compound, and (ii) a charge-transporting low molecular weight compound;
the insolubilized polymer is obtained by insolubilizing an insolubilizing polymer;
the insolubilizing polymer comprises a charge transporting moiety; and
the second layer is free of insolubilized polymers.

2. The organic electroluminescent element according to claim 1, wherein the insolubilizing polymer is selected from the group consisting of cross-linking polymers, dissociating polymers, and eliminating polymers.

3. The organic electroluminescent element according to claim 1, wherein the insolubilizing polymer comprises at least one repeating unit represented by formula (2):

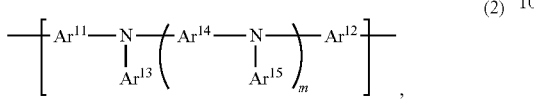
(2)

wherein:
m is an integer of from 0 to 3;
each of $Ar^{11}$ and $Ar^{12}$ is independently a direct bond, an aromatic hydrocarbon group which may have a substituent, or an aromatic heterocyclic group which may have a substituent;
each of $Ar^{13}$ and $Ar^{15}$ is independently an aromatic hydrocarbon group which may have a substituent, or an aromatic heterocyclic group which may have a substituent; and
$Ar^{11}$ and $Ar^{12}$ are not direct bonds at the same time.

4. The organic electroluminescent element according to claim 2, wherein:
the insolubilized polymer is a cross-linking polymer;
the cross-linking polymer has a number of cross-linking groups of from 0.5 to 10 groups per molecular weight of 10,000; and
the molecular weight is calculated from a molar ratio and structural formulae of charged monomers, excluding terminal groups of the cross-linking polymer.

5. An organic EL display device comprising the organic electroluminescent element of claim 1.

6. An organic EL illumination comprising the organic electroluminescent element of claim 1.

7. A process for producing an organic electroluminescent element comprising an anode, a cathode and an organic layer disposed between the anode and the cathode, the process comprising:
forming an insolubilized film by applying an active energy to a film comprising an insolubilizing polymer; and
applying a composition comprising: (i) at least one of a light-emitting low molecular compound and a charge-transporting low molecular weight compound, and (ii) a solvent, on to the insolubilized film to form a film on the insolubilized film to obtain the organic layer;
wherein the insolubilizing polymer comprises a charge transporting moiety.

8. An organic electroluminescent element, comprising:
an anode;
a cathode; and
an organic layer disposed between the anode and the cathode;
wherein:
the organic layer comprises a first layer and a second layer adjacent to the first layer;
the first layer comprises in a single, mixed layer: (i) an insolubilized polymer obtained by insolubilizing an insolubilizing polymer comprising a charge transporting moiety, and (ii) at least one of a light-emitting low molecular weight compound and a charge-transporting low molecular weight compound;

the second layer comprises in a single, mixed layer: (i) a light-emitting low molecular weight compound, and (ii) a charge-transporting low molecular weight compound;
the second layer is free of polymers; and
when the first layer is dipped for 60 seconds in each of water, ethyl benzoate, and a hydrocarbon solvent at a temperature of from 20 to 25° C., the first layer has a remaining film thickness of at least 95% of a film thickness of the first layer before the dipping.

9. The organic electroluminescent element according to claim 2, wherein the insolubilizing polymer comprises at least one repeating unit represented by formula (2):

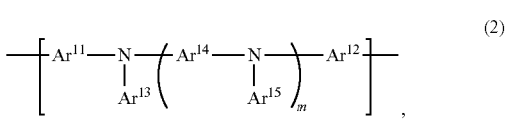
(2)

wherein:
m is an integer of from 0 to 3;
each of $Ar^{11}$ and $Ar^{12}$ is independently a direct bond, an aromatic hydrocarbon group which may have a substituent, or an aromatic heterocyclic group which may have a substituent;
each of $Ar^{13}$ and $Ar^{15}$ is independently an aromatic hydrocarbon group which may have a substituent, or an aromatic heterocyclic group which may have a substituent; and
$Ar^{11}$ and $Ar^{12}$ are not direct bonds at the same time.

10. The organic electroluminescent element according to claim 9, wherein:
the insolubilized polymer is a cross-linking polymer;
the cross-linking polymer has a number of cross-linking groups of from 0.5 to 10 groups per molecular weight of 10,000; and
the molecular weight is calculated from a molar ratio and structural formulae of charged monomers, excluding terminal groups of the cross-linking polymer.

11. An organic EL display device comprising the organic electroluminescent element of claim 2.

12. An organic EL display device comprising the organic electroluminescent element of claim 3.

13. An organic EL display device comprising the organic electroluminescent element of claim 9.

14. An organic EL display device comprising the organic electroluminescent element of claim 4.

15. An organic EL display device comprising the organic electroluminescent element of claim 10.

16. An organic EL illumination comprising the organic electroluminescent element of claim 2.

17. An organic EL illumination comprising the organic electroluminescent element of claim 3.

18. An organic EL illumination comprising the organic electroluminescent element of claim 4.

19. An organic EL illumination comprising the organic electroluminescent element of claim 9.

20. An organic EL illumination comprising the organic electroluminescent element of claim 10.

21. The organic electroluminescent element according to claim 1, wherein the first layer comprises: (i) the charge-transporting low molecular weight compound, and (ii) the insolubilized polymer.

22. The organic electroluminescent element according to claim 7, wherein the composition applied to the insolubilized film comprises: (i) the charge-transporting low molecular weight compound, and (ii) the solvent.

23. The organic electroluminescent element according to claim 8, wherein the first layer comprises: (i) the polymer, and (ii) the charge-transporting low molecular weight compound.

\* \* \* \* \*